US012628583B2

(12) United States Patent
Shimizu

(10) Patent No.: US 12,628,583 B2
(45) Date of Patent: May 12, 2026

(54) METHOD FOR MANUFACTURING SEMICONDUCTOR DEVICE

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 545 days.

(21) Appl. No.: 17/929,419

(22) Filed: Sep. 2, 2022

(65) Prior Publication Data

US 2023/0307236 A1 Sep. 28, 2023

(30) Foreign Application Priority Data

Mar. 22, 2022 (JP) ................................. 2022-045395
Jul. 4, 2022 (JP) ................................. 2022-107884

(51) Int. Cl.
*H10P 30/22* (2026.01)
*H10P 30/20* (2026.01)
(52) U.S. Cl.
CPC ............ *H10P 30/22* (2026.01); *H10P 30/204* (2026.01); *H10P 30/21* (2026.01)
(58) Field of Classification Search
CPC ............ H01L 21/0465; H01L 29/7802; H10D 30/66–669; H10P 30/22; H10P 30/204; H10P 30/21; H10P 30/2042; H10P 30/208
See application file for complete search history.

(56) References Cited

U.S. PATENT DOCUMENTS 6,087,224 A * 7/2000 Luo ...................... H10D 12/038
257/E27.06
6,133,120 A 10/2000 Miyajima et al.
(Continued)

FOREIGN PATENT DOCUMENTS

JP 5-190849 A 7/1993
JP 9-63968 A 3/1997
(Continued)

OTHER PUBLICATIONS

Jin et al., "Lateral Spreads of Ion-Implanted Al and P Atoms in Silicon Carbide", Japanese Journal of Applied Physics 60, 051001 2021, 8 Pages.
(Continued)

*Primary Examiner* — Jessica S Manno
*Assistant Examiner* — Ricky Verdes
(74) *Attorney, Agent, or Firm* — Oblon, McClelland, Maier & Neustadt, L.L.P.

(57) ABSTRACT

A method for manufacturing a semiconductor device according to an embodiment includes forming a first mask material having a first opening on a surface of a silicon carbide layer, performing first ion implantation of forming a first carbon region by implanting carbon (C) into the silicon carbide layer using the first mask material as a mask, forming, on the surface of the silicon carbide layer, a second mask material in which both end portions in a first direction parallel to the surface have second openings disposed inside both end portions in the first direction of the first carbon region, performing second ion implantation of forming a first impurity region by implanting a first impurity into the silicon carbide layer using the second mask material as a mask, and performing heat treatment at 1600° C. or higher.

13 Claims, 60 Drawing Sheets

FIRST DIRECTION
100

(56)　　　　　　References Cited

U.S. PATENT DOCUMENTS

| | | | |
|---|---|---|---|
| 7,666,771 B2 | 2/2010 | Krull et al. | |
| 2008/0108190 A1* | 5/2008 | Matocha ............ | H10D 62/8325 |
| | | | 257/E21.058 |
| 2019/0393312 A1* | 12/2019 | Tawara ................ | H10D 30/665 |
| 2022/0005925 A1 | 1/2022 | Shimizu et al. | |

FOREIGN PATENT DOCUMENTS

| | | | |
|---|---|---|---|
| JP | 2001-77363 A | 3/2001 |
| JP | 2001-93985 A | 4/2001 |
| JP | 2001-94098 A | 4/2001 |
| JP | 2001-94120 A | 4/2001 |
| JP | 2002-314099 A | 10/2002 |
| JP | 2013-42050 A | 2/2013 |
| JP | 2014-160856 A | 9/2014 |
| JP | 2022-12282 A | 1/2022 |
| JP | 2022-31923 A | 2/2022 |
| JP | 2022-48926 A | 3/2022 |

OTHER PUBLICATIONS

Japanese Office Action issued Aug. 19, 2025 in Japanese Patent Application No. 2022-107884 (with unedited computer-generated English Translation), 10 pages.

* cited by examiner

FIRST DIRECTION

FIRST DIRECTION

FIRST DIRECTION

58

19

54

52

50

32

31

32

32a

32

32

31

E1

32

32a

32

E1

32

31

32

C

C p⁺ p

C

C

E2

E2 n⁻ n⁺

10

FIRST DIRECTION

FIRST DIRECTION

FIRST DIRECTION

FIRST DIRECTION

FIRST DIRECTION

FIRST DIRECTION

FIRST DIRECTION

METHOD FOR MANUFACTURING SEMICONDUCTOR DEVICE

CROSS-REFERENCE TO RELATED APPLICATION

This application is based upon and claims the benefit of priority from Japanese Patent Application No. 2022-045395, filed on Mar. 22, 2022, and Japanese Patent Application No. 2022-107884, filed on Jul. 4, 2022, the entire contents of which are incorporated herein by reference.

FIELD

Embodiments described herein relate generally to a method for manufacturing a semiconductor device.

BACKGROUND

Silicon carbide (SiC) is expected as a material for next-generation semiconductor devices. As compared with silicon (Si), silicon carbide has excellent physical properties such as a band gap of about 3 times, a breakdown field strength of about 10 times, and a thermal conductivity of about 3 times. By utilizing this characteristic, a semiconductor device capable of operating at a low loss and a high temperature can be realized.

From the viewpoint of realizing scaling-down of a semiconductor device using silicon carbide, it is desirable to suppress diffusion of impurities ion-implanted into silicon carbide due to heat treatment. The heat treatment is, for example, high-temperature ion implantation of impurities or activation annealing of impurities.

DETAILED DESCRIPTION

Figure 1:
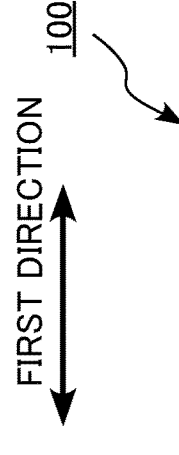
FIG. 1 is a schematic cross-sectional view of a semiconductor device manufactured by a method for manufacturing a semiconductor device according to a first embodiment.

A method for manufacturing a semiconductor device according to an embodiment includes forming a first mask material having a first opening on a surface of a silicon carbide layer; performing first ion implantation of forming a first carbon region by implanting carbon (C) into the silicon carbide layer using the first mask material as a mask; forming a second mask material having a second opening on the surface of the silicon carbide layer, both end portions of the second opening disposed inside of both end portions of the first carbon region in a first direction parallel to the surface; performing second ion implantation of forming a first impurity region by implanting a first impurity into the silicon carbide layer using the second mask material as a mask; and performing heat treatment at 1600° C. or higher.

Hereinafter, embodiments of the present disclosure will be described with reference to the drawings. In the following description, the same or similar members and the like are denoted by the same reference numerals, and the description of the members and the like once described is appropriately omitted.

In the following description, when there are notations of $n^+$, n, and $n^-$, and $p^+$, p, and $p^-$, a relative level of an impurity concentration in each conductivity type is represented. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, an $n^+$ type and an $n^-$ type may be simply referred to as an n type, and a $p^+$ type and a $p^-$ type may be simply referred to as a p type. Unless otherwise specified, the impurity concentration of each region is represented by, for example, a value of an impurity concentration in a central portion of each region.

The impurity concentration can be measured by, for example, secondary ion mass spectrometry (SIMS). A relative level of the impurity concentration can also be determined from a level of a carrier concentration obtained by, for example, Scanning Capacitance Microscopy (SCM). The distance such as the width and depth of the impurity region can be obtained by, for example, SIMS. Moreover, the distance such as the width and depth of the impurity region can be obtained from, for example, the SCM image.

First Embodiment

A method for manufacturing a semiconductor device according to a first embodiment includes forming a first mask material having a first opening on a surface of a silicon carbide layer; performing first ion implantation of forming a first carbon region by implanting carbon (C) into the silicon carbide layer using the first mask material as a mask; forming a second mask material having a second opening on the surface of the silicon carbide layer, both end portions of the second opening disposed inside of both end portions of the first carbon region in a first direction parallel to the surface; performing second ion implantation of forming a first impurity region by implanting a first impurity into the silicon carbide layer using the second mask material as a mask; and performing heat treatment at 1600° C. or higher.

FIG. 1 is a schematic cross-sectional view of a semiconductor device manufactured by the method for manufacturing a semiconductor device according to the first embodiment. The semiconductor device of the first embodiment is a merged PiN Schottky diode (MPS diode) 100. The MPS diode 100 has a structure in which an SBD is sandwiched between PN diodes.

The MPS diode 100 includes a silicon carbide layer 10, an anode electrode 12, and a cathode electrode 14.

The silicon carbide layer 10 includes an n$^+$-type cathode region 16, an n$^-$-type drift region 18, a p$^+$-type anode region 20, and an n-type carrier diffusion region 22.

The silicon carbide layer 10 is single crystal SiC. The silicon carbide layer 10 is, for example, 4H-SiC.

The n$^+$-type cathode region 16 is provided on a back surface side of the silicon carbide layer 10. The cathode region 16 contains, for example, nitrogen (N) as an n-type impurity. The n-type impurity concentration of the cathode region 16 is, for example, $1\times10^{18}$ cm$^{-3}$ or more and $1\times10^{20}$ cm$^{-3}$ or less.

The n$^-$-type drift region 18 is provided on the cathode region 16. The drift region 18 functions as a path of an on-current of the MPS diode 100.

The drift region 18 contains, for example, nitrogen (N) as an n-type impurity. The n-type impurity concentration of the drift region 18 is, for example, $1\times10^{15}$ cm$^{-3}$ or more and $1\times10^{16}$ cm$^{-3}$ or less.

The p$^+$-type anode region 20 is provided on the drift region 18. The anode region 20 is provided on the surface of the silicon carbide layer 10. A plurality of anode regions 20 are provided spaced from one another in a first direction.

When the MPS diode 100 is in the OFF state, the space between the adjacent anode regions 20 is depleted. Therefore, a breakdown voltage of the MPS diode 100 is improved. By providing the anode region 20, a high surge current can flow in the forward direction. Therefore, a surge current tolerance of the MPS diode 100 is improved.

The anode region 20 contains, for example, aluminum (Al) as a p-type impurity. The p-type impurity concentration of the anode region 20 is, for example, $1\times10^{17}$ cm$^{-3}$ or more and $1\times10^{22}$ cm$^{-3}$ or less.

The n-type carrier diffusion region 22 is provided between the drift region 18 and the anode region 20. The carrier diffusion region 22 is provided at the bottom of the anode region 20. By providing the carrier diffusion region 22 at the bottom of the anode region 20, carriers are laterally diffused at the bottom of the anode region 20. Therefore, the on-resistance of the MPS diode 100 is reduced.

The carrier diffusion region 22 contains, for example, nitrogen (N) as an n-type impurity. The n-type impurity concentration of the carrier diffusion region 22 is, for example, $5\times10^{16}$ cm$^{-3}$ or more and $1\times10^{18}$ cm$^{-3}$ or less.

The anode electrode 12 is provided on the front surface side of the silicon carbide layer 10. The anode electrode 12 is electrically connected to the drift region 18 and the anode region 20. The anode electrode 12 is in contact with the drift region 18 and the anode region 20.

The junction between the anode electrode 12 and the drift region 18 is a Schottky junction. The junction between the anode electrode 12 and the anode region 20 is an ohmic junction.

The anode electrode 12 is, for example, a metal or a metal compound.

The cathode electrode 14 is provided on the back surface side of the silicon carbide layer 10. The cathode electrode 14 is electrically connected to the cathode region 16. The cathode electrode 14 is in contact with the cathode region 16. The junction between the cathode electrode 14 and the cathode region 16 is an ohmic junction.

Next, an example of a method for manufacturing a semiconductor device according to the first embodiment will be described.

Figure 6:
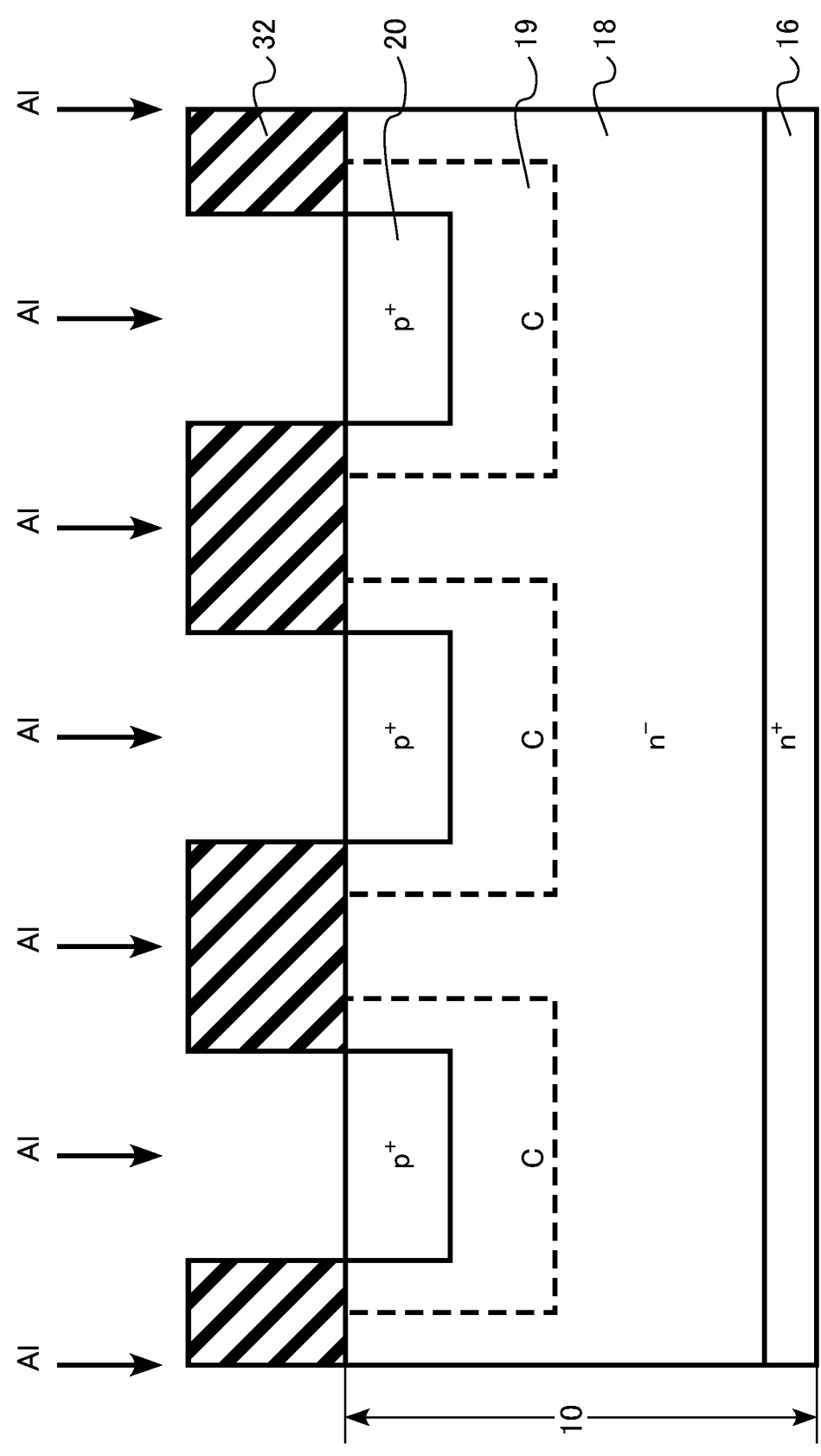
FIG. 6 is an explanatory diagram of the method for manufacturing a semiconductor device according to the first embodiment.
Figure 7:
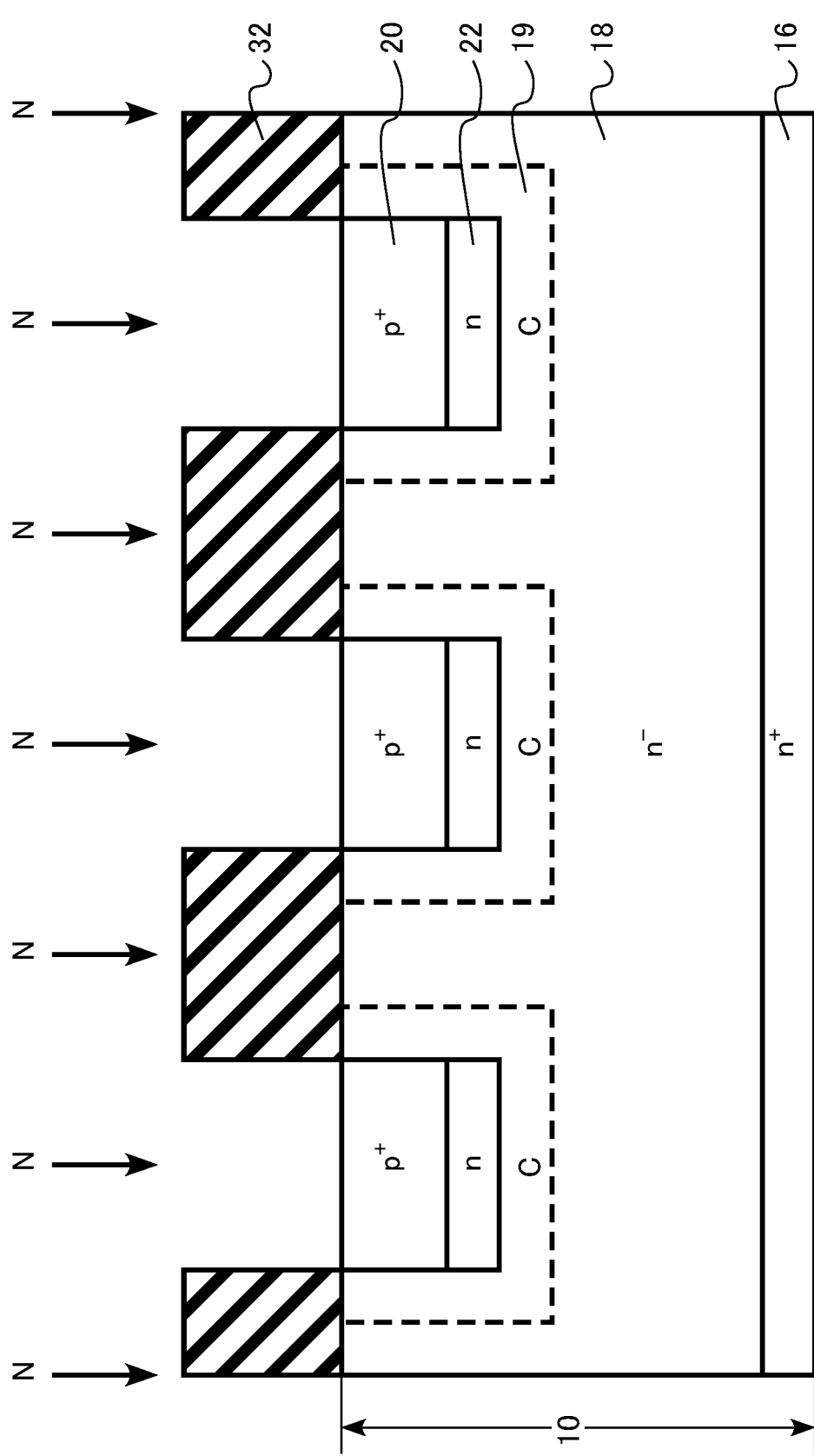
FIG. 7 is an explanatory diagram of the method for manufacturing a semiconductor device according to the first embodiment.
Figure 8:
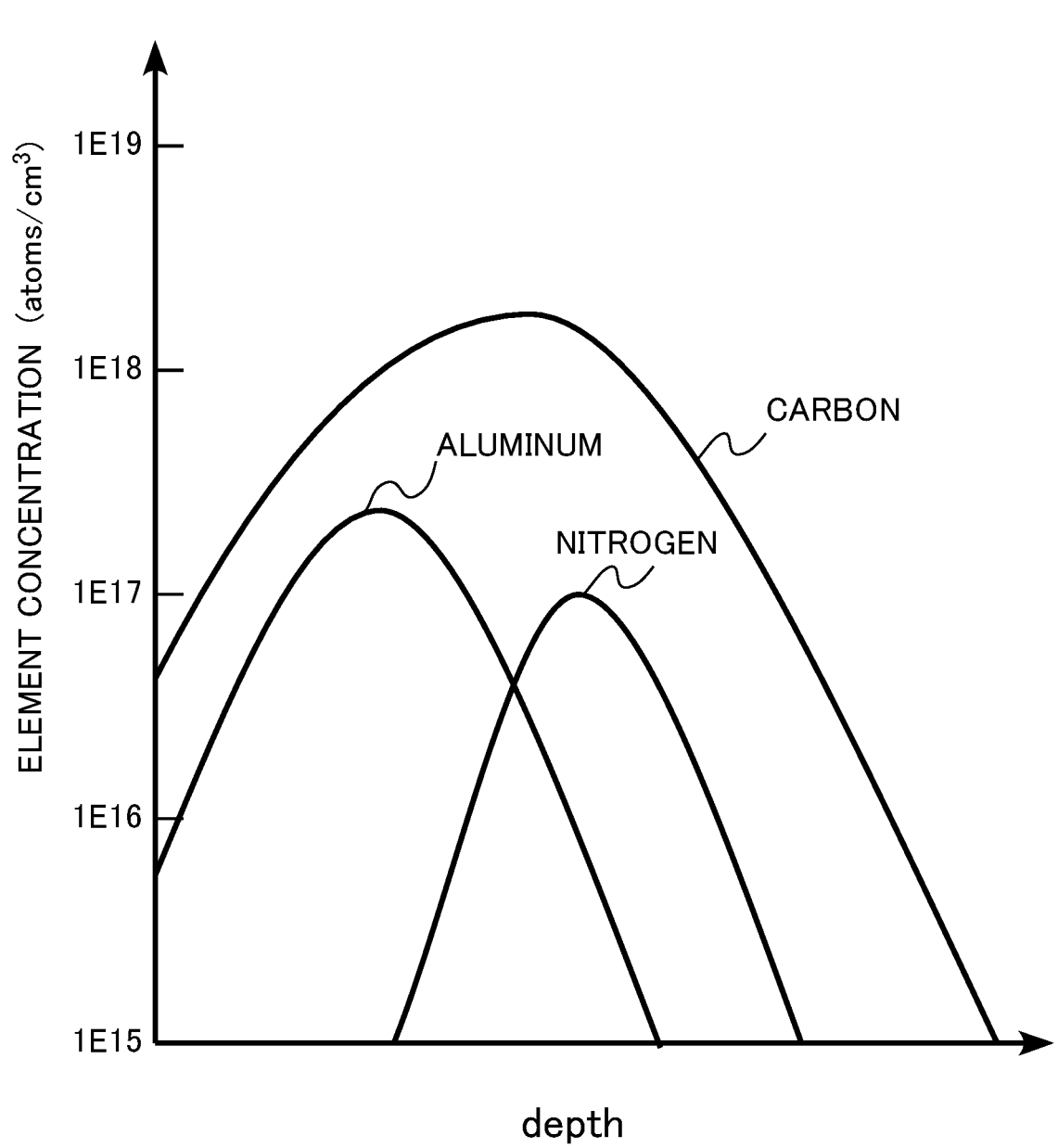
FIG. 8 is an explanatory diagram of the method for manufacturing a semiconductor device according to the first embodiment.

FIGS. 2, 3, 4, 5, 6, 7, 8, and 9 are explanatory diagrams of the method for manufacturing a semiconductor device according to the first embodiment. FIGS. 2 to 7 and 9 are cross-sectional views in the middle of manufacturing. FIG. 8 is a diagram illustrating a distribution of ion-implanted elements immediately after ion implantation.

Figure 2:
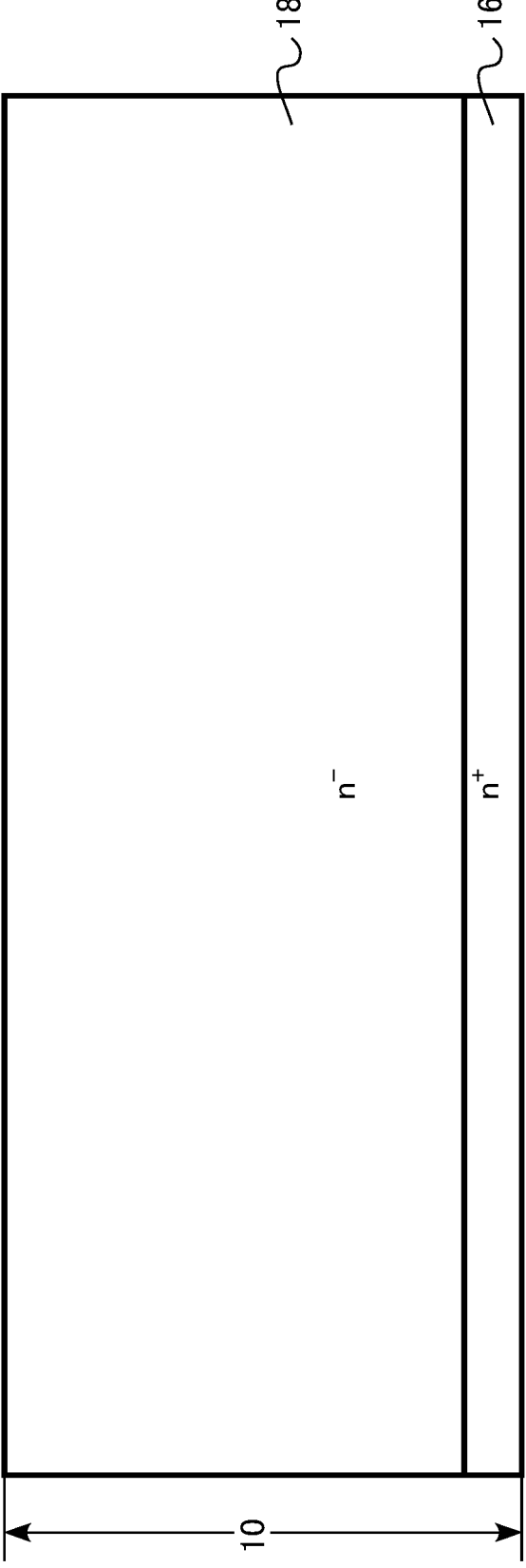
FIG. 2 is an explanatory diagram of the method for manufacturing a semiconductor device according to the first embodiment.

First, a silicon carbide layer 10 is prepared (FIG. 2). The silicon carbide layer 10 includes an n$^+$-type cathode region 16 and an n$^-$-type drift region 18. The drift region 18 is formed on the cathode region 16 by, for example, an epitaxial growth method.

Figure 3:
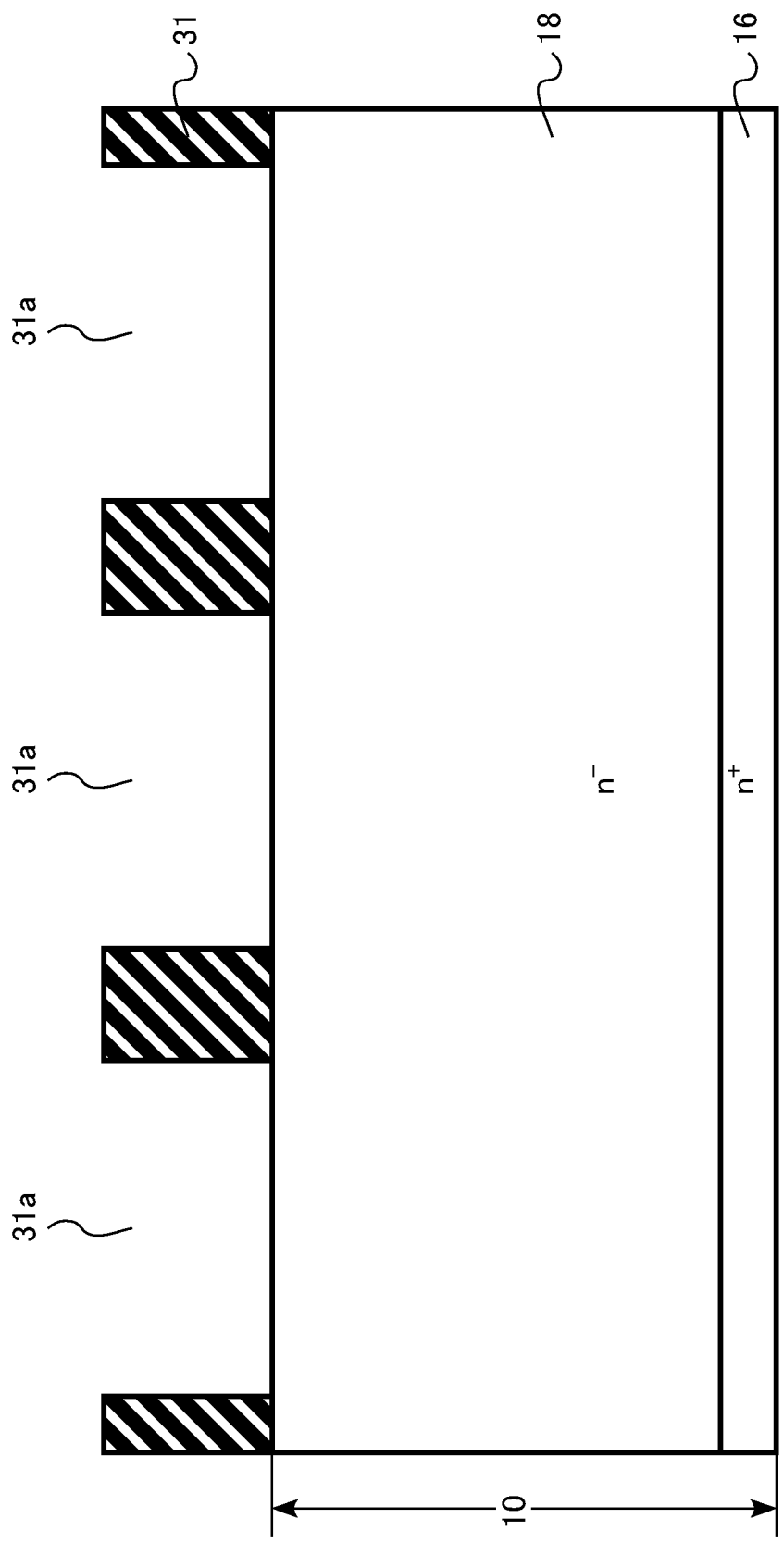
FIG. 3 is an explanatory diagram of the method for manufacturing a semiconductor device according to the first embodiment.

Next, a first mask material 31 having a first opening 31a is formed on the surface of the silicon carbide layer 10 (FIG. 3). The first mask material 31 is, for example, an insulator. The first mask material 31 is, for example, silicon oxide.

The first mask material 31 is formed by, for example, depositing an insulating film and patterning the insulating film by photolithography and etching.

Figure 4:
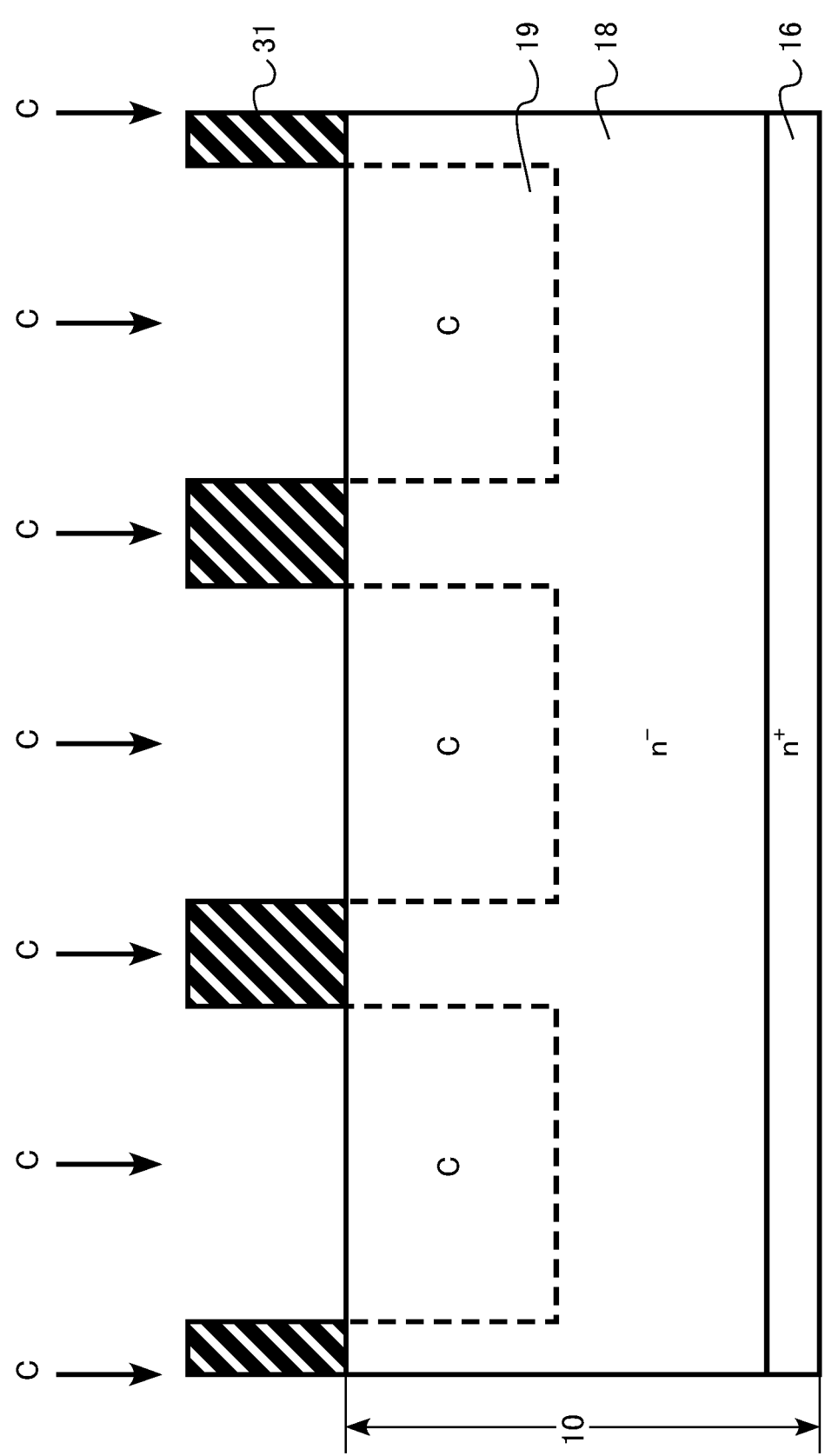
FIG. 4 is an explanatory diagram of the method for manufacturing a semiconductor device according to the first embodiment.

Next, first ion implantation for implanting carbon (C) into the silicon carbide layer 10 is performed using the first mask material 31 as an ion implantation mask (FIG. 4). A carbon region 19 is formed by the first ion implantation. The carbon region 19 is an example of the first carbon region.

The first ion implantation is performed, for example, at a temperature of 1000° C. or more and 1300° C. or less. The first ion implantation is performed, for example, in a state where the temperature of the silicon carbide layer 10 is 1000° C. or more and 1300° C. or less.

Next, the first mask material 31 is removed. The first mask material 31 is removed by, for example, wet etching.

Figure 5:
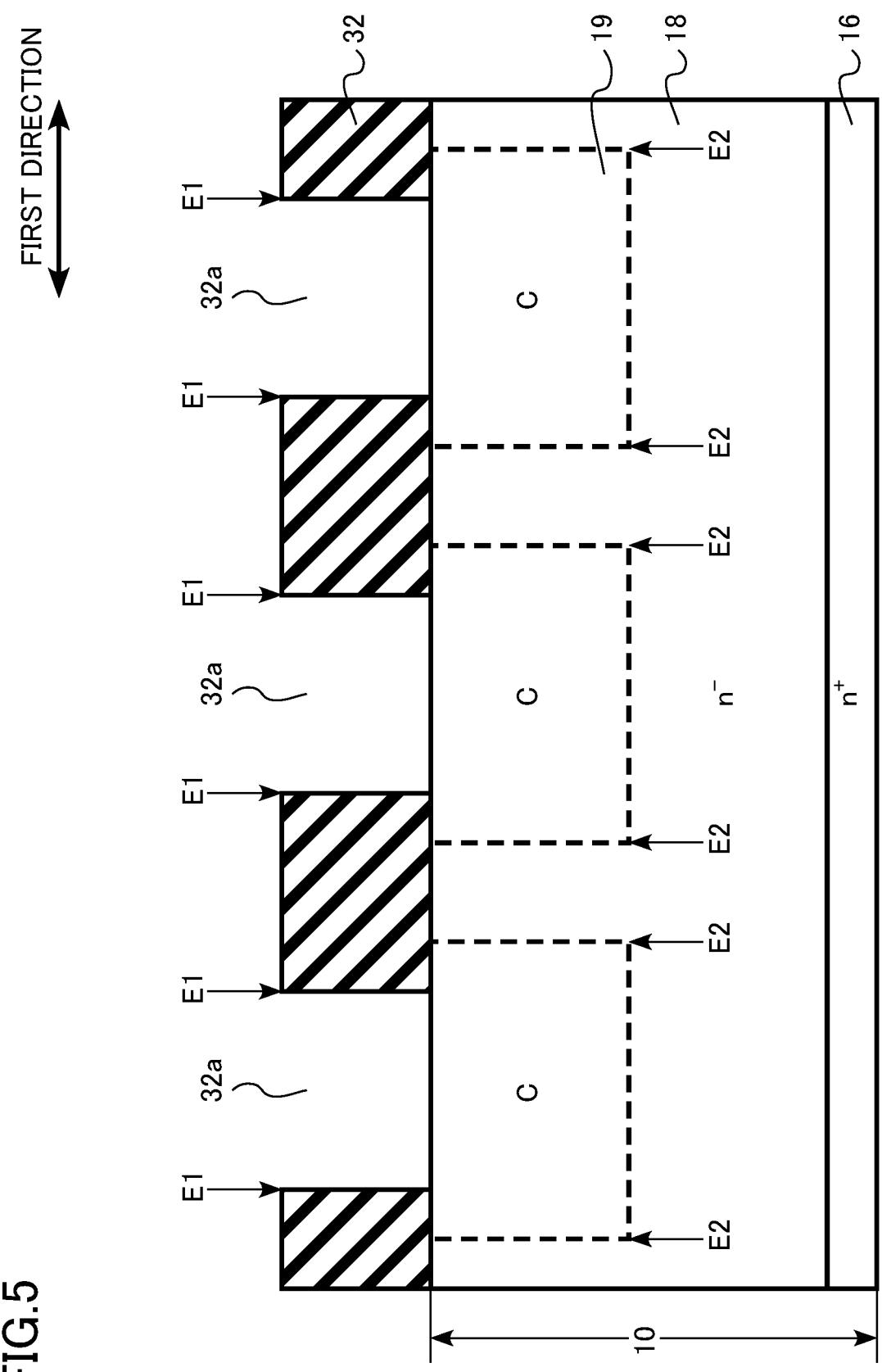
FIG. 5 is an explanatory diagram of the method for manufacturing a semiconductor device according to the first embodiment.

Next, a second mask material 32 having a second opening 32a is formed on the surface of the silicon carbide layer 10 (FIG. 5). The second mask material 32 is, for example, an insulator. The second mask material 32 is, for example, silicon oxide.

Both end portions (E1 in FIG. 5) of the second opening 32a in the first direction are disposed inside both end portions (E2 in FIG. 5) of the carbon region 19 in the first direction. A width of the second opening 32a in the first direction is smaller than a width of the carbon region 19 in the first direction. The first direction is a direction parallel to the surface of the silicon carbide layer 10.

Both end portions (E2 in FIG. 5) in the first direction of the carbon region 19 coincide with positions of both end portions in the first direction of the first opening 31a.

The second mask material 32 is formed by, for example, depositing an insulating film and patterning the insulating film by photolithography and etching.

Next, second ion implantation of implanting aluminum (Al) into the silicon carbide layer 10 is performed using the second mask material 32 as an ion implantation mask (FIG. 6). The anode region 20 is formed by the second ion implantation. Aluminum (Al) implanted by the second ion implantation is an example of the first impurity. The anode region 20 is an example of a first impurity region.

The second ion implantation is performed, for example, at a temperature of 1000° C. or more and 1300° C. or less. The second ion implantation is performed, for example, in a state where the temperature of the silicon carbide layer 10 is 1000° C. or higher and 1300° C. or lower.

Next, third ion implantation for implanting nitrogen (N) into the silicon carbide layer 10 is performed using the second mask material 32 as an ion implantation mask (FIG. 7). The carrier diffusion region 22 is formed by the third ion implantation. Nitrogen (N) is an example of impurities. The carrier diffusion region 22 is an example of an impurity region.

The third ion implantation is performed, for example, at a temperature of 1000° C. or more and 1300° C. or less. The third ion implantation is performed, for example, in a state where the temperature of the silicon carbide layer 10 is 1000° C. or higher and 1300° C. or lower.

Next, the second mask material 32 is removed. The second mask material 32 is removed by, for example, wet etching.

FIG. 8 is a diagram illustrating element distribution immediately after the ion implantation. FIG. 8 illustrates a distribution of elements in the silicon carbide layer 10 in the depth direction.

FIG. 8 illustrates the distribution of carbon (C) implanted by the first ion implantation. FIG. 8 illustrates a carbon profile of the carbon region 19 formed by the first ion implantation. The distribution of carbon (C) implanted by the first ion implantation is determined by an ion implantation condition of the first ion implantation.

FIG. 8 illustrates the distribution of aluminum (Al) implanted by the second ion implantation. FIG. 8 illustrates an aluminum profile of the anode region 20 formed by the second ion implantation. The distribution of aluminum (Al) implanted by the second ion implantation is determined by an ion implantation condition of the second ion implantation.

FIG. 8 illustrates the distribution of nitrogen (N) implanted by the third ion implantation. FIG. 8 illustrates a nitrogen profile of the carrier diffusion region 22 formed by the third ion implantation. The distribution of nitrogen (N) implanted by the third ion implantation is determined by an ion implantation condition of the third ion implantation.

As illustrated in FIG. 8, the depth of the carbon region 19 is deeper than the depth of the anode region 20. The depth of the carbon region 19 is deeper than the depth of the carrier diffusion region 22.

The depth of the carbon region 19 is determined by the ion implantation condition of the first ion implantation for ion-implanting carbon. Further, the depth of the anode region 20 is determined by the ion implantation condition of the second ion implantation for ion-implanting aluminum. In addition, the depth of the carrier diffusion region 22 is determined by the ion implantation condition of the third ion implantation for ion-implanting nitrogen.

As illustrated in FIG. 8, a maximum concentration of carbon (C) in the carbon region 19 is higher than a maximum concentration of aluminum (Al) in the anode region 20. The maximum concentration of carbon (C) in the carbon region 19 is higher than the maximum concentration of nitrogen (N) in the carrier diffusion region 22.

The maximum concentration of carbon (C) in the carbon region 19 is determined by the ion implantation conditions of the first ion implantation for ion-implanting carbon. In addition, the maximum concentration of aluminum (Al) in the anode region 20 is determined by the ion implantation condition of the second ion implantation for ion-implanting aluminum. The maximum concentration of nitrogen (N) in the carrier diffusion region 22 is determined by the ion implantation condition of the third ion implantation for ion-implanting nitrogen.

A dose amount of carbon in the first ion implantation is, for example, 10 times or more a dose amount of aluminum (Al) in the second ion implantation. The dose amount of carbon in the first ion implantation is, for example, 10 times or more a dose amount of nitrogen (N) in the third ion implantation.

As illustrated in FIG. 8, the concentration of carbon implanted by the first ion implantation on the surface of the silicon carbide layer 10 in the carbon region 19 is $1\times10^{15}$ cm$^{-3}$ or more and $1\times10^{18}$ cm$^{-3}$ or less. The concentration of carbon implanted by the first ion implantation on the surface of the silicon carbide layer 10 in the carbon region 19 is determined by the ion implantation condition of the first ion implantation for ion-implanting carbon.

Figure 9:
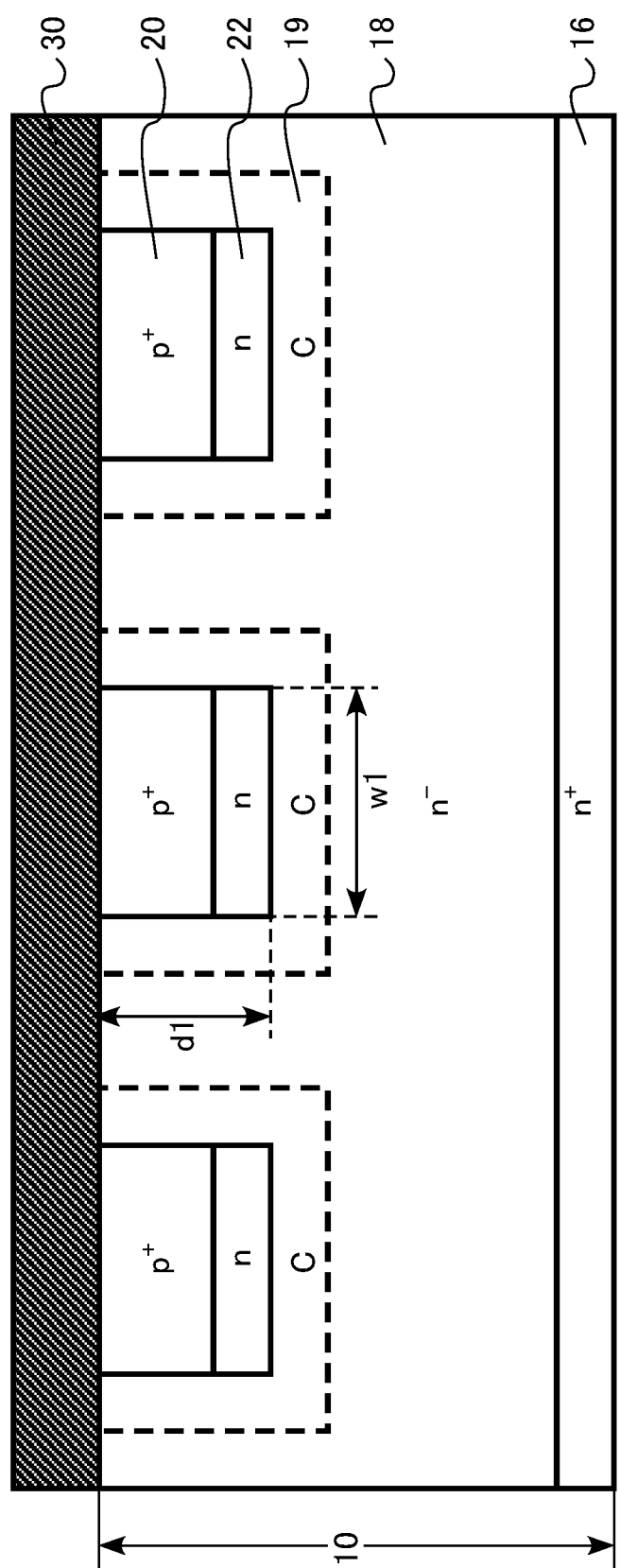
FIG. 9 is an explanatory diagram of the method for manufacturing a semiconductor device according to the first embodiment.

Next, a carbon film 30 is formed on the surface of the silicon carbide layer 10 (FIG. 9).

Next, heat treatment is performed. The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

The heat treatment activates aluminum and nitrogen ion-implanted into the silicon carbide layer 10. The heat treatment is activation annealing of aluminum and nitrogen. Further, interstitial carbon formed by carbon ion implantation into the silicon carbide layer 10 by heat treatment fills carbon vacancy in the silicon carbide layer 10.

The widths of the anode region 20 and the carrier diffusion region 22 in the first direction after the heat treatment are first widths (w1 in FIG. 9). The depth of the carrier diffusion region 22 after the heat treatment is a first depth (d1 in FIG. 9).

The carbon film 30 suppresses desorption of silicon and carbon from the silicon carbide layer 10 into the atmosphere during the heat treatment. Further, the carbon film 30 absorbs excessive interstitial carbon in the silicon carbide layer 10 during the heat treatment.

Next, the carbon film 30 is removed. After that, the anode electrode 12 is formed on the surface of the silicon carbide layer 10 using a known process technique. In addition, the cathode electrode 14 is formed on the back surface of the silicon carbide layer 10.

The MPS diode 100 illustrated in FIG. 1 is manufactured by the above manufacturing method.

Next, functions and effects of the method for manufacturing a semiconductor device according to the first embodiment will be described.

From the viewpoint of realizing scaling-down of a semiconductor device using silicon carbide, it is desirable to suppress diffusion of impurities ion-implanted into silicon carbide due to heat treatment. The heat treatment is, for example, high-temperature ion implantation of impurities or activation annealing of impurities.

In the method for manufacturing a semiconductor device according to the first embodiment, carbon (C) is introduced into a range wider than a range in which impurities are ion-implanted by ion implantation. By the above method, the density of carbon vacancies in the silicon carbide layer is reduced, and diffusion of impurities ion-implanted into silicon carbide due to heat treatment can be suppressed. Details will be described below.

Figure 10:
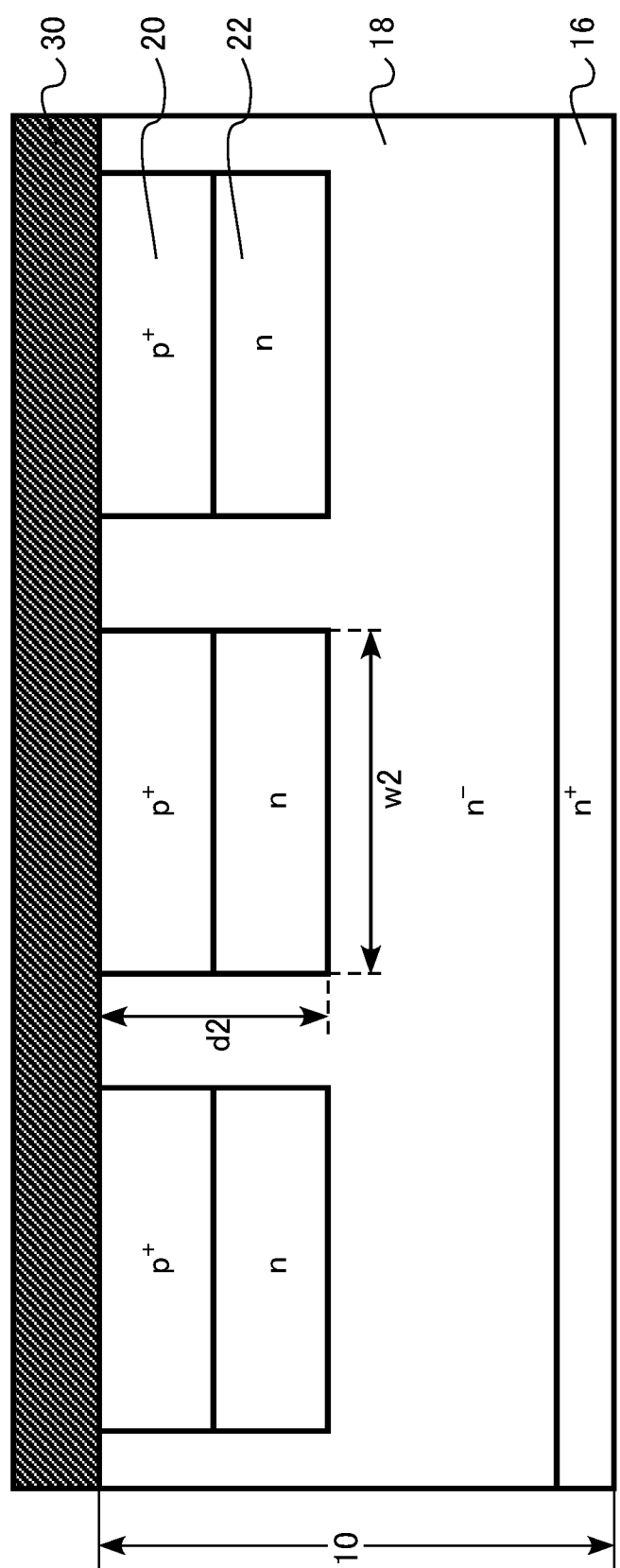
FIG. 10 is an explanatory diagram of a method for manufacturing a semiconductor device of a comparative example.

FIG. 10 is an explanatory view of a method for manufacturing a semiconductor device of a comparative example. The method for manufacturing a semiconductor device of the comparative example is different from the method for manufacturing a semiconductor device of the first embodiment in that the first ion implantation for implanting carbon (C) into the silicon carbide layer 10 is not performed.

FIG. 10 is a cross-sectional view immediately after activation annealing. FIG. 10 is a diagram corresponding to FIG. 9 of the first embodiment.

As illustrated in FIG. 10, the widths of the anode region 20 and the carrier diffusion region 22 in the first direction after the heat treatment are second widths (w2 in FIG. 10). The depth of the carrier diffusion region 22 after the heat treatment is a second depth (d2 in FIG. 10).

The second width w2 increases as the diffusion of the impurities in the lateral direction (first direction) by the heat treatment increases. The second depth d2 increases as the diffusion of the impurities in the depth direction by the heat treatment increases.

For example, as the second width w2 increases, the distance between two adjacent anode regions 20 decreases. Therefore, the on-resistance of the MPS diode increases. Therefore, it is difficult to realize scaling-down of the MPS diode.

Furthermore, for example, when the second depth d2 becomes deeper, the concentration of the carrier diffusion region 22 decreases, and the electrical resistance of the carrier diffusion region 22 increases. Therefore, diffusion of carriers in the lateral direction is suppressed at the bottom of the anode region 20. Therefore, the on-resistance of the MPS diode increases.

According to the method for manufacturing a semiconductor device of the first embodiment, the first width w1 of the anode region 20 and the carrier diffusion region 22 in the first direction after the heat treatment is smaller than the second width w2 of the comparative example. Therefore, the on-resistance of the MPS diode 100 is reduced.

Diffusion of impurities in the silicon carbide layer 10 is promoted by carbon vacancies in the silicon carbide layer 10. By forming the carbon region 19 by ion implantation of carbon, the density of carbon vacancies in the silicon carbide layer 10 is reduced. Therefore, diffusion of impurities is suppressed, and the first width w1 decreases.

In particular, in the method for manufacturing a semiconductor device according to the first embodiment, when the second mask material 32 is formed, both end portions (E1 in FIG. 5) of the second opening 32a in the first direction are formed so as to be disposed inside both end portions (E2 in FIG. 5) of the carbon region 19 in the first direction. Therefore, the anode region 20 and the carrier diffusion region 22 after the ion implantation are covered with the carbon region 19 in the lateral direction.

In the method for manufacturing a semiconductor device according to the first embodiment, the carbon region 19 is formed in a region where diffusion of impurities in the lateral direction is scheduled before the heat treatment for diffusing the impurities. Therefore, lateral diffusion of impurities is effectively suppressed.

In addition, according to the method for manufacturing a semiconductor device of the first embodiment, the first depth d1 of the carrier diffusion region 22 after the heat treatment is smaller than the second depth d2 of the comparative example. Therefore, the on-resistance of the MPS diode 100 is reduced.

Diffusion of impurities in the silicon carbide layer 10 is promoted by carbon vacancies in the silicon carbide layer 10. By forming the carbon region 19 by ion implantation of carbon, the density of carbon vacancies in the silicon carbide layer 10 is reduced. Therefore, diffusion of impurities is suppressed, and the first depth d1 decreases.

In particular, in the method for manufacturing a semiconductor device according to the first embodiment, the carbon region 19 is formed to be deeper than the carrier diffusion region 22. Therefore, after the ion implantation, the carrier diffusion region 22 is covered with the carbon region 19 in the depth direction.

In the method for manufacturing a semiconductor device according to the first embodiment, the carbon region 19 is formed in a region where diffusion of the impurity in the depth direction is scheduled before the heat treatment for diffusing the impurity. Therefore, diffusion of impurities in the depth direction is effectively suppressed.

In the method for manufacturing a semiconductor device according to the first embodiment, carbon (C) is introduced into a range wider than a range in which impurities are ion-implanted by ion implantation. Therefore, diffusion of impurities ion-implanted into silicon carbide due to heat treatment can be effectively suppressed. Therefore, the scaling-down of the MPS diode 100 can be realized.

In addition, in the method for manufacturing a semiconductor device according to the first embodiment, when carbon is ion-implanted, a region where a Schottky junction is to be formed later is covered with the first mask material 31. Therefore, ion implantation of carbon is not performed in a region where a Schottky junction is formed later. Therefore, for example, it is possible to suppress degradation of characteristics of the Schottky junction due to damage by ion implantation of carbon.

The depth of the carbon region 19 is preferably deeper than the depth of the anode region 20 from the viewpoint of suppressing diffusion of impurities in the depth direction, and the depth of the carbon region 19 is preferably deeper than the depth of the carrier diffusion region 22 from the viewpoint of suppressing diffusion of impurities in the depth direction.

The first ion implantation for implanting carbon is preferably performed at a temperature of 1000° C. or higher. By introducing carbon into the silicon carbide layer 10 at a temperature of 1000° C. or higher, interstitial carbon enters carbon vacancies during ion implantation, and the density of carbon vacancies can be reduced. Therefore, for example, diffusion of impurities when the subsequent ion implantation of impurities is performed at a high temperature can be suppressed.

In addition, ion implantation of carbon at a temperature of 1000° C. or higher can reduce damage due to ion implantation of carbon. Therefore, the characteristics of the MPS diode 100 are improved.

The second ion implantation for implanting aluminum (Al) and the third ion implantation for implanting nitrogen (N) are preferably performed at a temperature of 1000° C. or higher. Impurity ion implantation at a temperature of 1000° C. or higher can reduce damage due to impurity ion implantation. Since amorphization of the silicon carbide layer 10 due to damage can be suppressed and the crystallinity can be kept high, the activation efficiency after the activation annealing can be increased.

Since the crystallinity of the silicon carbide layer 10 can be maintained higher as the temperature of ion implantation is higher, the temperature of ion implantation is more preferably 1100° C. or higher. Meanwhile, a resist used as a mask for ion implantation has low heat resistance. The heat resistance of the resist is, for example, 500° C. or less. Therefore, when ion implantation is performed at a temperature of 1000° C. or higher, it is desirable to form a mask with a material having high heat resistance such as silicon oxide, silicon nitride, or aluminum nitride. From the viewpoint of heat resistance, for example, the temperature of ion implantation is preferably 1300° C. or lower when silicon oxide is used as the material of the mask, and is preferably 1400° C. or lower when silicon nitride or aluminum nitride is used. Considering an etching selectivity to the silicon carbide layer 10 and the like, it is preferable to use silicon oxide as a material of the mask. For ion implantation of impurities, silicon oxide is used as a material of a mask, and the temperature is preferably 1000° C. or more and 1300° C. or less, and more preferably 1100° C. or more and 1200 or less.

Since the carbon region 19 is formed by ion implantation of carbon prior to ion implantation of impurities, diffusion of impurities due to ion implantation at a high temperature can be suppressed.

From the viewpoint of suppressing diffusion of aluminum, the maximum concentration of carbon in the silicon carbide layer 10 implanted by the first ion implantation is preferably higher than the maximum concentration of aluminum in the silicon carbide layer 10 implanted by the second ion implantation. From the viewpoint of suppressing diffusion of nitrogen, the maximum concentration of carbon in the silicon carbide layer 10 implanted by the first ion implantation is preferably higher than the maximum concentration of nitrogen in the silicon carbide layer 10 implanted by the third ion implantation.

From the viewpoint of suppressing diffusion of aluminum, the dose amount of carbon in the first ion implantation is preferably 10 times or more, and more preferably 100 times or more the dose amount of aluminum in the second ion implantation. In addition, from the viewpoint of suppressing diffusion of nitrogen, the dose amount of carbon in the first ion implantation is preferably 10 times or more, and more preferably 100 times or more the dose amount of nitrogen in the third ion implantation.

From the viewpoint of suppressing diffusion of aluminum in the lateral direction, the concentration of the surface of the silicon carbide layer 10 of carbon implanted by the first ion implantation is preferably $1 \times 10^{16}$ cm$^{-3}$ or more, more preferably $1 \times 10^{16}$ cm$^{-3}$ or more, and still more preferably $1 \times 10^{17}$ cm$^{-3}$ or more.

The temperature of the heat treatment is preferably 1850° C. or higher. When the heat treatment is performed at 1850° C. or higher, the activation rate of impurities is improved. Since the carbon region 19 is formed by the ion implantation of carbon prior to ion implantation of impurities, diffusion of impurities can be suppressed even when the heat treatment is 1850° C. or higher.

(First Modification)

A method for manufacturing a semiconductor device according to a first modification of the first embodiment is different from the method for manufacturing a semiconductor device according to the first embodiment in that the second mask material is formed by forming a sidewall material on a sidewall of the first opening.

Figure 11:
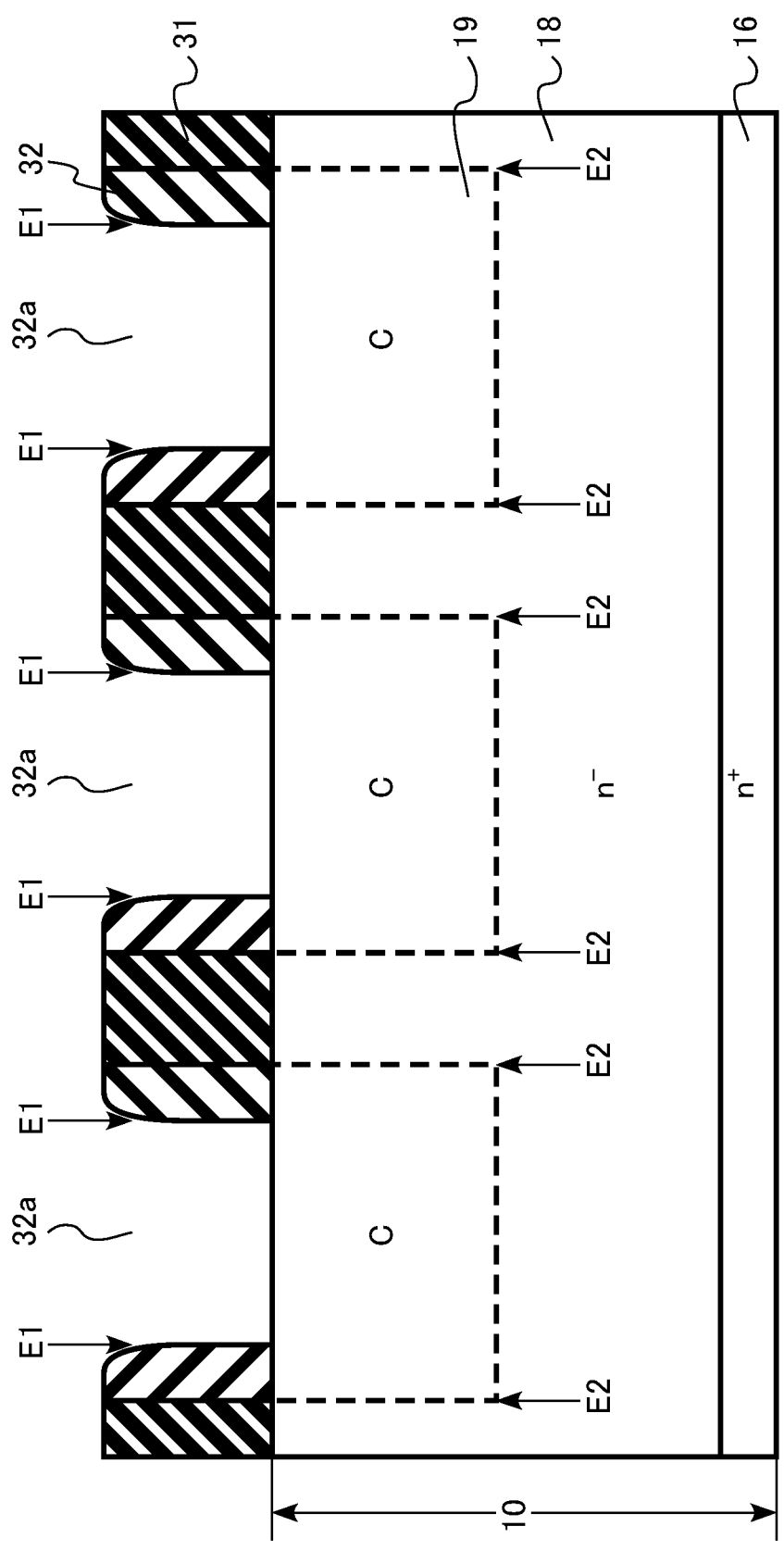
FIG. 11 is an explanatory diagram of a method for manufacturing a semiconductor device according to a first modification of the first embodiment.
Figure 12:
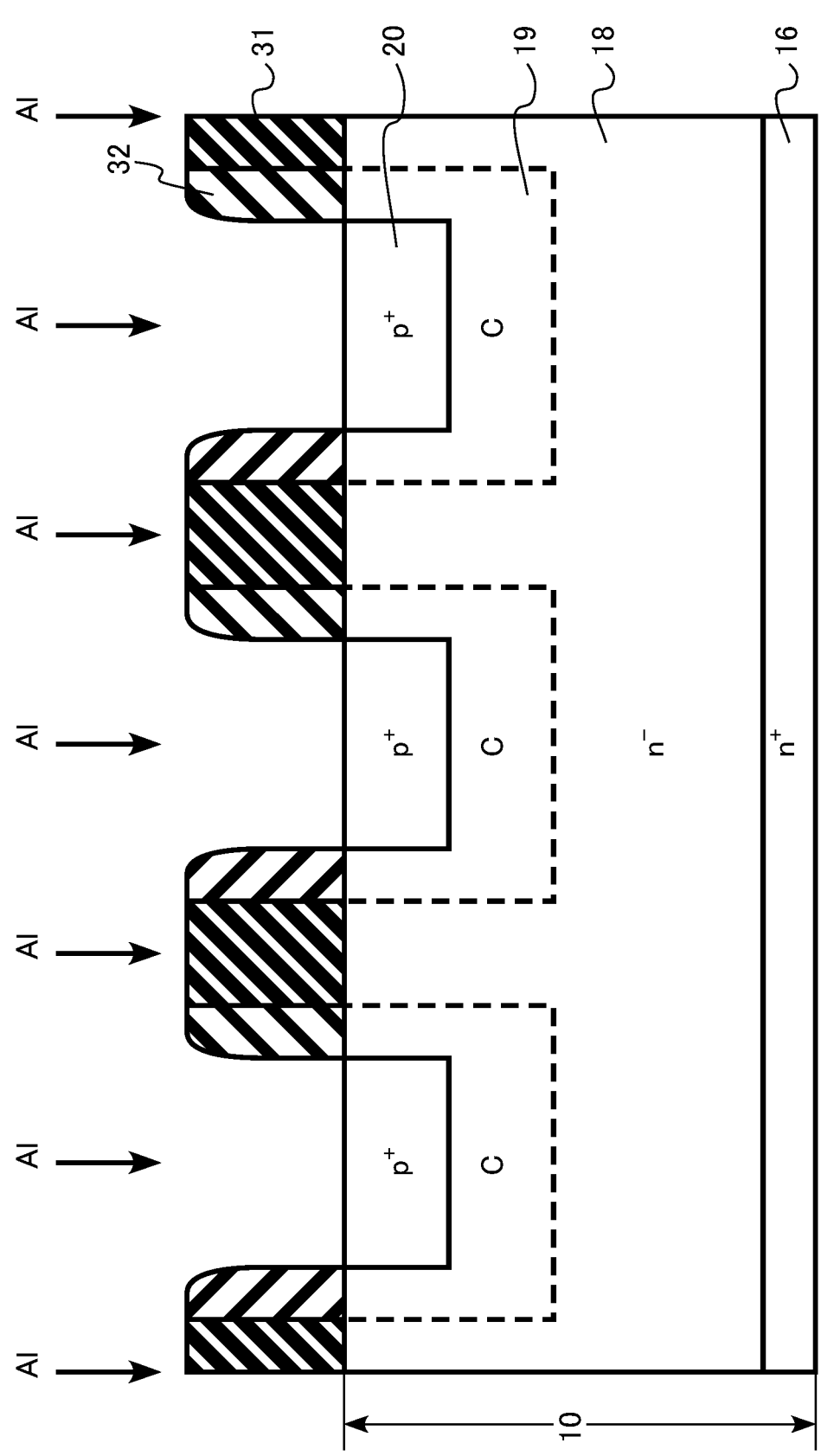
FIG. 12 is an explanatory diagram of the method for manufacturing a semiconductor device according to the first modification of the first embodiment.

FIGS. 11 and 12 are explanatory diagrams of the method for manufacturing a semiconductor device according to the first modification of the first embodiment. FIG. 11 is a cross-sectional view immediately after the second mask material 32 is formed. FIG. 11 is a diagram corresponding to FIG. 5 of the first embodiment. FIG. 12 is a diagram corresponding to FIG. 6 of the first embodiment.

As illustrated in FIG. 11, the second mask material 32 is formed by forming a sidewall material on the sidewall of the first opening 31a of the first mask material 31. The sidewall material can be formed by, for example, deposition of an insulating film serving as a sidewall material and anisotropic etching.

The sidewall material becomes the second mask material 32. The opening formed by the sidewall material is the second opening 32a. Both end portions (E1 in FIG. 11) of the second opening 32a in the first direction are disposed inside both end portions (E2 in FIG. 11) of the carbon region 19 in the first direction. The sidewall material formed on the sidewall of first opening 31a is an example of the first sidewall material.

Next, second ion implantation for implanting aluminum into the silicon carbide layer 10 is performed using the first mask material 31 and the second mask material 32 as ion implantation masks (FIG. 12). The anode region 20 is formed by the second ion implantation. Aluminum implanted by the second ion implantation is an example of the first impurity.

After the anode region 20 is formed, the manufacturing method is the same as that of the first embodiment.

According to the method for manufacturing a semiconductor device of the first modification of the first embodiment, the second opening 32a can be formed in a self-alignment manner with respect to the first opening 31a.

Therefore, when second opening 32a is formed, it is not necessary to consider a margin for alignment with carbon region 19. Therefore, the scaling-down of the MPS diode can be further realized.

(Second Modification)

A method for manufacturing a semiconductor device according to a second modification of the first embodiment is different from the method for manufacturing a semiconductor device according to the first embodiment in that the third ion implantation of ion-implanting carbon using the second mask material as a mask is performed before the second ion implantation.

Figure 13:
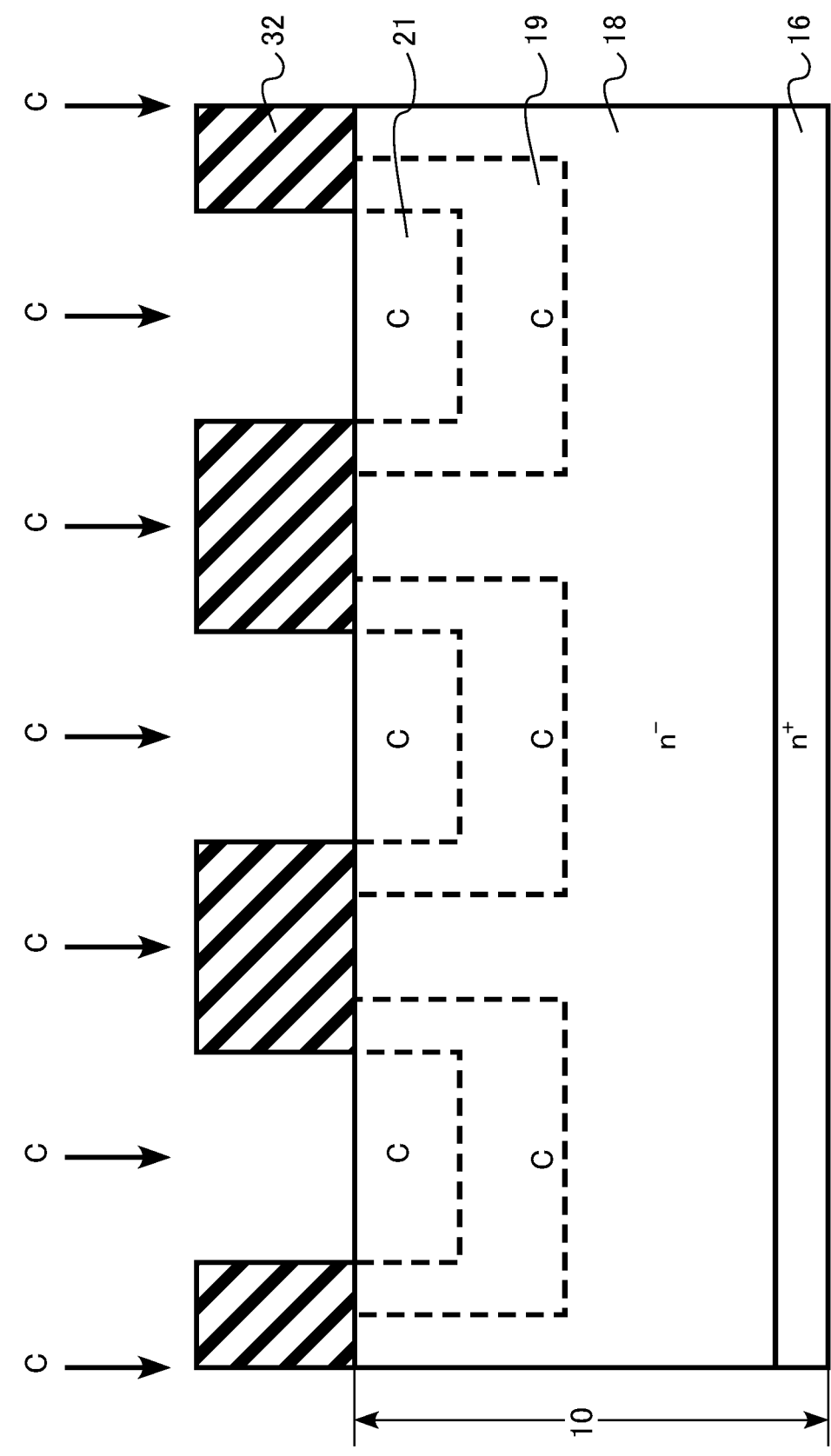
FIG. 13 is an explanatory diagram of a method for manufacturing a semiconductor device according to a second modification of the first embodiment.

FIG. 13 is an explanatory diagram of the method for manufacturing a semiconductor device according to the second modification of the first embodiment. FIG. 13 is a cross-sectional view when carbon ion implantation is performed after the second mask material 32 is formed.

After the formation of the second mask material 32, the third ion implantation for implanting carbon into the silicon carbide layer 10 is performed before second ion implantation for implanting aluminum. The carbon region 21 is formed by the third ion implantation for implanting carbon into the silicon carbide layer 10.

Next, the second ion implantation for implanting aluminum into the silicon carbide layer 10 is performed. After the second ion implantation for implanting aluminum into the silicon carbide layer 10, a manufacturing method similar to that of the first embodiment is employed.

After the formation of the second mask material 32, the manufacturing method is similar to that of the first embodiment.

According to the method for manufacturing a semiconductor device according to the second modification of the first embodiment, diffusion of impurities can be further suppressed by ion implantation for adding carbon. Therefore, the scaling-down of the MPS diode can be further realized.

(Third Modification)

A method for manufacturing a semiconductor device according to a third modification of the first embodiment is different from the method for manufacturing a semiconductor device according to the first embodiment in that the depth of the carbon region 19 is shallower than the depth of the anode region 20 and the depth of the carbon region 19 is shallower than the depth of the carrier diffusion region 22.

Figure 14:
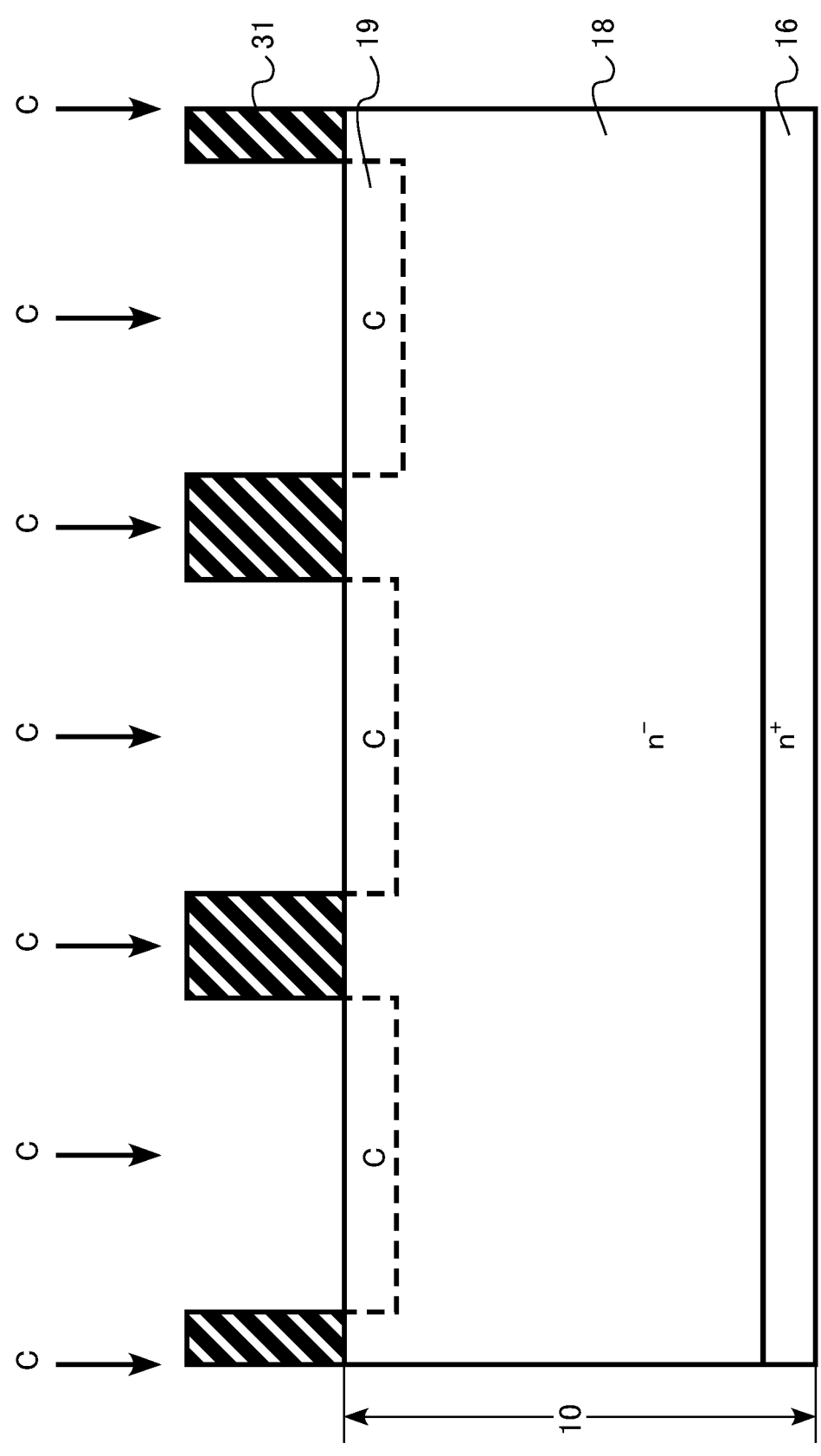
FIG. 14 is an explanatory diagram of a method for manufacturing a semiconductor device according to a third modification of the first embodiment.
Figure 15:
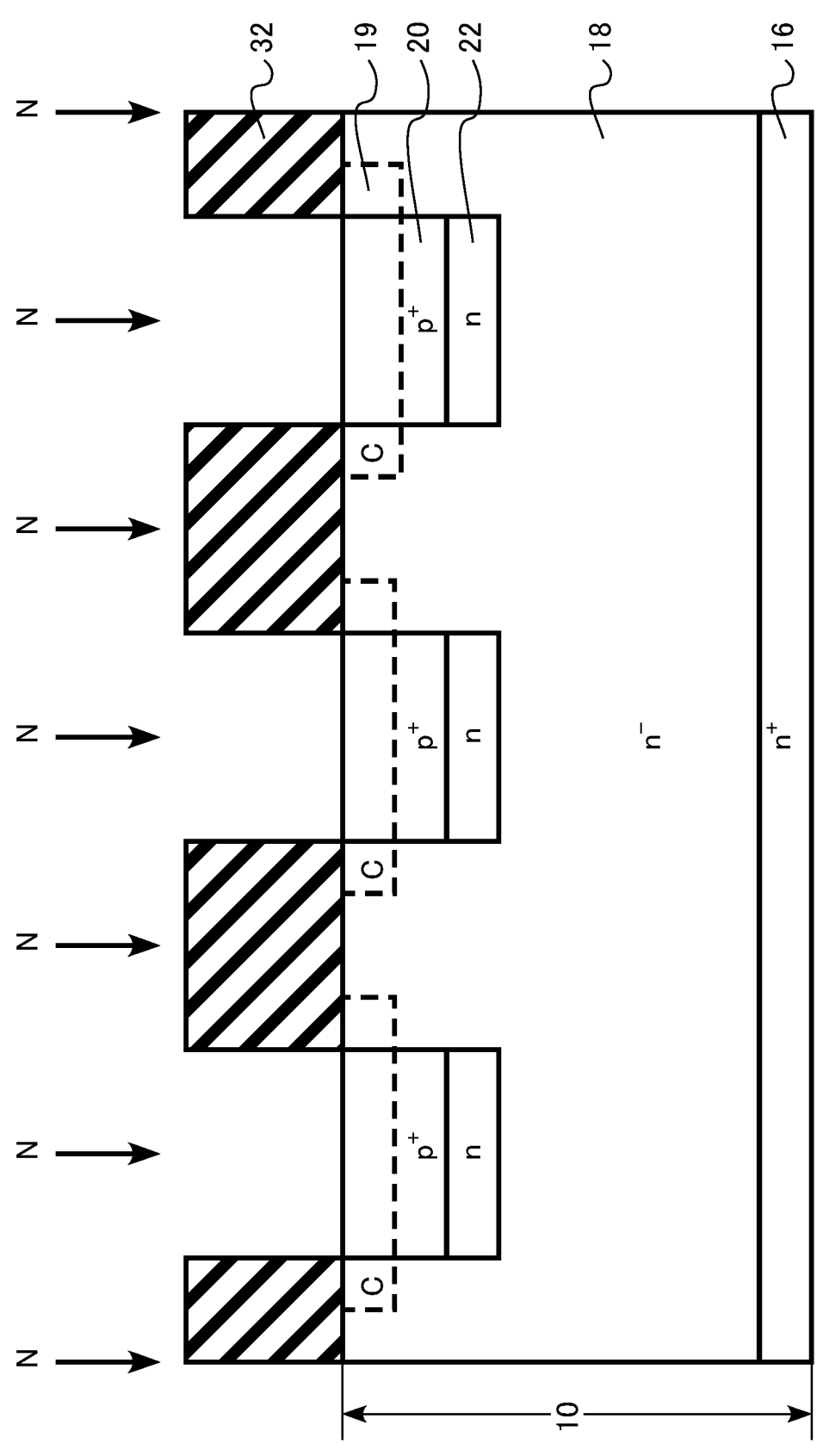
FIG. 15 is an explanatory diagram of the method for manufacturing a semiconductor device according to the third modification of the first embodiment.
Figure 16:
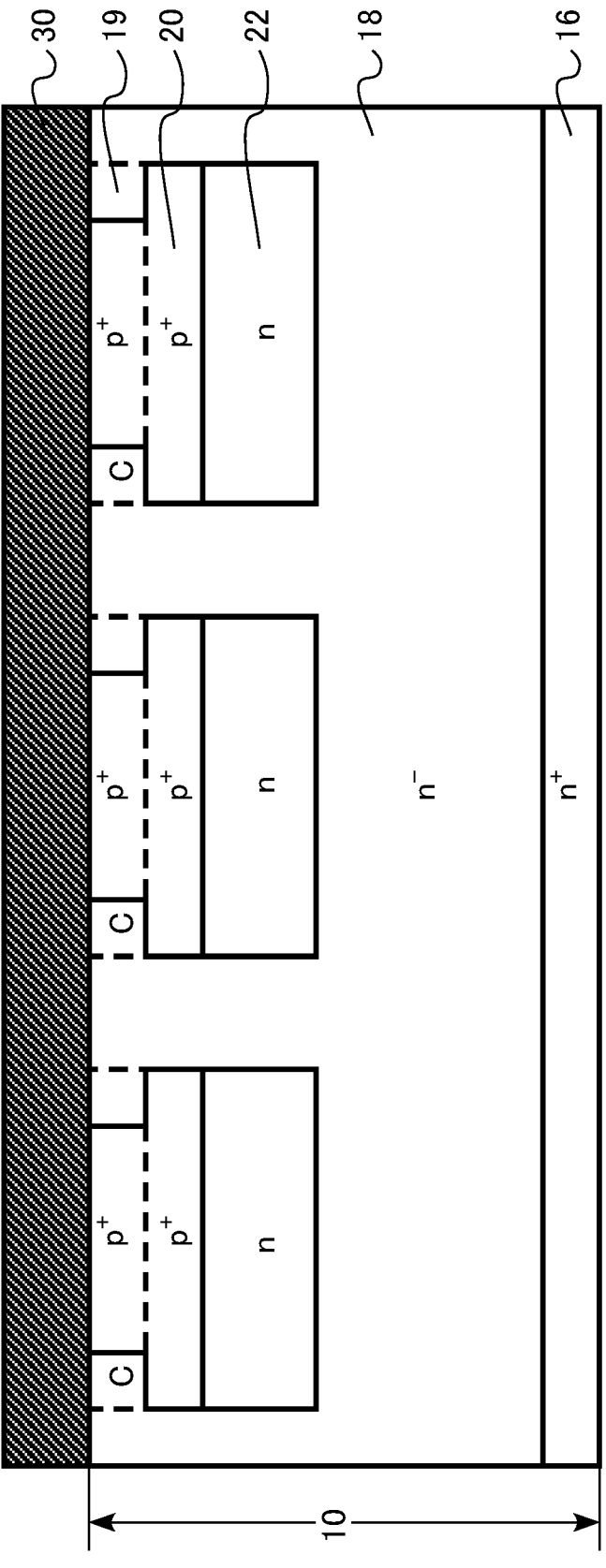
FIG. 16 is an explanatory diagram of the method for manufacturing a semiconductor device according to a third modification of the first embodiment.

FIGS. 14, 15, and 16 are explanatory diagrams of the method for manufacturing a semiconductor device according to the third modification of the first embodiment. FIG. 14 is a diagram corresponding to FIG. 4 of the first embodiment. FIG. 15 is a diagram corresponding to FIG. 7 of the first embodiment. FIG. 16 is a diagram corresponding to FIG. 9 of the first embodiment.

The first ion implantation for implanting carbon (C) into the silicon carbide layer 10 is performed using the first mask material 31 as an ion implantation mask (FIG. 14). A carbon region 19 is formed by the first ion implantation. The depth of the carbon region 19 to be formed is shallower than that in the case of the first embodiment.

Since the depth of the carbon region 19 to be formed is shallow, the depth of the carbon region 19 is shallower than the depth of the anode region 20, and the depth of the carbon region 19 is shallower than the depth of the carrier diffusion region 22 (FIG. 15).

After the heat treatment, diffusion of the anode region 20 in the lateral direction on the surface of the silicon carbide layer 10 is suppressed (FIG. 16). Only lateral diffusion of the anode region 20 on the surface of the silicon carbide layer 10 overlapping the carbon region 19 is suppressed.

As described above, according to the methods for manufacturing a semiconductor device of the first embodiment and the modifications, diffusion of impurities due to heat treatment can be suppressed by the ion implantation of carbon.

Second Embodiment

A method for manufacturing a semiconductor device of a second embodiment is different from the method for manufacturing a semiconductor device of the first embodiment in that a metal oxide semiconductor field effect transistor (MOSFET) is manufactured. Hereinafter, description of contents overlapping with the first embodiment may be partially omitted.

Figure 17:
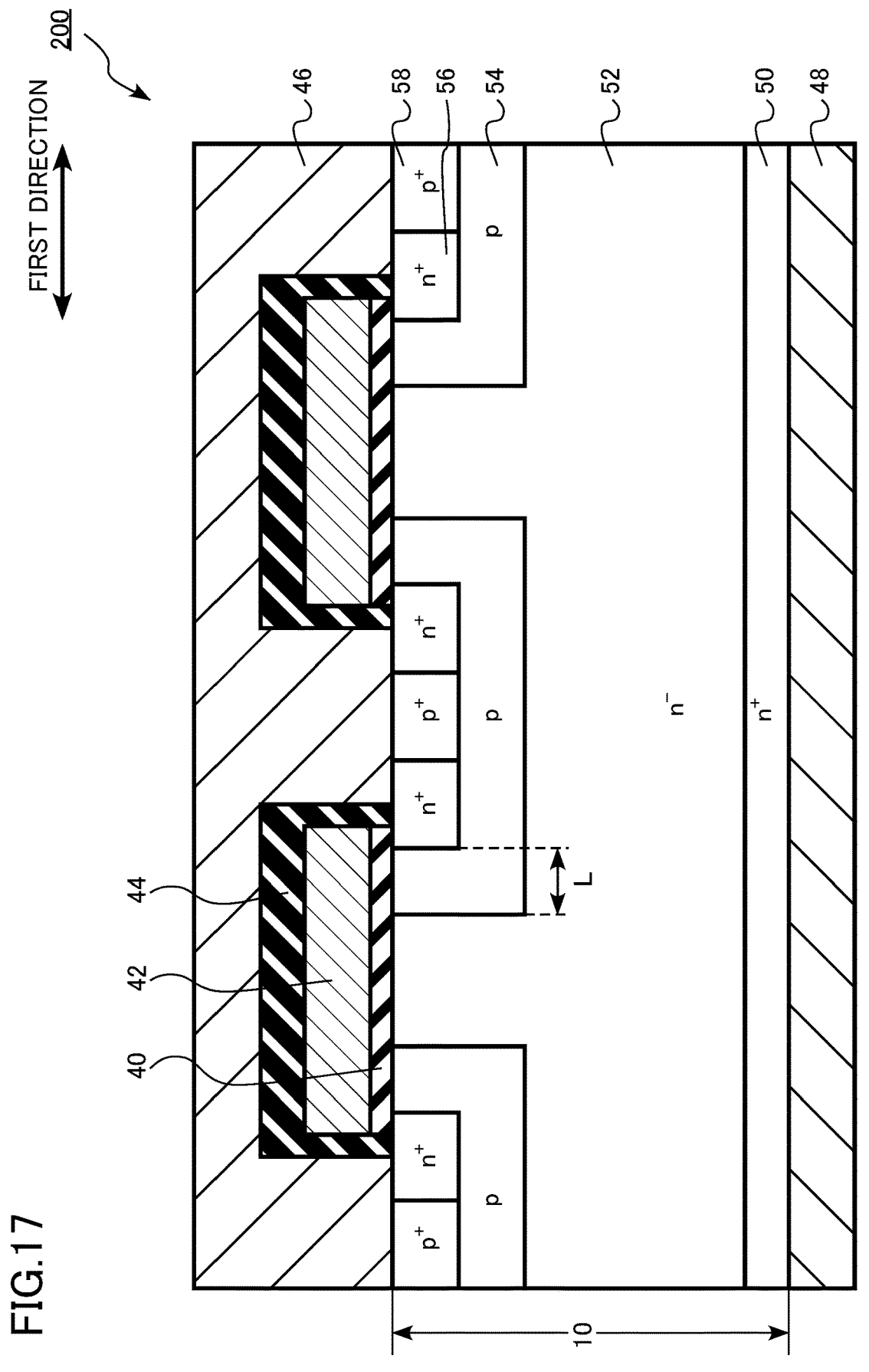
FIG. 17 is a schematic cross-sectional view of a semiconductor device manufactured by a method for manufacturing a semiconductor device according to a second embodiment.

FIG. 17 is a schematic cross-sectional view of a semiconductor device manufactured by the method for manufacturing a semiconductor device according to the second embodiment. The semiconductor device of the second embodiment is a MOSFET 200.

The MOSFET 200 includes a silicon carbide layer 10, a gate insulating layer 40, a gate electrode 42, an interlayer insulating film 44, a source electrode 46, and a drain electrode 48.

The silicon carbide layer 10 includes an $n^+$-type drain region 50, an $n^-$-type drift region 52, a p-type well region 54, an $n^+$-type source region 56, and a $p^+$-type well contact region 58.

The silicon carbide layer 10 is, for example, a single crystal of 4H-SiC. The silicon carbide layer 10 is disposed between the source electrode 46 and the drain electrode 48.

The silicon carbide layer 10 is single crystal SiC. The silicon carbide layer 10 is, for example, 4H-SiC.

The $n^+$-type drain region 50 is provided on the back surface side of the silicon carbide layer 10. The drain region 50 contains, for example, nitrogen (N) as n-type impurities. The n-type impurity concentration of the drain region 50 is, for example, $1\times10^{18}$ $cm^{-3}$ or more and $1\times10^{20}$ $cm^{-3}$ or less.

The $n^-$-type drift region 52 is provided on the drain region 50. The drift region 52 functions as a path of an on-current of the MOSFET 200.

The drift region 52 contains, for example, nitrogen (N) as an n-type impurity. The n-type impurity concentration of the drift region 52 is, for example, $1\times10^{15}$ $cm^{-3}$ or more and $1\times10^{16}$ $cm^{-3}$ or less.

The thickness of the drift region 52 is, for example, 5 μm or more and 100 μm or less.

The p-type well region 54 is provided on the drift region 52. The well region 54 is disposed between the drift region 52 and the gate insulating layer 40. The well region 54 functions as a channel region of the MOSFET 200.

The well region 54 contains, for example, aluminum (Al) as a p-type impurity. The p-type impurity concentration of the well region 54 is, for example, $1\times10^{16}$ $cm^{-3}$ or more and $1\times10^{20}$ $cm^{-3}$ or less.

The $n^+$-type source region 56 is provided on the well region 54. The source region 56 contains, for example, phosphorus (P) as n-type impurities. The n-type impurity concentration of the source region 56 is, for example, $1\times10^{18}$ $cm^{-3}$ or more and $1\times10^{22}$ $cm^{-3}$ or less.

The $p^+$-type well contact region 58 is provided on the well region 54. The well contact region 58 is provided on the side of the source region 56.

The well contact region 58 contains, for example, aluminum as a p-type impurity. The p-type impurity concentration of the well contact region 58 is, for example, $1\times10^{18}$ $cm^{-3}$ or more and $1\times10^{22}$ $cm^{-3}$ or less.

The gate insulating layer 40 is provided between the silicon carbide layer 10 and the gate electrode 42. The gate insulating layer 40 contains, for example, silicon oxide.

The gate electrode 42 is provided on the gate insulating layer 40. The gate electrode 42 is, for example, polycrystalline silicon containing n-type impurities or p-type impurities.

The interlayer insulating film 44 is formed on the gate electrode 42. The interlayer insulating film 44 is disposed between the gate electrode 42 and the source electrode 46. The interlayer insulating film 44 is, for example, a silicon oxide film.

The source electrode 46 is provided on the front surface side of the silicon carbide layer 10. The source electrode 46 is electrically connected to the source region 56 and the well contact region 58. The source electrode 46 is in contact with, for example, the source region 56 and the well contact region 58.

The drain electrode 48 is provided on the side of the silicon carbide layer 10 opposite to the source electrode 46, that is, on the back surface side. The drain electrode 48 is electrically connected to the drain region 50. The drain electrode 48 is in contact with, for example, the drain region 50.

Next, an example of a method for manufacturing a semiconductor device according to the second embodiment will be described.

FIGS. 18, 19, 20, 21, 22, 23, 24, 25, 26, and 27 are explanatory diagrams of the method for manufacturing a semiconductor device according to the second embodiment. FIGS. 18 to 27 are cross-sectional views in the middle of manufacturing.

Figure 18:
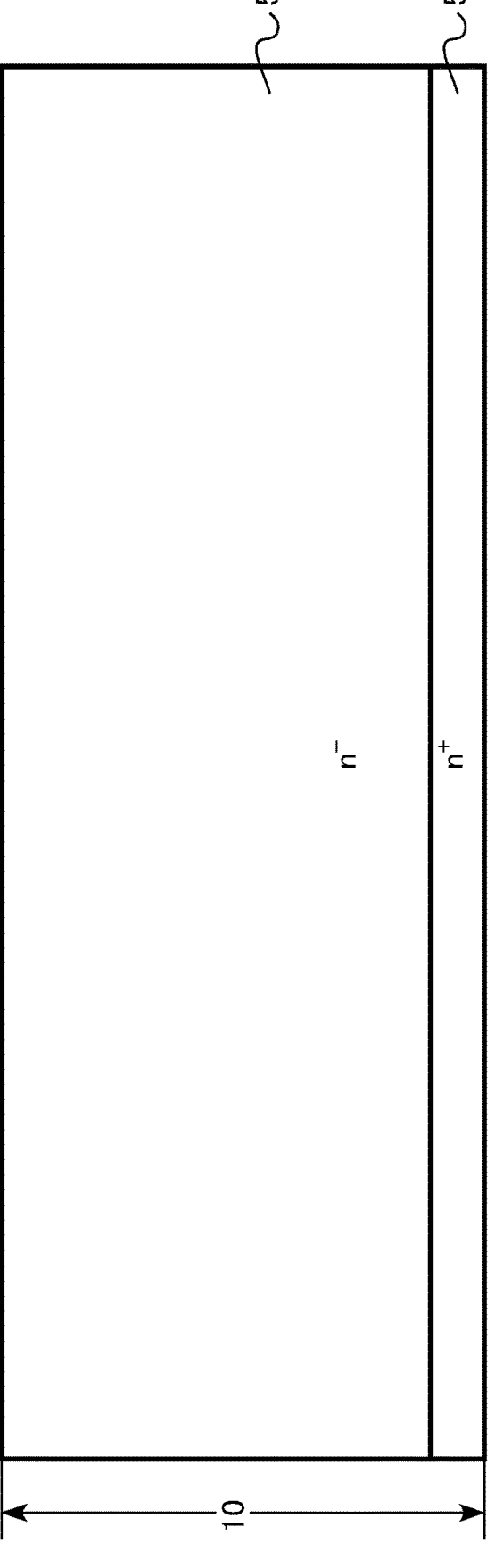
FIG. 18 is an explanatory diagram of the method for manufacturing a semiconductor device according to the second embodiment.

First, the silicon carbide layer 10 is prepared (FIG. 18). The silicon carbide layer 10 includes an n$^+$-type drain region 50 and an n$^-$-type drift region 52. The drift region 52 is formed on the drain region 50 by, for example, an epitaxial growth method.

Figure 19:
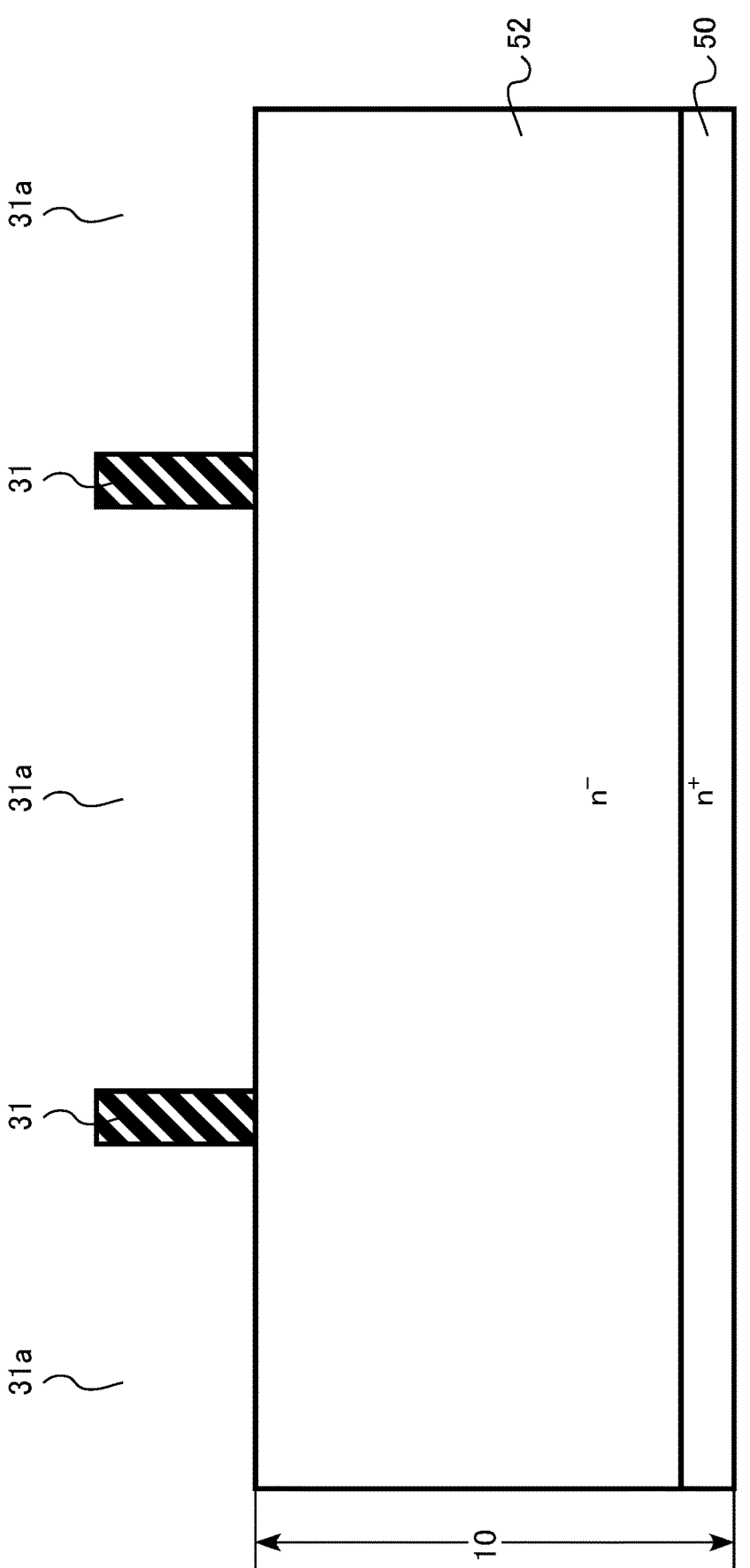
FIG. 19 is an explanatory diagram of the method for manufacturing a semiconductor device according to the second embodiment.

Next, the first mask material 31 having the first opening 31a is formed on the surface of the silicon carbide layer 10 (FIG. 19). The first mask material 31 is, for example, an insulator. The first mask material 31 is, for example, silicon oxide.

The first mask material 31 is formed by, for example, depositing an insulating film and patterning the insulating film by photolithography and etching.

Figure 20:
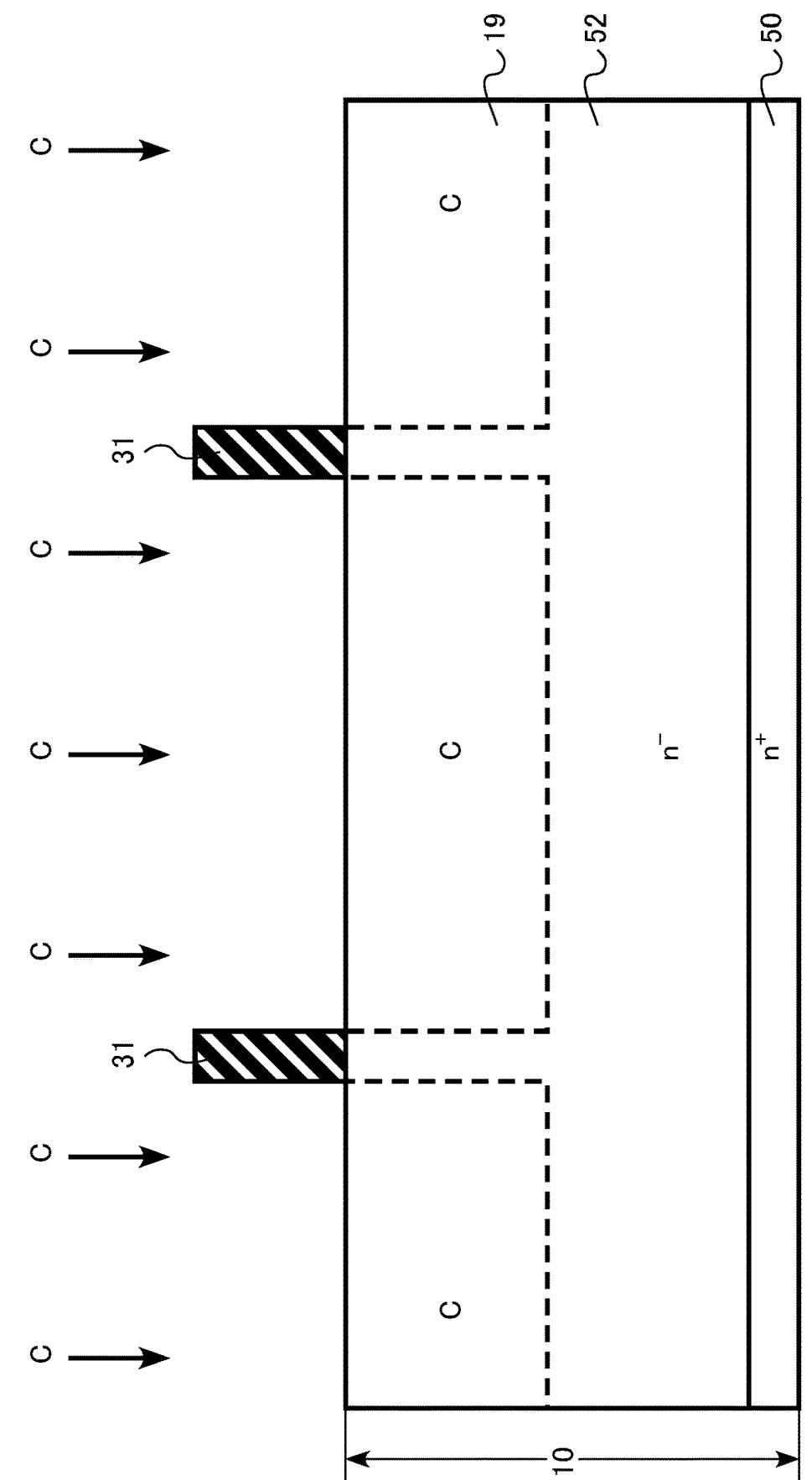
FIG. 20 is an explanatory diagram of the method for manufacturing a semiconductor device according to the second embodiment.

Next, the first ion implantation for implanting carbon (C) into the silicon carbide layer 10 is performed using the first mask material 31 as an ion implantation mask (FIG. 20). A carbon region 19 is formed by the first ion implantation.

The first ion implantation is performed, for example, at a temperature of 1000° C. or more and 1300° C. or less. The first ion implantation is performed, for example, in a state where the temperature of the silicon carbide layer 10 is 1000° C. or more and 1300° C. or less.

Figure 21:
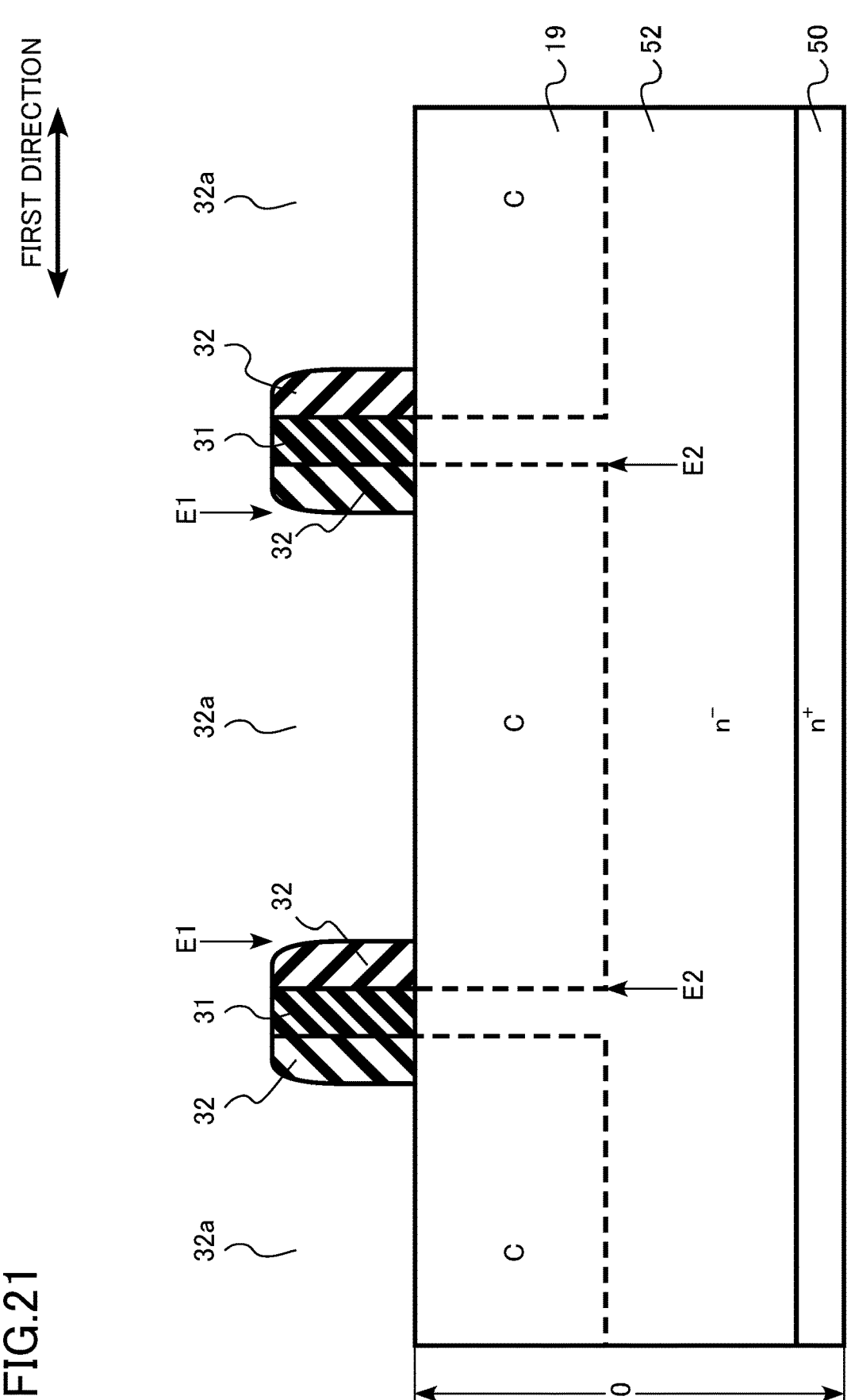
FIG. 21 is an explanatory diagram of the method for manufacturing a semiconductor device according to the second embodiment.

Next, the second mask material 32 having the second opening 32a is formed on the surface of the silicon carbide layer 10 (FIG. 21). The second mask material 32 is, for example, an insulator. The second mask material 32 is, for example, silicon oxide.

Both end portions (E1 in FIG. 21) of the second opening 32a in the first direction are disposed inside both end portions (E2 in FIG. 21) of the carbon region 19 in the first direction. A width of the second opening 32a in the first direction is smaller than a width of the carbon region 19 in the first direction. The first direction is a direction parallel to the surface of the silicon carbide layer 10.

As illustrated in FIG. 21, the second mask material 32 is formed by forming a sidewall material on the sidewall of the first opening 31a of the first mask material 31. The sidewall material can be formed by, for example, deposition of an insulating film serving as a sidewall material and anisotropic etching.

Figure 22:
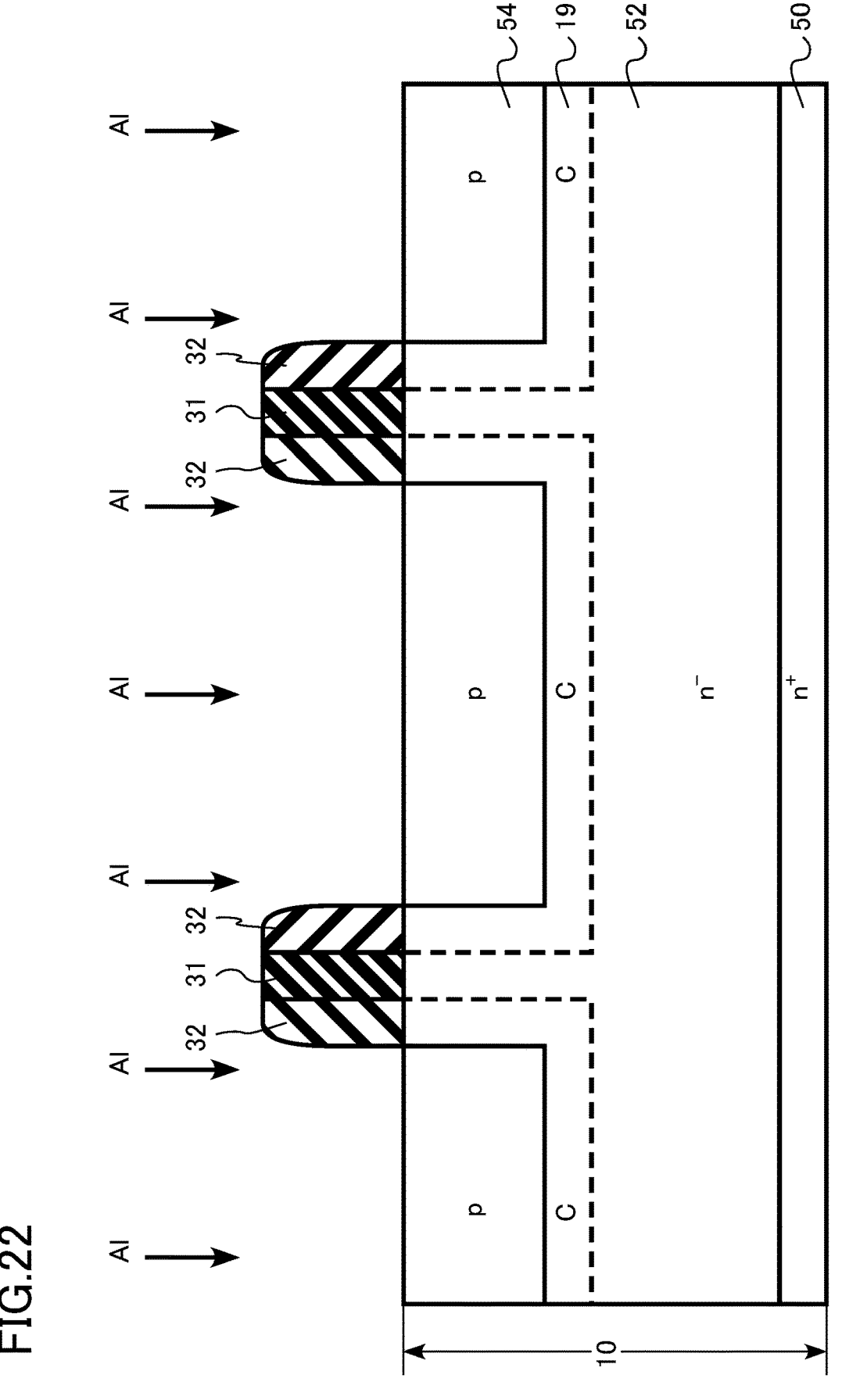
FIG. 22 is an explanatory diagram of the method for manufacturing a semiconductor device according to the second embodiment.

Next, the second ion implantation of implanting aluminum (Al) into the silicon carbide layer 10 is performed using the first mask material 31 and the second mask material 32 as ion implantation masks (FIG. 22). The well region 54 is formed by the second ion implantation. Aluminum (Al) implanted by the second ion implantation is an example of the first impurity. The well region 54 is an example of the first impurity region.

The second ion implantation is performed, for example, at a temperature of 1000° C. or more and 1300° C. or less. The second ion implantation is performed, for example, in a state where the temperature of the silicon carbide layer 10 is 1000° C. or higher and 1300° C. or lower.

Figure 23:
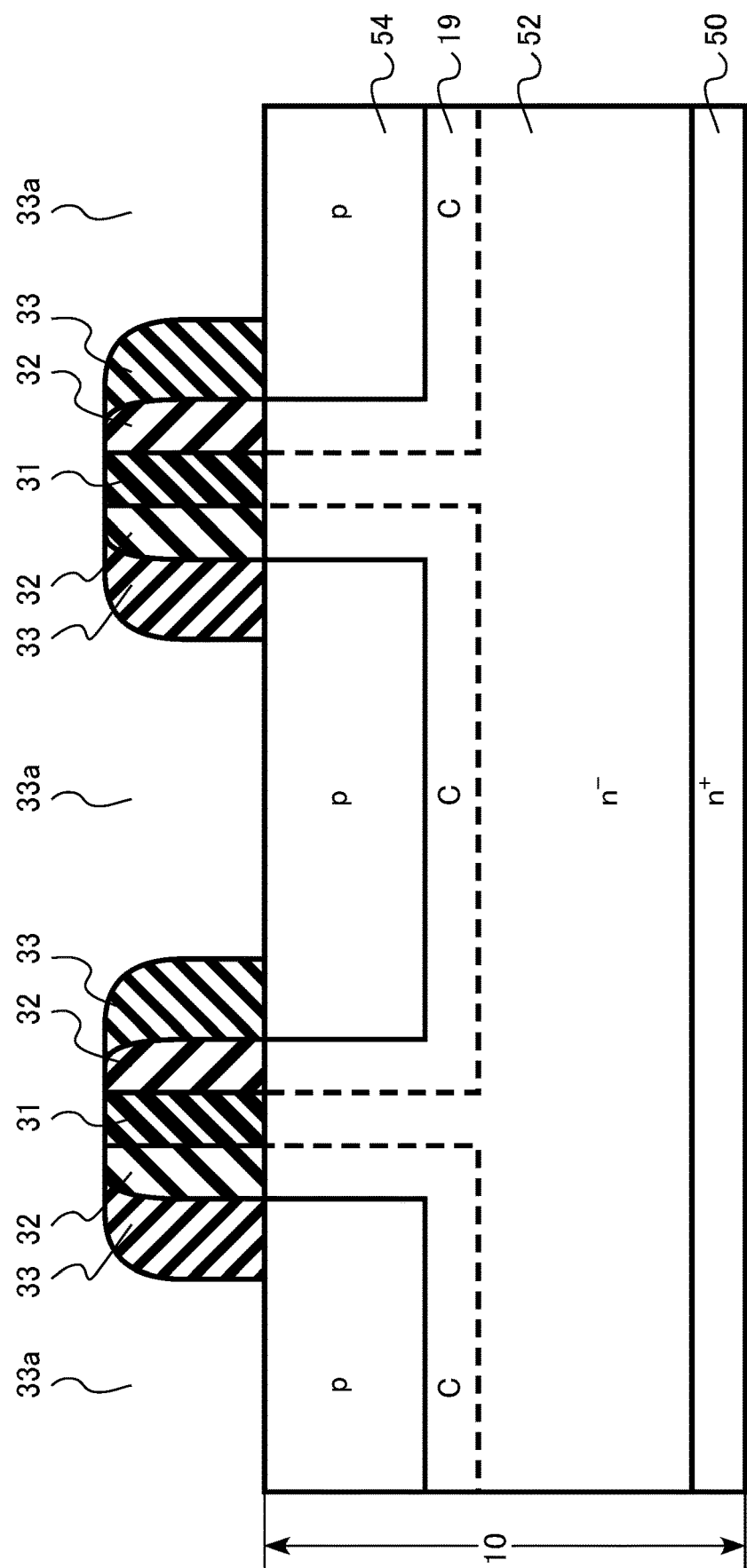
FIG. 23 is an explanatory diagram of the method for manufacturing a semiconductor device according to the second embodiment.

Next, a third mask material 33 having a third opening 33a is formed on the surface of the silicon carbide layer 10 (FIG. 23). The third mask material 33 is, for example, an insulator. The third mask material 33 is, for example, silicon oxide.

As illustrated in FIG. 23, the third mask material 33 is formed by forming a sidewall material on the sidewall of the second opening 32a of the second mask material 32. The sidewall material can be formed by, for example, deposition of an insulating film serving as a sidewall material and anisotropic etching.

Figure 24:
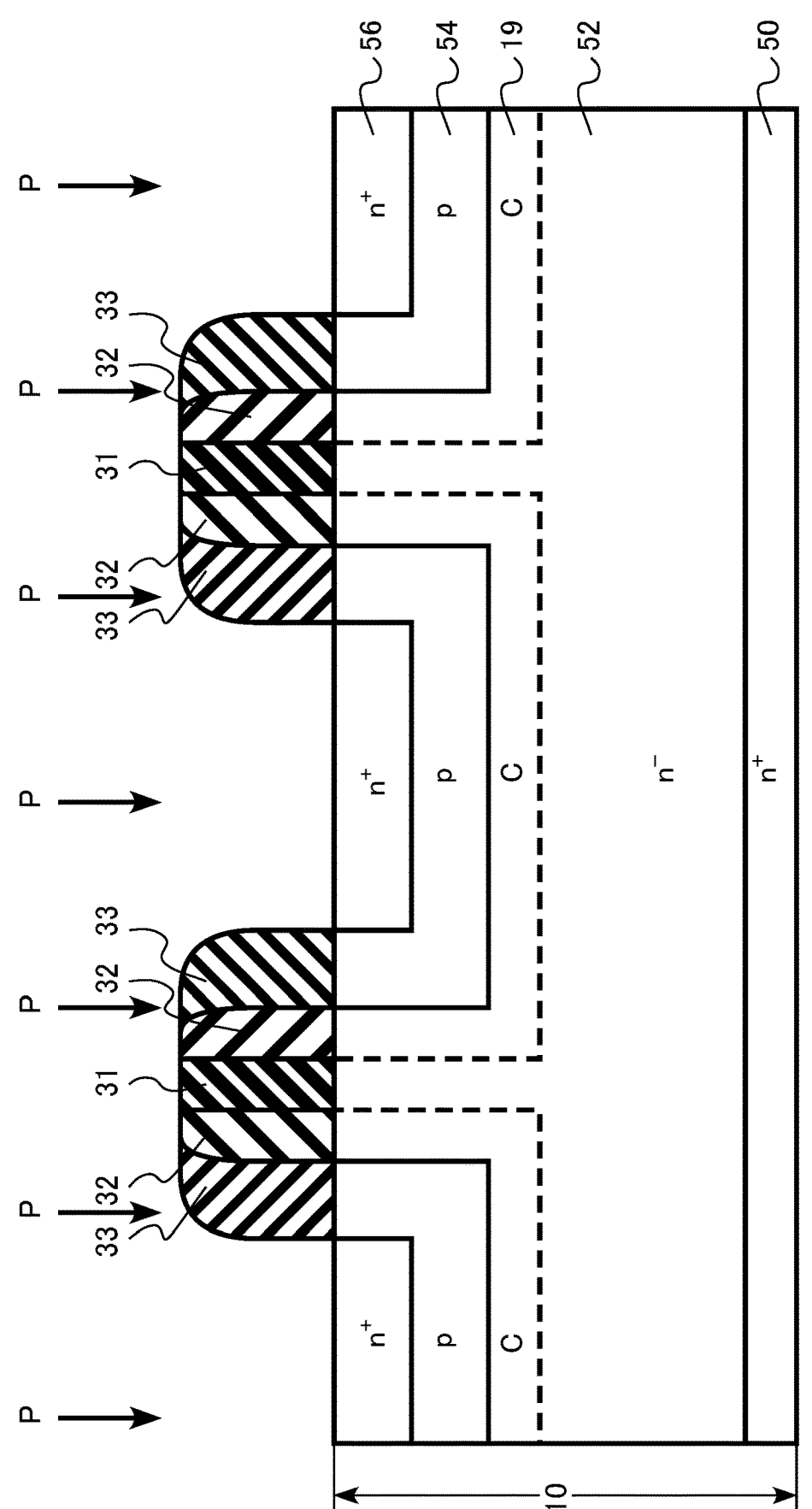
FIG. 24 is an explanatory diagram of the method for manufacturing a semiconductor device according to the second embodiment.

Next, the third ion implantation for implanting phosphorus (P) into the silicon carbide layer 10 is performed using the first mask material 31, the second mask material 32, and the third mask material 33 as ion implantation masks (FIG. 24). The source region 56 is formed by the third ion implantation. Phosphorus (P) implanted by the third ion implantation is an example of the first impurity. The source region 56 is an example of the first impurity region.

The third ion implantation is performed, for example, at a temperature of 1000° C. or more and 1300° C. or less. The third ion implantation is performed, for example, in a state where the temperature of the silicon carbide layer 10 is 1000° C. or higher and 1300° C. or lower.

Figure 25:
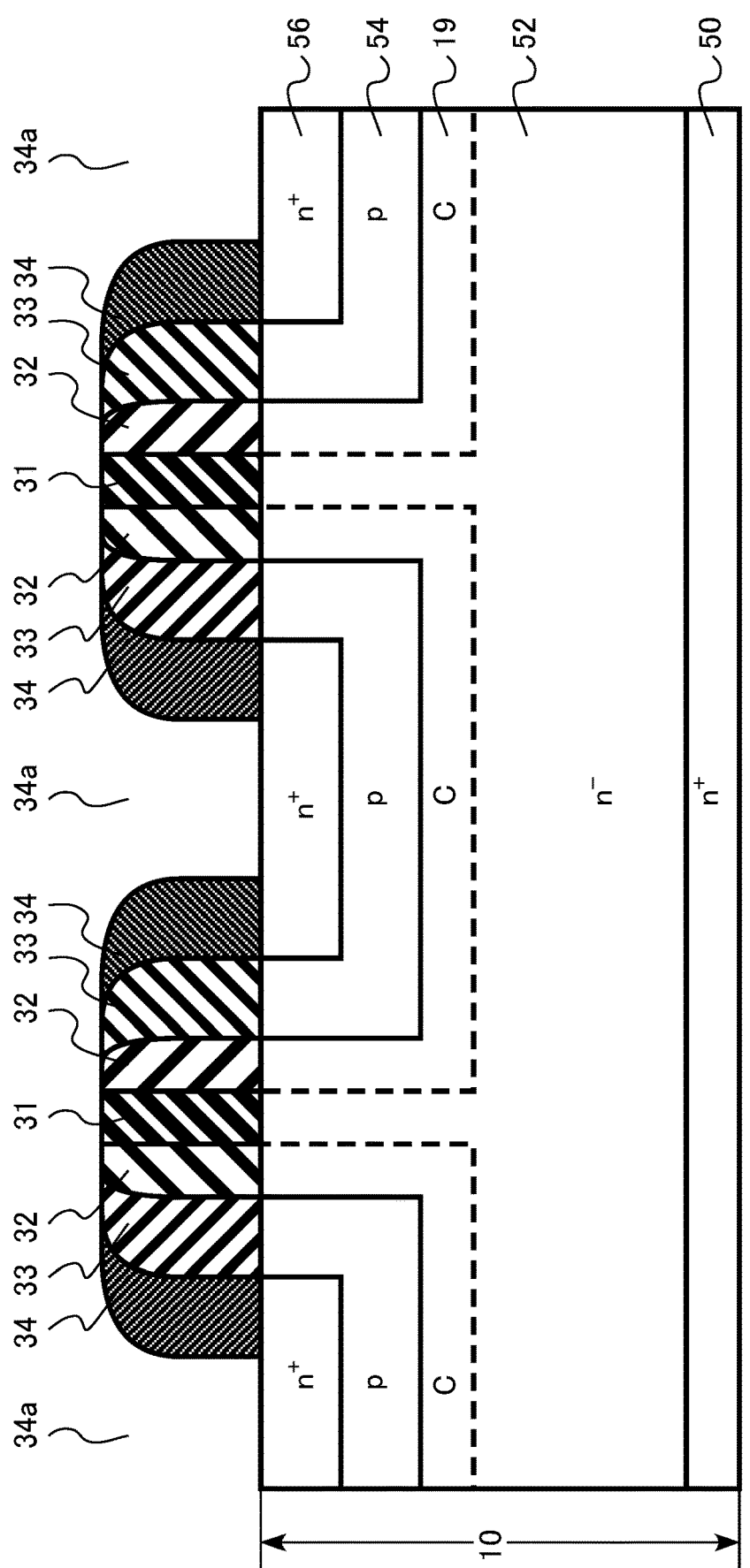
FIG. 25 is an explanatory diagram of the method for manufacturing a semiconductor device according to the second embodiment.

Next, a fourth mask material 34 having a fourth opening 34a is formed on the surface of the silicon carbide layer 10 (FIG. 25). The fourth mask material 34 is, for example, an insulator. The fourth mask material 34 is, for example, silicon oxide.

As illustrated in FIG. 25, the fourth mask material 34 is formed by forming a sidewall material on the sidewall of the third opening 33a of the third mask material 33. The sidewall material can be formed by, for example, deposition of an insulating film serving as a sidewall material and anisotropic etching.

Figure 26:
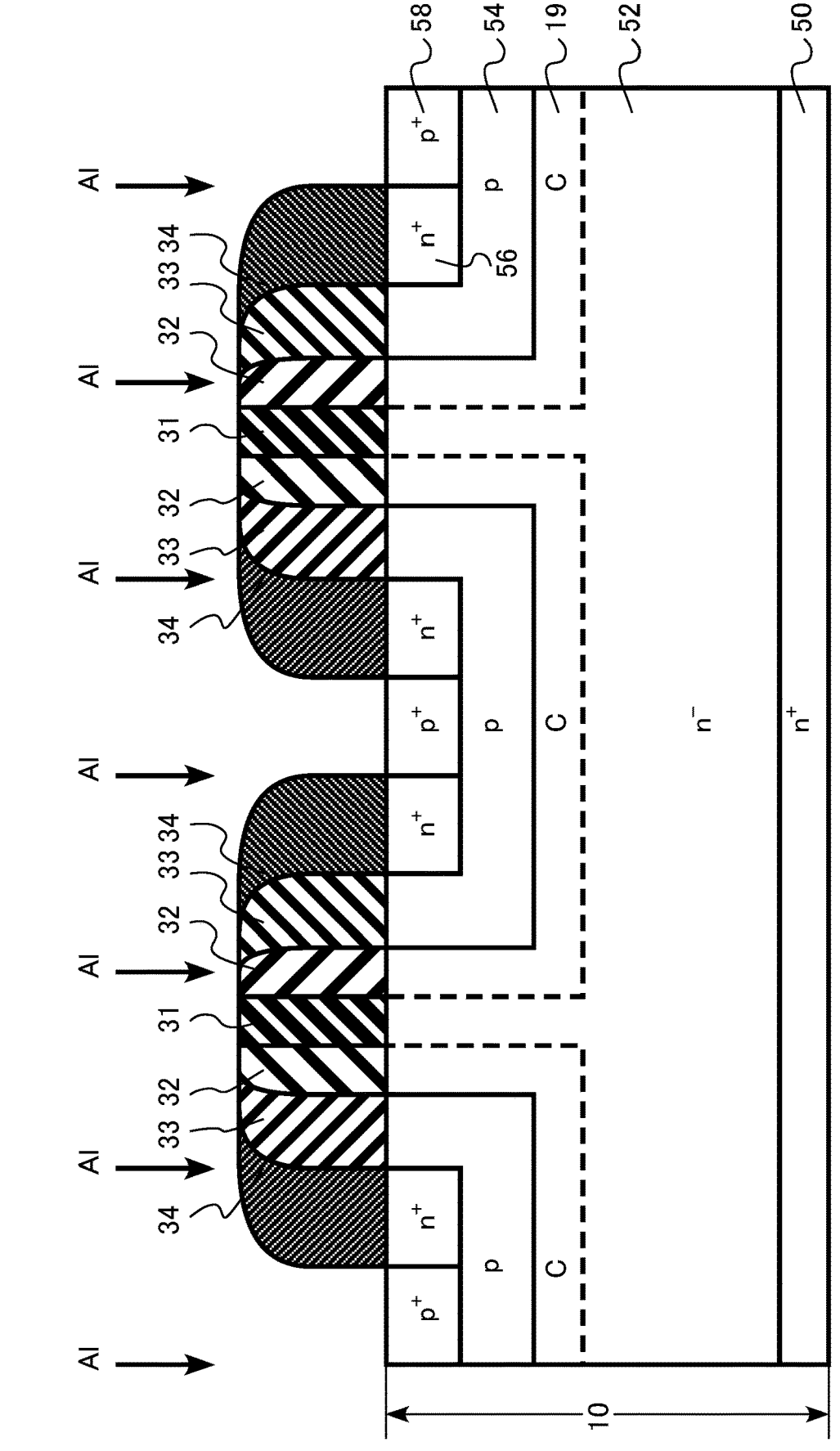
FIG. 26 is an explanatory diagram of the method for manufacturing a semiconductor device according to the second embodiment.

Next, the fourth ion implantation of implanting aluminum into the silicon carbide layer 10 is performed using the first mask material 31, the second mask material 32, the third mask material 33, and the fourth mask material 34 as ion implantation masks (FIG. 26). The well contact region 58 is formed by the fourth ion implantation. Aluminum implanted in the fourth ion implantation is an example of the first impurity. The well contact region 58 is an example of a first impurity region.

The fourth ion implantation is performed, for example, at a temperature of 1000° C. or more and 1300° C. or less. The fourth ion implantation is performed, for example, in a state where the temperature of the silicon carbide layer 10 is 1000° C. or higher and 1300° C. or lower.

Next, the first mask material 31, the second mask material 32, the third mask material 33, and the fourth mask material 34 are removed.

Figure 27:
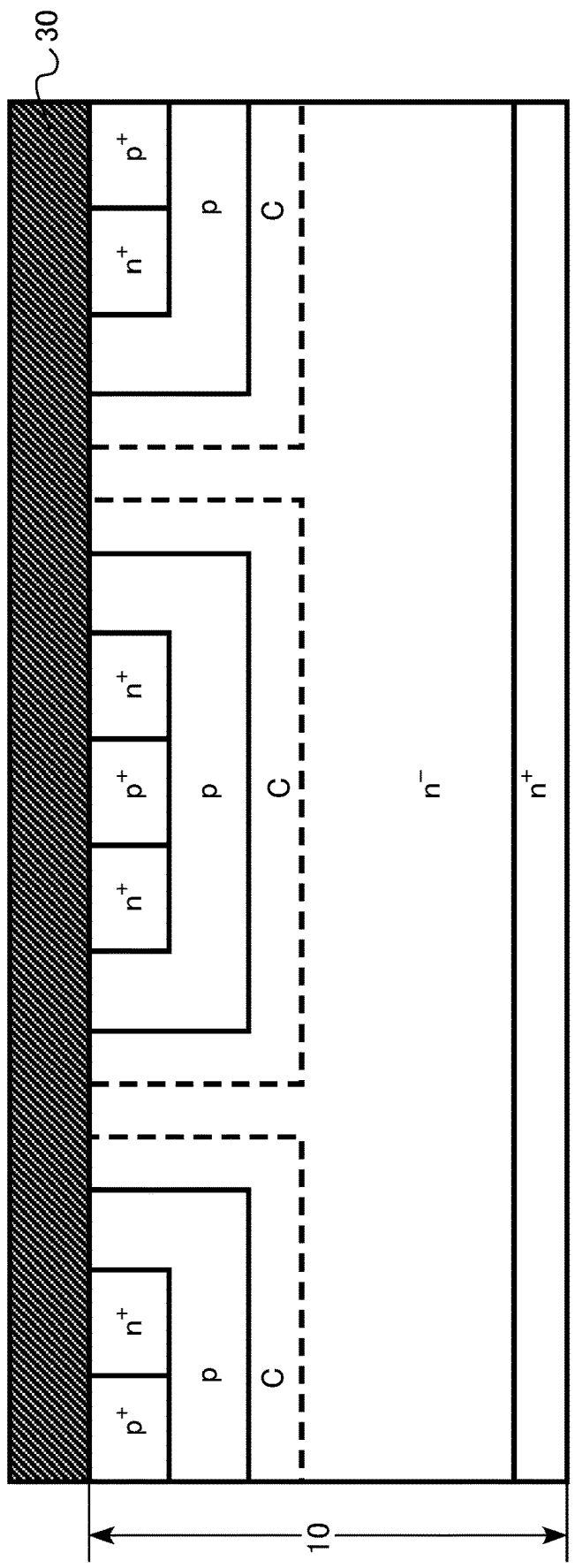
FIG. 27 is an explanatory diagram of the method for manufacturing a semiconductor device according to the second embodiment.

Next, the carbon film 30 is formed on the surface of the silicon carbide layer 10 (FIG. 27).

Next, heat treatment is performed. The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

The heat treatment activates aluminum and phosphorus ion-implanted into the silicon carbide layer 10. The heat treatment is activation annealing of aluminum and phosphorus. Further, interstitial carbon formed by carbon ion implantation into the silicon carbide layer 10 by heat treatment fills carbon vacancy in the silicon carbide layer 10.

Next, the carbon film 30 is removed. After that, the gate insulating layer 40, the gate electrode 42, the interlayer insulating film 44, and the source electrode 46 are formed on the surface of the silicon carbide layer 10 using a known process technique. In addition, the drain electrode 48 is formed on the back surface of the silicon carbide layer 10.

The MOSFET 200 illustrated in FIG. 17 is manufactured by the above manufacturing method.

In the method for manufacturing a semiconductor device according to the second embodiment, carbon (C) is introduced into a range wider than a range in which impurities are ion-implanted by ion implantation, similarly to the method for manufacturing a semiconductor device according to the first embodiment. By the above method, the density of carbon vacancies in the silicon carbide layer is reduced, and diffusion of impurities ion-implanted into silicon carbide due to heat treatment can be suppressed.

For example, in the MOSFET 200, when the diffusion of the n-type impurity in the source region 56 in the lateral direction (first direction) increases, the channel length (L in FIG. 17) of the MOSFET 200 decreases, and the threshold voltage of the MOSFET 200 decreases. Therefore, it is difficult to realize scaling-down of the MOSFET 200.

According to the method for manufacturing a semiconductor device of the second embodiment, diffusion of n-type impurities in the source region 56 in the lateral direction (first direction) is suppressed. Therefore, it is possible to prevent the channel length L of the MOSFET 200 from being shortened. Therefore, the scaling-down of the MOSFET 200 can be realized.

In addition, in the MOSFET 200, as the diffusion of the p-type impurity in the well region 54 in the lateral direction (first direction) increases, the variation in the channel length L of the MOSFET 200 increases. When the variation in the channel length L increases, a variation in the threshold voltage of the MOSFET 200 increases.

According to the method for manufacturing a semiconductor device of the second embodiment, diffusion of p-type impurities in the well region 54 in the lateral direction (first direction) is suppressed. Therefore, variations in the channel length L of the MOSFET 200 can be suppressed. Therefore, the variation in the threshold voltage of the MOSFET 200 is suppressed.

(Modification)

Figure 28:
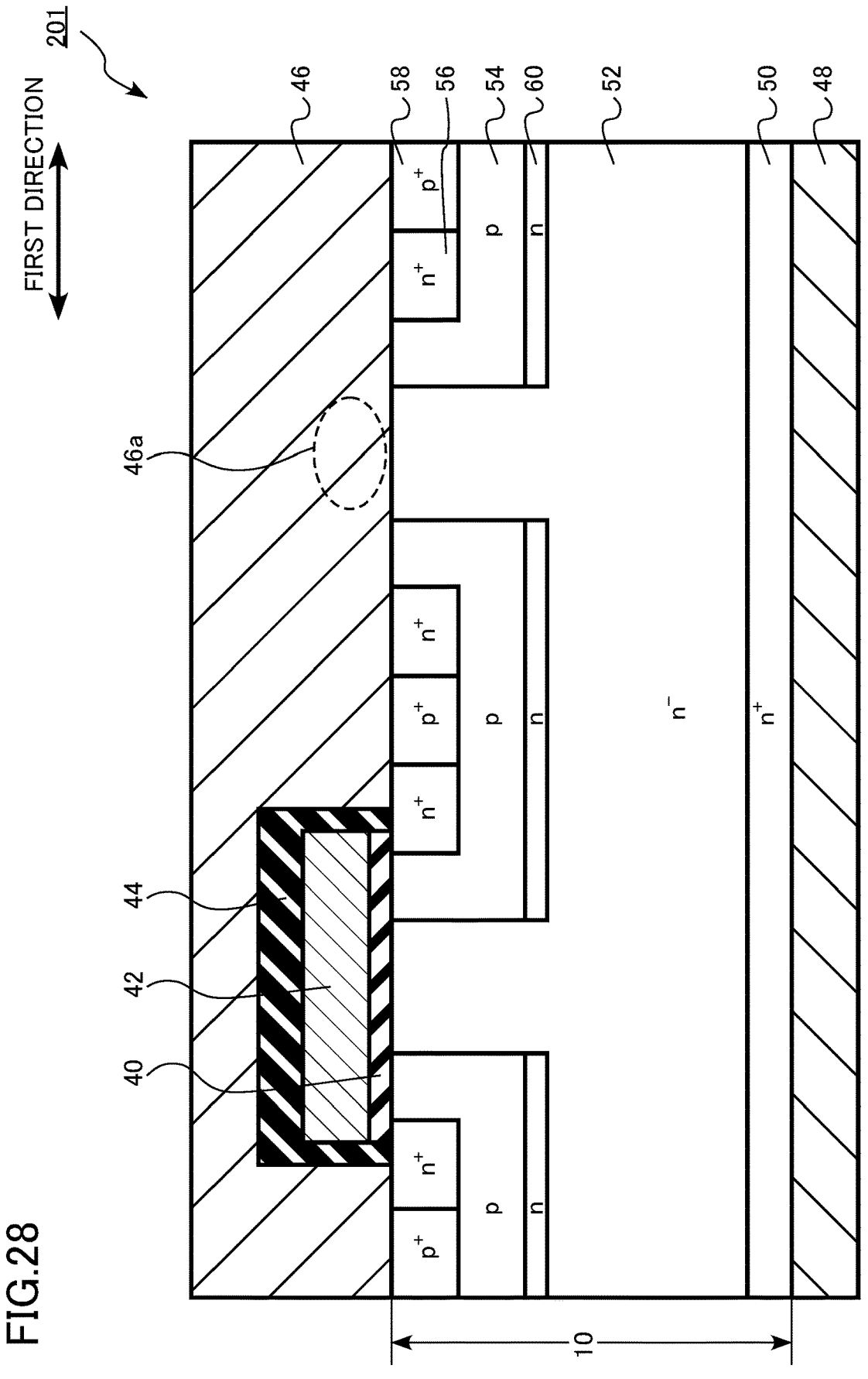
FIG. 28 is a schematic cross-sectional view of a semiconductor device manufactured by a method for manufacturing a semiconductor device according to a modification of the second embodiment.

FIG. 28 is a schematic cross-sectional view of a semiconductor device manufactured by a method for manufacturing a semiconductor device according to a modification of the second embodiment.

A semiconductor device according to the modification of the second embodiment is a MOSFET 201. The MOSFET 201 is different from the MOSFET 200 of the second embodiment in that a Schottky barrier diode (SBD) is incorporated. The MOSFET 201 is different from the MOSFET 200 of the second embodiment in that the silicon carbide layer 10 includes an n-type carrier diffusion region 60.

The source electrode 46 of the MOSFET 201 includes a first portion 46a. The first portion 46a is in contact with the drift region 52. A Schottky contact is formed between the first portion 46a and the drift region 52.

The first portion 46a of the source electrode 46, the drift region 52, the drain region 50, and the drain electrode 48 constitute an SBD incorporated in the MOSFET 201. In addition, the source electrode 46, the well contact region 58, the well region 54, the drift region 52, the drain region 50, and the drain electrode 48 constitute a pn junction diode incorporated in the MOSFET 201.

For example, a case where the MOSFET 201 is used as a switching element connected to an inductive load will be considered. When the MOSFET 201 is turned off, a voltage that is positive with respect to the drain electrode 48 may be applied to the source electrode 46 due to an induced current caused by an inductive load. In this case, a forward current flows through the built-in diode. This state is also referred to as a reverse conduction state.

When the MOSFET 201 does not include the SBD, a forward current flows through the pn junction diode. The pn junction diode performs a bipolar operation. When a reflux current is caused to flow using a pn junction diode that performs a bipolar operation, a stacking fault grows in the silicon carbide layer due to recombination energy of carriers. When the stacking fault grows in the silicon carbide layer, there arises a problem that the on-resistance of the MOSFET 201 increases. An increase in the on-resistance of the MOSFET 201 leads to a decrease in the reliability of the MOSFET 201.

The MOSFET 201 includes an SBD. A forward voltage (Vf) at which the forward current starts flowing through the SBD is lower than a forward voltage (Vf) of the pn junction diode. Therefore, a forward current flows through the SBD prior to the pn junction diode.

The SBD performs unipolar operation. Therefore, even when a forward current flows, the stacking fault does not grow in the silicon carbide layer 10 due to the recombination energy of the carrier. Therefore, an increase in the on-resistance of the MOSFET 201 is suppressed. Therefore, the reliability of the MOSFET 201 is improved.

The silicon carbide layer 10 of the MOSFET 201 includes an n-type carrier diffusion region 60. The carrier diffusion region 60 is provided between the drift region 52 and the well region 54. The carrier diffusion region 60 is provided at the bottom of the well region 54.

The carrier diffusion region 60 contains, for example, nitrogen (N) as an n-type impurity. The n-type impurity concentration of the carrier diffusion region 60 is, for example, $5 \times 10^{16}$ cm$^{-3}$ or more and $1 \times 10^{18}$ cm$^{-3}$ or less.

By providing the carrier diffusion region 60 at the bottom of the well region 54, carriers are laterally diffused at the bottom of the well region 54. Since the carriers are diffused in the lateral direction at the bottom of the well region 54, when the MOSFET 201 is in the reverse conduction state, it is difficult for the built-in pn junction diode to perform the on-operation. This is because the carriers are laterally diffused at the bottom of the well region 54, so that the voltage applied between the built-in pn junction diodes is reduced, and the forward voltage (Vf) of the pn junction diodes is hardly exceeded. Since the on-operation of the pn junction diode built in the MOSFET 201 is suppressed, an increase in the on-resistance of the MOSFET is suppressed.

The method for manufacturing a semiconductor device according to a modification of the second embodiment is different from the method for manufacturing a semiconductor device according to the second embodiment in that after the second ion implantation of implanting aluminum (Al) into the silicon carbide layer 10 is performed using the first mask material 31 and the second mask material 32 as ion implantation masks, nitrogen (N) is implanted into the silicon carbide layer 10 using the first mask material 31 and the second mask material 32 as ion implantation masks.

Figure 29:
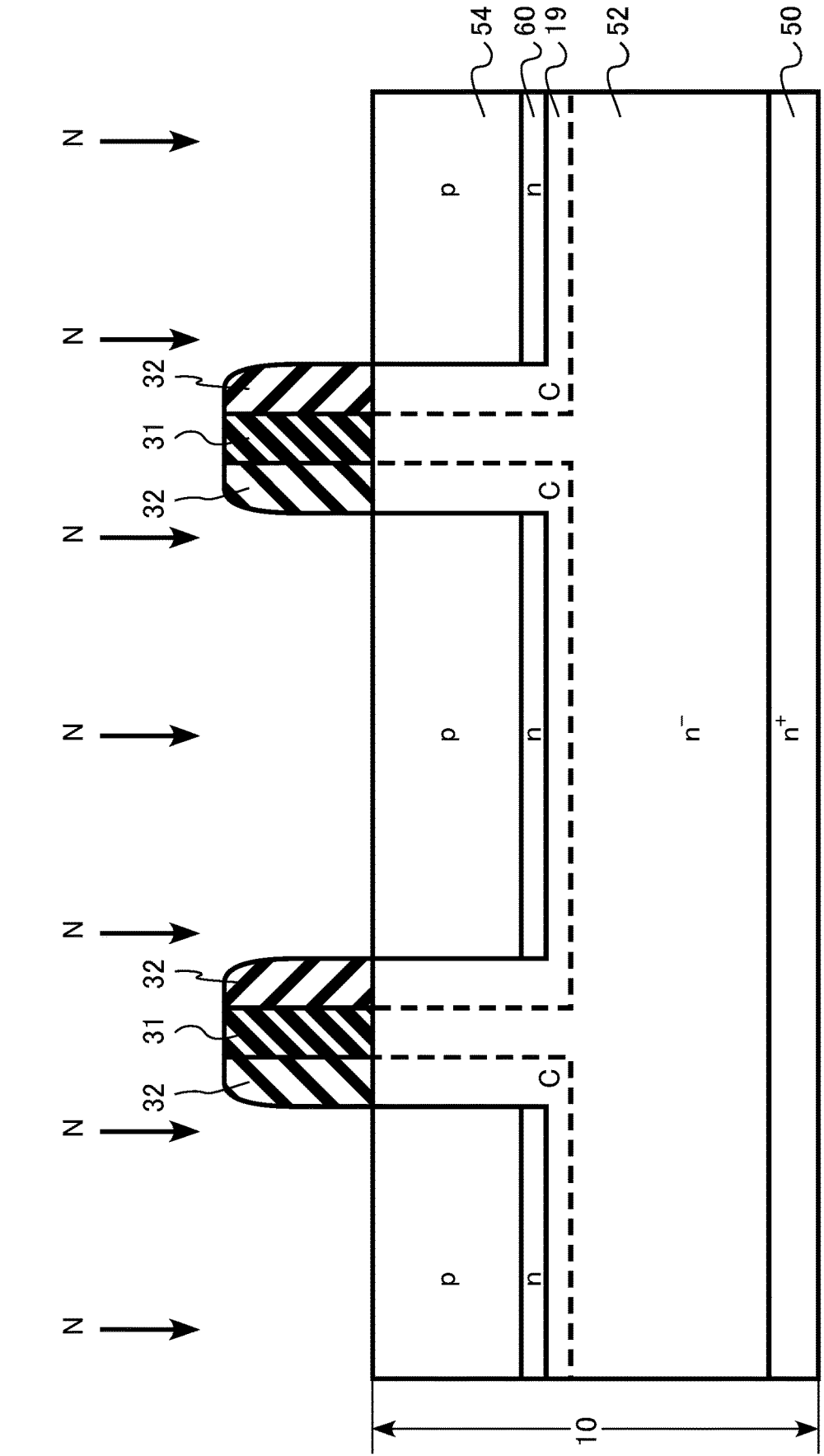
FIG. 29 is an explanatory diagram of the method for manufacturing a semiconductor device according to a modification of the second embodiment.

FIG. 29 is an explanatory diagram of a method for manufacturing a semiconductor device according to a modification of the second embodiment. FIG. 29 is a cross-sectional view in the middle of manufacturing. After the second ion implantation of implanting aluminum (Al) into the silicon carbide layer 10 is performed using the first mask material 31 and the second mask material 32 as ion implantation masks (after FIG. 22 of the second embodiment), nitrogen (N) is implanted into the silicon carbide layer 10 using the first mask material 31 and the second mask material 32 as ion implantation masks (FIG. 29). The carrier diffusion region 60 is formed by ion implantation of nitrogen (N).

The ion implantation of nitrogen is performed, for example, at a temperature of 1000° C. or more and 1300° C. or less. The ion implantation of nitrogen is performed, for example, in a state where the temperature of the silicon carbide layer 10 is 1000° C. or higher and 1300° C. or lower.

After that, similarly to the second embodiment, a third mask material 33 having a third opening 33a is formed on the surface of the silicon carbide layer 10 (FIG. 23 of the second embodiment). The subsequent steps are similar to those of the second embodiment except that, for example, the pattern of the gate electrode 42 is changed.

In the method for manufacturing a semiconductor device according to the modification of the second embodiment, the carbon region 19 is formed in a region where diffusion of impurities in the vertical direction is scheduled before the heat treatment for diffusing the impurities. Therefore, diffusion of impurities in the longitudinal direction is effectively suppressed. Specifically, the diffusion of nitrogen (N) forming the carrier diffusion region 60 in the longitudinal direction is effectively suppressed.

Therefore, the depth of the carrier diffusion region 60 becomes shallow, and the electrical resistance of the carrier diffusion region 60 becomes small. Therefore, when a forward current flows through the built-in SBD diode, lateral diffusion of carriers is promoted at the bottom of the well region 54. Therefore, the on-operation of the pn junction diode built in the MOSFET 201 is further suppressed, and the increase in the on-resistance of the MOSFET 201 is suppressed.

As described above, according to the method for manufacturing a semiconductor device of the second embodiment and the modification, diffusion of impurities due to heat treatment can be suppressed by ion implantation of carbon.

Third Embodiment

A method for manufacturing a semiconductor device of a third embodiment is different from the method for manufacturing a semiconductor device of the second embodiment in that a MOSFET having a trench gate structure in which a gate electrode is provided in a trench is manufactured. Hereinafter, description of contents overlapping with the first embodiment or the second embodiment may be partially omitted.

Figure 30:
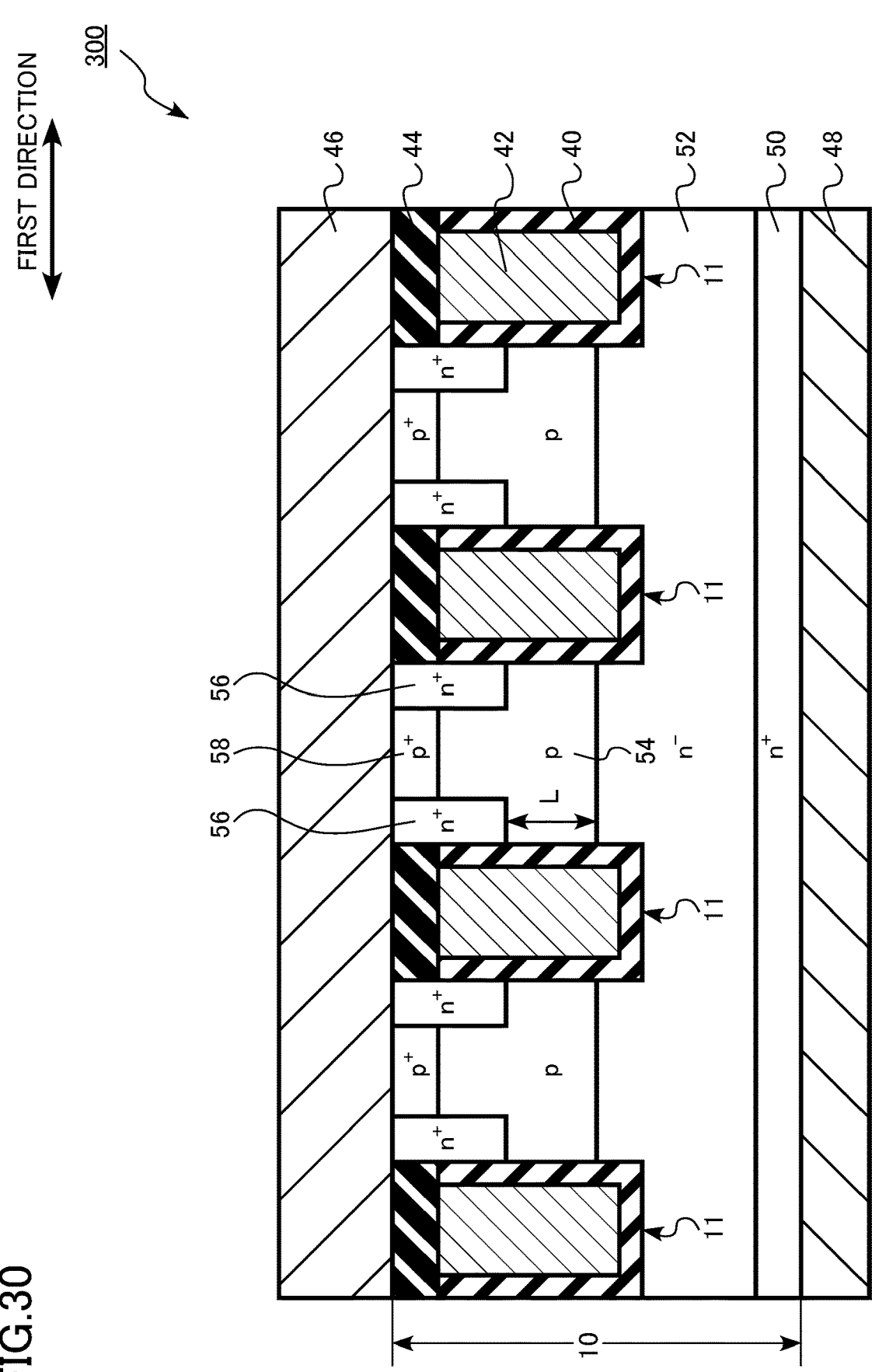
FIG. 30 is a schematic cross-sectional view of a semiconductor device manufactured by a method for manufacturing a semiconductor device according to a third embodiment.

FIG. 30 is a schematic cross-sectional view of a semiconductor device manufactured by the method for manufacturing a semiconductor device according to the third embodiment. The semiconductor device of the third embodiment is a MOSFET 300. The MOSFET 300 has a trench gate structure in which a gate electrode is provided in a trench.

The MOSFET 300 includes a silicon carbide layer 10, a gate insulating layer 40, a gate electrode 42, an interlayer insulating film 44, a source electrode 46, and a drain electrode 48.

The silicon carbide layer 10 includes a trench 11, an $n^+$-type drain region 50, an $n^-$-type drift region 52, a p-type well region 54, an $n^+$-type source region 56, and a $p^+$-type well contact region 58.

The silicon carbide layer 10 is, for example, a single crystal of 4H-SiC. The silicon carbide layer 10 is disposed between the source electrode 46 and the drain electrode 48.

The silicon carbide layer 10 is single crystal SiC. The silicon carbide layer 10 is, for example, 4H-SiC.

The trench 11 is provided on the source electrode 46 side of the silicon carbide layer 10. The trench 11 is a groove provided on the surface of the silicon carbide layer 10.

The $n^+$-type drain region 50 is provided on the back surface side of the silicon carbide layer 10. The drain region 50 contains, for example, nitrogen (N) as n-type impurities. The n-type impurity concentration of the drain region 50 is, for example, $1\times10^{18}$ cm$^{-3}$ or more and $1\times10^{20}$ cm$^{-3}$ or less.

The $n^-$-type drift region 52 is provided on the drain region 50. The drift region 52 functions as a path of an on-current of the MOSFET 300.

The drift region 52 contains, for example, nitrogen (N) as an n-type impurity. The n-type impurity concentration of the drift region 52 is, for example, $1\times10^{15}$ cm$^{-3}$ or more and $1\times10^{16}$ cm$^{-3}$ or less.

The thickness of the drift region 52 is, for example, 5 μm or more and 100 μm or less.

The p-type well region 54 is provided on the drift region 52. The well region 54 is in contact with the side surface of the trench 11. The well region 54 on the side surface of the trench 11 functions as a channel region of the MOSFET 300.

The well region 54 contains, for example, aluminum (Al) as a p-type impurity. The p-type impurity concentration of the well region 54 is, for example, $1\times10^{16}$ cm$^{-3}$ or more and $1\times10^{20}$ cm$^{-3}$ or less.

The $n^+$-type source region 56 is provided on the well region 54. The source region 56 is in contact with the side surface of the trench 11. The source region 56 contains, for example, phosphorus (P) as n-type impurities. The n-type impurity concentration of the source region 56 is, for example, $1\times10^{18}$ cm$^{-3}$ or more and $1\times10^{22}$ cm$^{-3}$ or less.

The $p^+$-type well contact region 58 is provided on the well region 54. The well contact region 58 is provided on the side of the source region 56. The well contact region 58 is sandwiched between the two source regions 56.

The well contact region 58 contains, for example, aluminum as a p-type impurity. The p-type impurity concentration of the well contact region 58 is, for example, $1\times10^{18}$ cm$^{-3}$ or more and $1\times10^{22}$ cm$^{-3}$ or less.

The gate insulating layer 40 is provided between the silicon carbide layer 10 and the gate electrode 42. The gate insulating layer 40 is provided in the trench 11. The gate insulating layer 40 contains, for example, silicon oxide.

The gate electrode 42 is provided on the gate insulating layer 40. The gate electrode 42 is provided in the trench 11. The gate electrode 42 is, for example, polycrystalline silicon containing n-type impurities or p-type impurities.

The interlayer insulating film 44 is formed on the gate electrode 42. The interlayer insulating film 44 is disposed between the gate electrode 42 and the source electrode 46. The interlayer insulating film 44 is, for example, a silicon oxide film.

The source electrode 46 is provided on the front surface side of the silicon carbide layer 10. The source electrode 46 is electrically connected to the source region 56 and the well contact region 58. The source electrode 46 is in contact with, for example, the source region 56 and the well contact region 58.

The drain electrode 48 is provided on the side of the silicon carbide layer 10 opposite to the source electrode 46, that is, on the back surface side. The drain electrode 48 is electrically connected to the drain region 50. The drain electrode 48 is in contact with, for example, the drain region 50.

Next, an example of the method for manufacturing a semiconductor device according to the third embodiment will be described.

FIGS. 31, 32, 33, 34, 35, 36, 37, 38, and 39 are explanatory diagrams of the method for manufacturing a semiconductor device according to the third embodiment. FIGS. 31 to 39 are cross-sectional views in the middle of manufacturing.

Figure 31:
FIG. 31 is an explanatory diagram of the method for manufacturing a semiconductor device according to the third embodiment.
Figure 31:
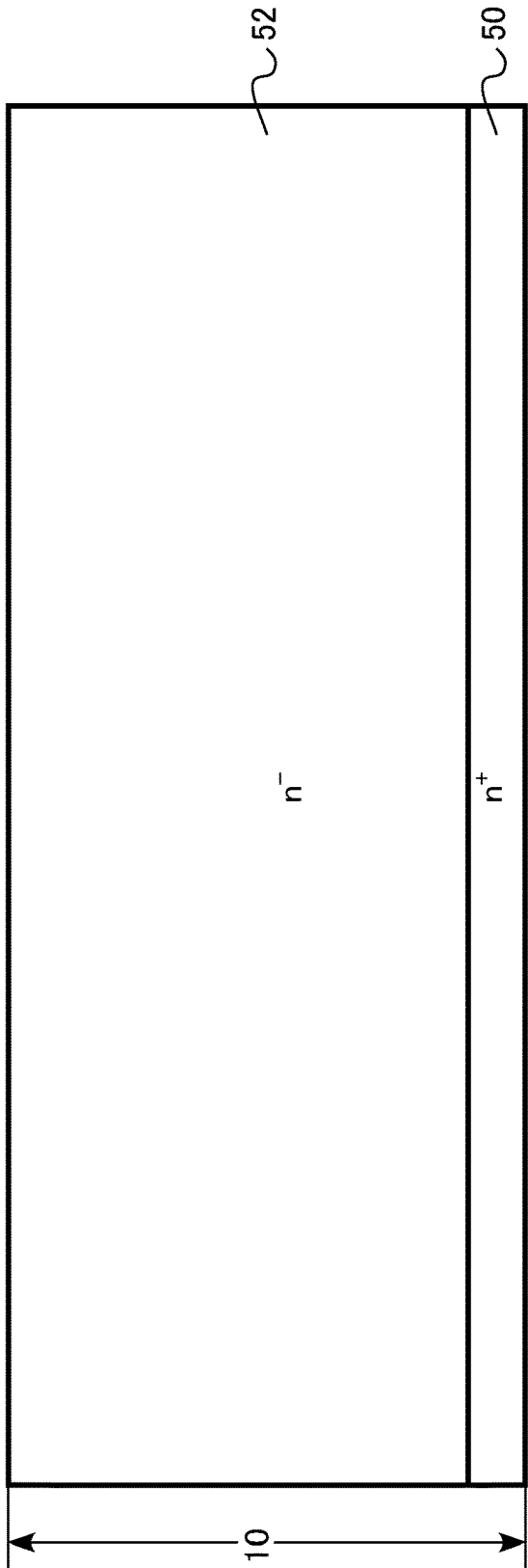

First, a silicon carbide layer 10 is prepared (FIG. 31). The silicon carbide layer 10 includes an n$^+$-type drain region 50 and an n$^-$-type drift region 52. The drift region 52 is formed on the drain region 50 by, for example, an epitaxial growth method.

Figure 32:
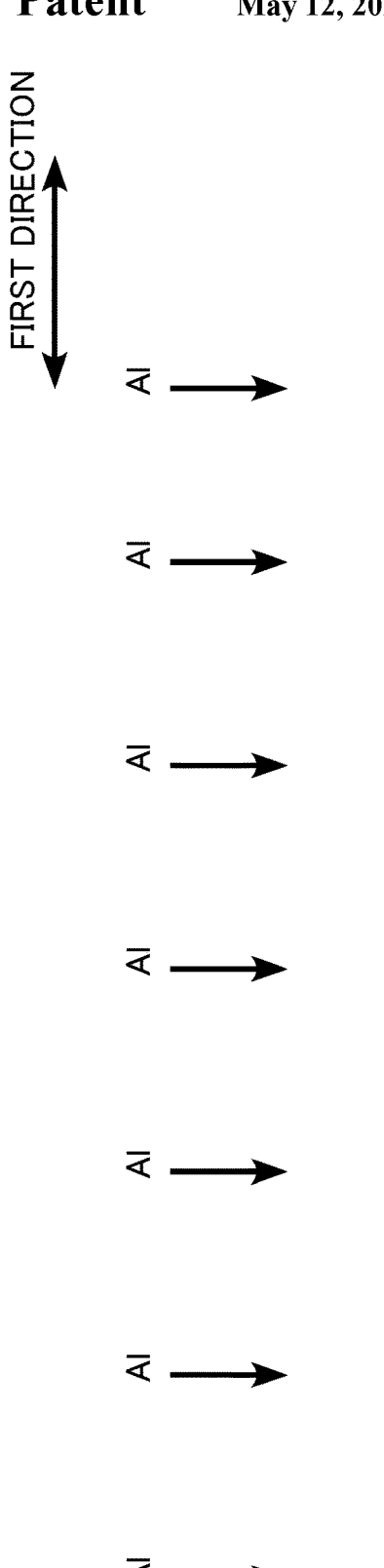
FIG. 32 is an explanatory diagram of the method for manufacturing a semiconductor device according to the third embodiment.
Figure 32:
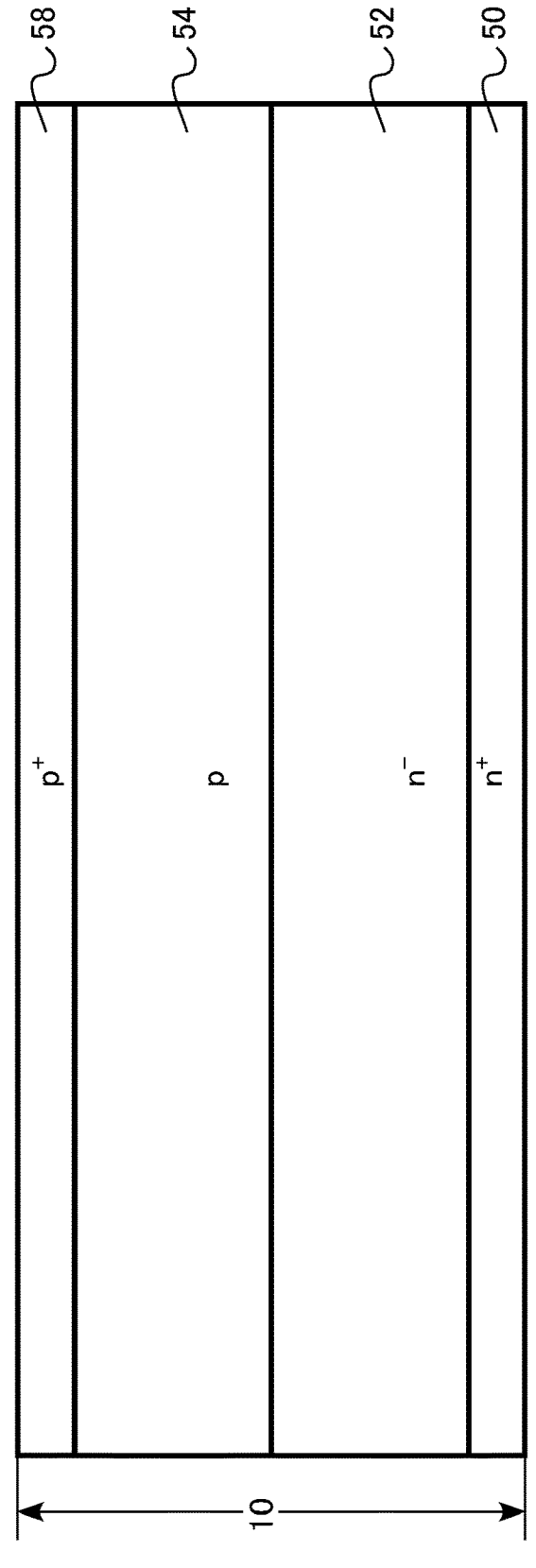

Next, the well region 54 and the well contact region 58 are formed in the silicon carbide layer 10 (FIG. 32). The well region 54 and the well contact region 58 are formed by ion-implanting aluminum (Al) from the surface of the silicon carbide layer 10. Ion implantation of aluminum (Al) is performed using, for example, a mask material (not illustrated) as a mask.

Figure 33:
FIG. 33 is an explanatory diagram of the method for manufacturing a semiconductor device according to the third embodiment.

Next, the first mask material 31 having the first opening 31$a$ is formed on the surface of the silicon carbide layer 10 (FIG. 33). The first mask material 31 is, for example, an insulator. The first mask material 31 is, for example, silicon oxide.

The first mask material 31 is formed by, for example, depositing an insulating film and patterning the insulating film by photolithography and etching.

Figure 34:
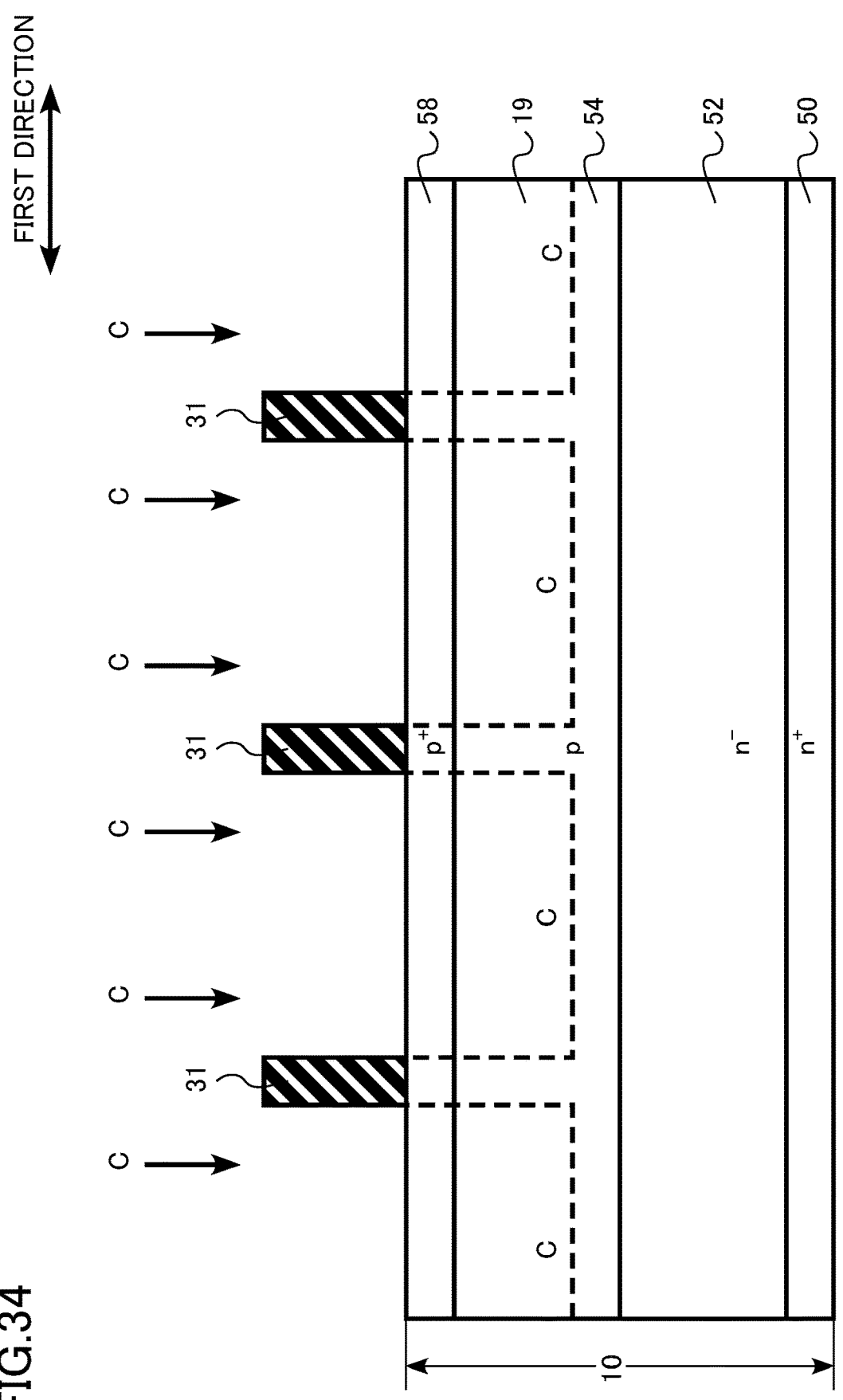
FIG. 34 is an explanatory diagram of the method for manufacturing a semiconductor device according to the third embodiment.

Next, the first ion implantation for implanting carbon (C) into the silicon carbide layer 10 is performed using the first mask material 31 as an ion implantation mask (FIG. 34). A carbon region 19 is formed by the first ion implantation. The carbon region 19 is an example of the first carbon region.

The first ion implantation is performed, for example, at a temperature of 1000° C. or more and 1300° C. or less. The first ion implantation is performed, for example, in a state where the temperature of the silicon carbide layer 10 is 1000° C. or more and 1300° C. or less.

Figure 35:
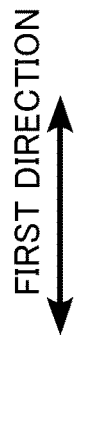
FIG. 35 is an explanatory diagram of the method for manufacturing a semiconductor device according to the third embodiment.

Next, a second mask material 32 having a second opening 32$a$ is formed on the surface of the silicon carbide layer 10 (FIG. 35). The second mask material 32 is, for example, an insulator. The second mask material 32 is, for example, silicon oxide.

Both end portions (E1 in FIG. 35) of the second opening 32$a$ in the first direction are disposed inside both end portions (E2 in FIG. 35) of the carbon region 19 in the first direction. A width of the second opening 32$a$ in the first direction is smaller than a width of the carbon region 19 in the first direction. The first direction is a direction parallel to the surface of the silicon carbide layer 10.

As illustrated in FIG. 35, the second mask material 32 is formed by forming a sidewall material on the sidewall of the first opening 31$a$ of the first mask material 31. The sidewall material can be formed by, for example, deposition of an insulating film serving as a sidewall material and anisotropic etching. The sidewall material formed on the sidewall of the first opening 31$a$ of the first mask material 31 is an example of the first sidewall material.

Figure 36:
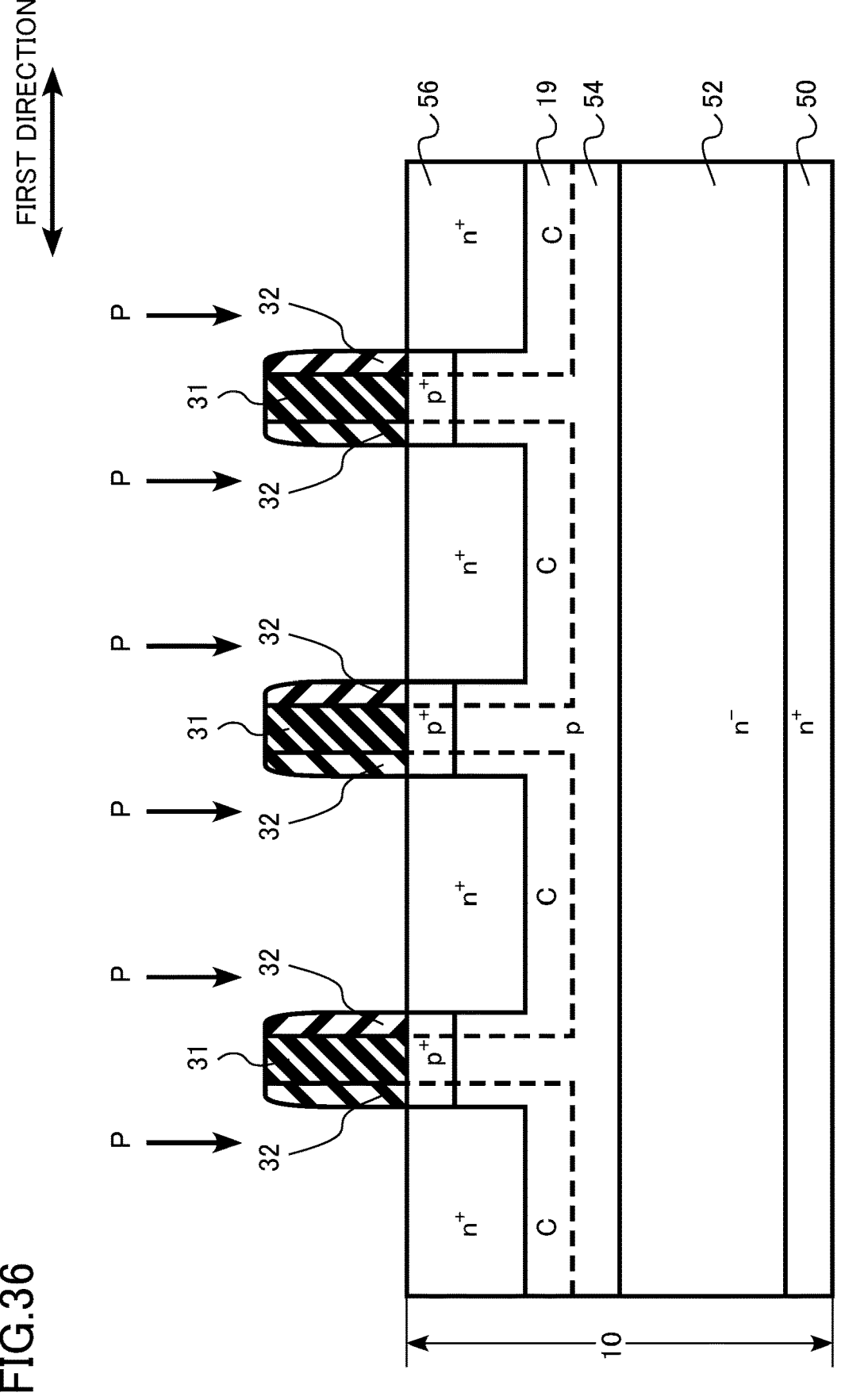
FIG. 36 is an explanatory diagram of the method for manufacturing a semiconductor device according to the third embodiment.

Next, the second ion implantation for implanting phosphorus (P) into the silicon carbide layer 10 is performed using the first mask material 31 and the second mask material 32 as ion implantation masks (FIG. 36). The source region 56 is formed by the second ion implantation. Phosphorus (P) implanted by the second ion implantation is an example of the first impurity. The source region 56 is an example of the first impurity region.

The second ion implantation is performed, for example, at a temperature of 1000° C. or more and 1300° C. or less. The second ion implantation is performed, for example, in a state where the temperature of the silicon carbide layer 10 is 1000° C. or higher and 1300° C. or lower.

Figure 37:
FIG. 37 is an explanatory diagram of the method for manufacturing a semiconductor device according to the third embodiment.

Next, a third mask material 33 having a third opening 33$a$ is formed on the surface of the silicon carbide layer 10 (FIG. 37). The third mask material 33 is, for example, an insulator. The third mask material 33 is, for example, silicon oxide.

As illustrated in FIG. 37, the third mask material 33 is formed by forming a sidewall material on the sidewall of the second opening 32$a$ of the second mask material 32. The sidewall material can be formed by, for example, deposition of an insulating film serving as a sidewall material and anisotropic etching. The sidewall material formed on the sidewall of the second opening 32$a$ of the second mask material 32 is an example of the second sidewall material.

Figure 38:
FIG. 38 is an explanatory diagram of the method for manufacturing a semiconductor device according to the third embodiment.

Next, the trench 11 is formed in the silicon carbide layer 10 using the first mask material 31, the second mask material 32, and the third mask material 33 as etching masks (FIG. 38). The trench 11 is formed by using, for example, a reactive ion etching method.

Figure 39:
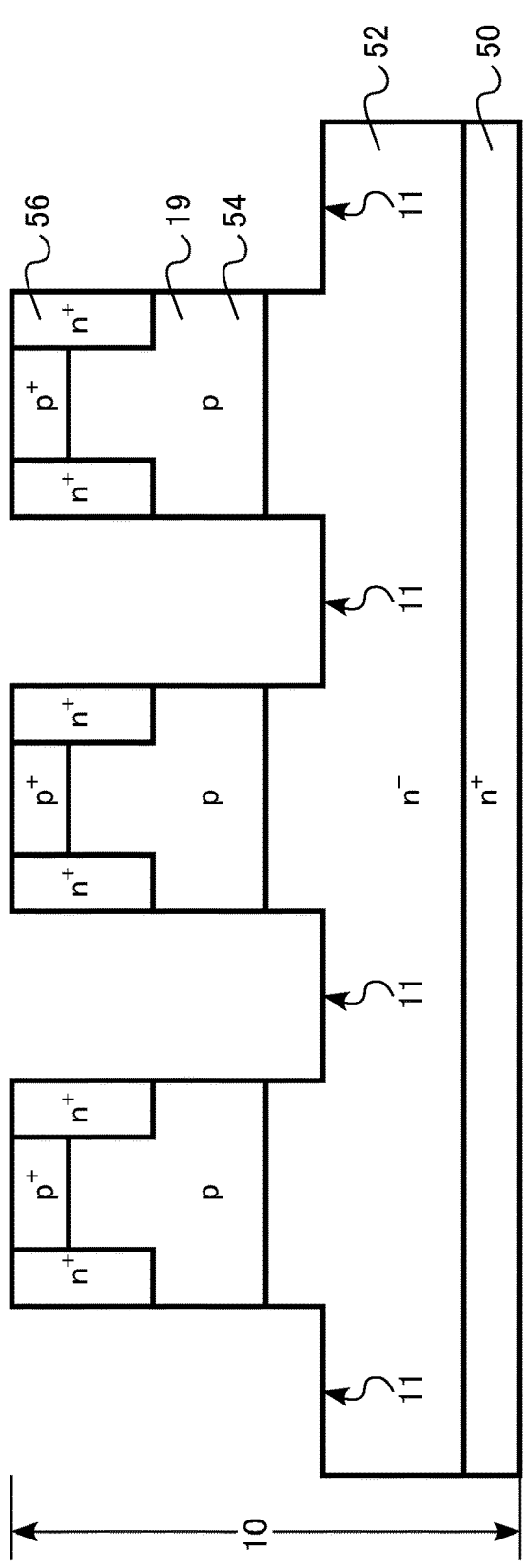
FIG. 39 is an explanatory diagram of the method for manufacturing a semiconductor device according to the third embodiment.

Next, the first mask material 31, the second mask material 32, and the third mask material 33 are removed (FIG. 39).

Next, a carbon film (not illustrated) is formed on the surface of the silicon carbide layer 10.

Next, heat treatment is performed. The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

The heat treatment activates aluminum and phosphorus ion-implanted into the silicon carbide layer 10. The heat treatment is activation annealing of aluminum and phosphorus. Further, interstitial carbon formed by carbon ion implantation into the silicon carbide layer 10 by heat treatment fills carbon vacancy in the silicon carbide layer 10.

Next, the carbon film is removed. After that, the gate insulating layer 40, the gate electrode 42, the interlayer insulating film 44, and the source electrode 46 are formed on the surface of the silicon carbide layer 10 using a known process technique. In addition, the drain electrode 48 is formed on the back surface of the silicon carbide layer 10.

The MOSFET 300 illustrated in FIG. 30 is manufactured by the above manufacturing method.

In the method for manufacturing a semiconductor device according to the third embodiment, carbon (C) is introduced into a range wider than a range in which impurities are ion-implanted by ion implantation, similarly to the method for manufacturing a semiconductor device according to the first and second embodiments. By the above method, the density of carbon vacancies in the silicon carbide layer is reduced, and diffusion of impurities ion-implanted into silicon carbide due to heat treatment can be suppressed.

For example, in the MOSFET 300, when the diffusion of the n-type impurity in the source region 56 in the lateral direction (first direction) increases, the width in the first direction of the well contact region 58 between the adjacent trenches 11 or the width in the first direction of the well region 54 between the adjacent trenches 11 decreases. When the width in the first direction of the well contact region 58 between the adjacent trenches 11 or the width in the first direction of the well region 54 between the adjacent trenches 11 decreases, for example, avalanche withstand capability of the MOSFET 300 decreases. In addition, when the width of the well contact region 58 in the first direction or the width of the well region 54 in the first direction decreases, for example, an electric potential of the well region 54 becomes unstable, and the operation of the MOSFET 300 becomes unstable. Therefore, it is difficult to realize the scaling-down of the MOSFET 300.

According to the method for manufacturing a semiconductor device of the third embodiment, diffusion of n-type impurities in the source region 56 in the lateral direction (first direction) is suppressed. Therefore, it is possible to suppress a decrease in the width of the well contact region 58 of the MOSFET 300 in the first direction or the width of the well region 54 in the first direction. Therefore, the scaling-down of the MOSFET 300 can be realized.

In addition, in the MOSFET 300, as the diffusion of the n-type impurity in the source region 56 in the vertical direction increases, the channel length (L in FIG. 30) of the MOSFET 300 decreases. When the channel length L decreases, the threshold voltage of the MOSFET 300 decreases.

According to the semiconductor device manufacturing method of the third embodiment, diffusion of n-type impurities in the source region 56 in the vertical direction is suppressed. Therefore, it is possible to prevent the channel length L of the MOSFET 200 from being shortened. Therefore, a decrease in the threshold voltage of the MOSFET 300 can be suppressed.

As described above, according to the method for manufacturing a semiconductor device of the third embodiment, diffusion of impurities due to heat treatment can be suppressed by ion implantation of carbon.

Fourth Embodiment

A method for manufacturing a semiconductor device of a fourth embodiment is different from the method for manufacturing a semiconductor device of the second embodiment in that a MOSFET having a super junction structure is manufactured. Hereinafter, description of contents overlapping with the first embodiment or the second embodiment may be partially omitted.

Figure 40:
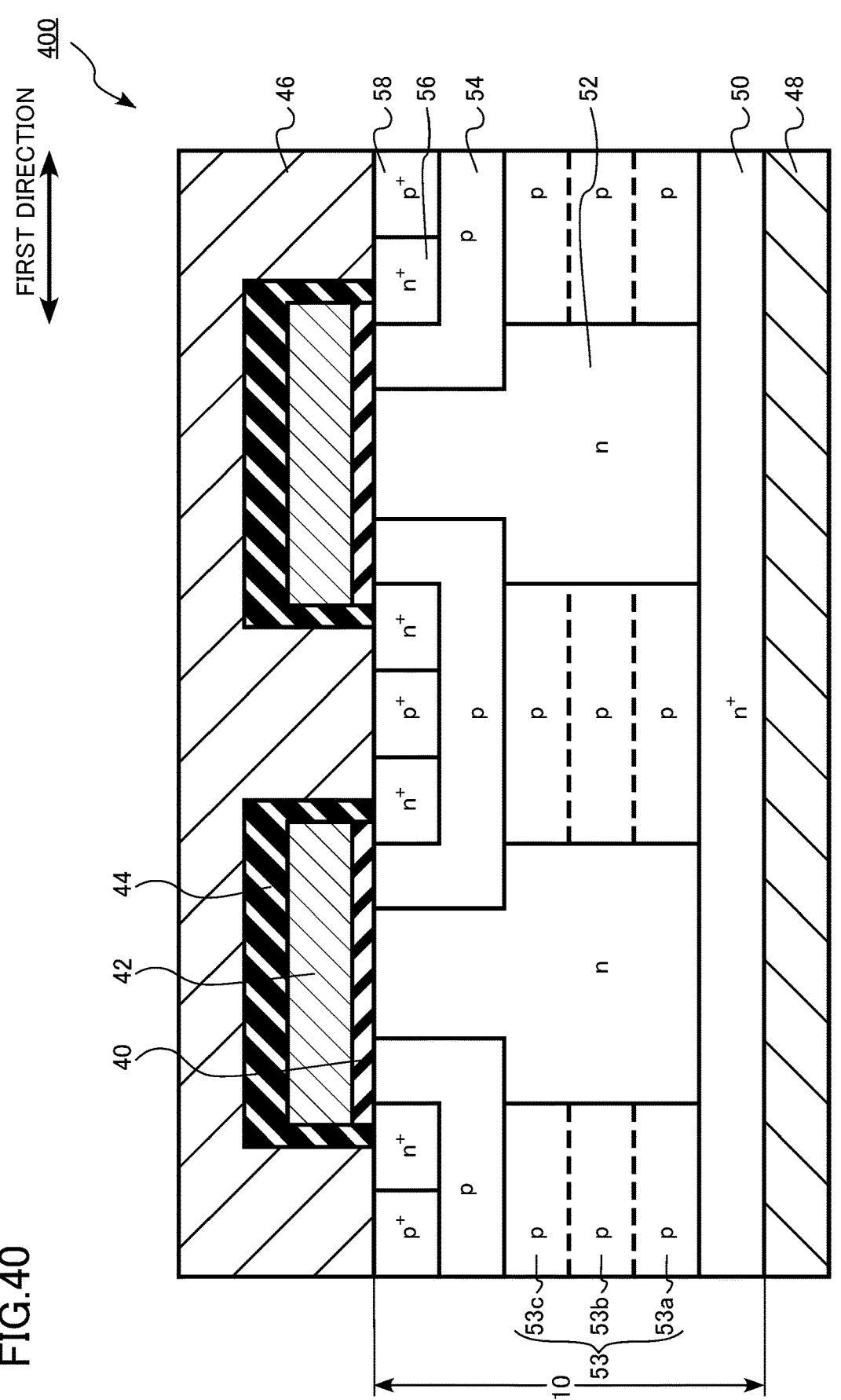
FIG. 40 is a schematic cross-sectional view of a semiconductor device manufactured by a method for manufacturing a semiconductor device according to a fourth embodiment.

FIG. 40 is a schematic cross-sectional view of a semiconductor device manufactured by the method for manufacturing a semiconductor device according to the fourth embodiment. The semiconductor device of the fourth embodiment is a MOSFET 400. The MOSFET 400 has a super junction structure.

The MOSFET 400 includes a silicon carbide layer 10, a gate insulating layer 40, a gate electrode 42, an interlayer insulating film 44, a source electrode 46, and a drain electrode 48.

The silicon carbide layer 10 includes an $n^+$-type drain region 50, an $n^-$-type drift region 52, a p-type pillar region 53, a p-type well region 54, an $n^+$-type source region 56, and a $p^+$-type well contact region 58. The p-type pillar region 53 includes a first p-type region 53a, a second p-type region 53b, and a third p-type region 53c.

The silicon carbide layer 10 is, for example, a single crystal of 4H-SiC. The silicon carbide layer 10 is disposed between the source electrode 46 and the drain electrode 48.

The silicon carbide layer 10 is single crystal SiC. The silicon carbide layer 10 is, for example, 4H-SiC.

The $n^+$-type drain region 50 is provided on the back surface side of the silicon carbide layer 10. The drain region 50 contains, for example, nitrogen (N) as n-type impurities. The n-type impurity concentration of the drain region 50 is, for example, $1\times10^{18}$ cm$^{-3}$ or more and $1\times10^{20}$ cm$^{-3}$ or less.

The $n^-$-type drift region 52 is provided on the drain region 50. The drift region 52 functions as a path of an on-current of the MOSFET 300.

The drift region 52 contains, for example, nitrogen (N) as an n-type impurity. The n-type impurity concentration of the drift region 52 is, for example, $1\times10^{15}$ cm$^{-3}$ or more and $1\times10^{16}$ cm$^{-3}$ or less.

The thickness of the drift region 52 is, for example, 5 μm or more and 100 μm or less.

The p-type pillar region 53 is provided between the drain region 50 and the well region 54. The pillar regions 53 are repeatedly disposed in the first direction. The drift region 52 is provided between the adjacent pillar regions 53.

The pillar regions 53 are alternately disposed with the drift region 52 in the first direction to form a so-called super junction structure. Since the MOSFET 400 has a super junction structure, the breakdown voltage is improved.

The pillar region 53 contains, for example, aluminum (Al) as a p-type impurity. The p-type impurity concentration of the pillar region 53 is, for example, $1\times10^{16}$ cm$^{-3}$ or more and $1\times10^{20}$ cm$^{-3}$ or less.

The p-type well region 54 is provided on the drift region 52 and the pillar region 53. The well region 54 is disposed between the drift region 52 and the gate insulating layer 40. The well region 54 functions as a channel region of the MOSFET 400.

The well region 54 contains, for example, aluminum (Al) as a p-type impurity. The p-type impurity concentration of the well region 54 is, for example, $1\times10^{16}$ cm$^{-3}$ or more and $1\times10^{20}$ cm$^{-3}$ or less.

The $n^+$-type source region 56 is provided on the well region 54. The source region 56 contains, for example, phosphorus (P) as n-type impurities. The n-type impurity concentration of the source region 56 is, for example, $1\times10^{18}$ cm$^{-3}$ or more and $1\times10^{22}$ cm$^{-3}$ or less.

The $p^+$-type well contact region 58 is provided on the well region 54. The well contact region 58 is provided on the side of the source region 56.

The well contact region 58 contains, for example, aluminum as a p-type impurity. The p-type impurity concentration of the well contact region 58 is, for example, $1\times10^{18}$ cm$^{-3}$ or more and $1\times10^{22}$ cm$^{-3}$ or less.

The gate insulating layer 40 is provided between the silicon carbide layer 10 and the gate electrode 42. The gate insulating layer 40 contains, for example, silicon oxide.

The gate electrode 42 is provided on the gate insulating layer 40. The gate electrode 42 is, for example, polycrystalline silicon containing n-type impurities or p-type impurities.

The interlayer insulating film 44 is formed on the gate electrode 42. The interlayer insulating film 44 is disposed between the gate electrode 42 and the source electrode 46. The interlayer insulating film 44 is, for example, a silicon oxide film.

The source electrode 46 is provided on the front surface side of the silicon carbide layer 10. The source electrode 46 is electrically connected to the source region 56 and the well contact region 58. The source electrode 46 is in contact with, for example, the source region 56 and the well contact region 58.

The drain electrode 48 is provided on the side of the silicon carbide layer 10 opposite to the source electrode 46, that is, on the back surface side. The drain electrode 48 is electrically connected to the drain region 50. The drain electrode 48 is in contact with, for example, the drain region 50.

Next, an example of a method for manufacturing a semiconductor device according to the fourth embodiment will be described.

FIGS. 41, 42, 43, 44, 45, 46, 47, 48, 49, 50, 51, 52, 53, 54, 55, 56, 57, 58, 59, and 60 are explanatory diagrams of the method for manufacturing a semiconductor device according to the fourth embodiment. FIGS. 41 to 60 are cross-sectional views in the middle of manufacturing.

Figure 41:
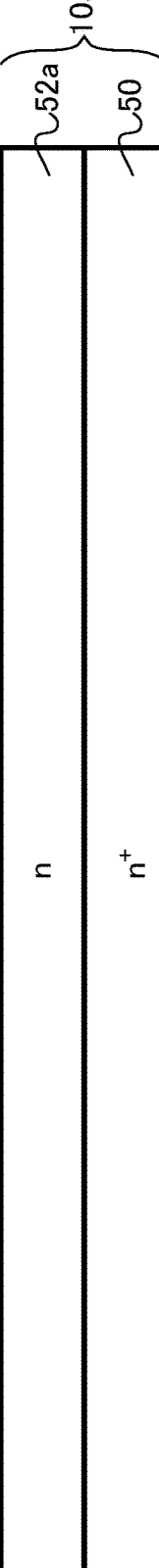
FIG. 41 is an explanatory diagram of the method for manufacturing a semiconductor device according to the fourth embodiment.

First, a silicon carbide layer 10*a* is prepared (FIG. 41). The silicon carbide layer 10*a* includes an n-type drain region 50 and an n⁻-type drift region 52*a*. The drift region 52*a* is formed on the drain region 50 by, for example, an epitaxial growth method.

Figure 42:
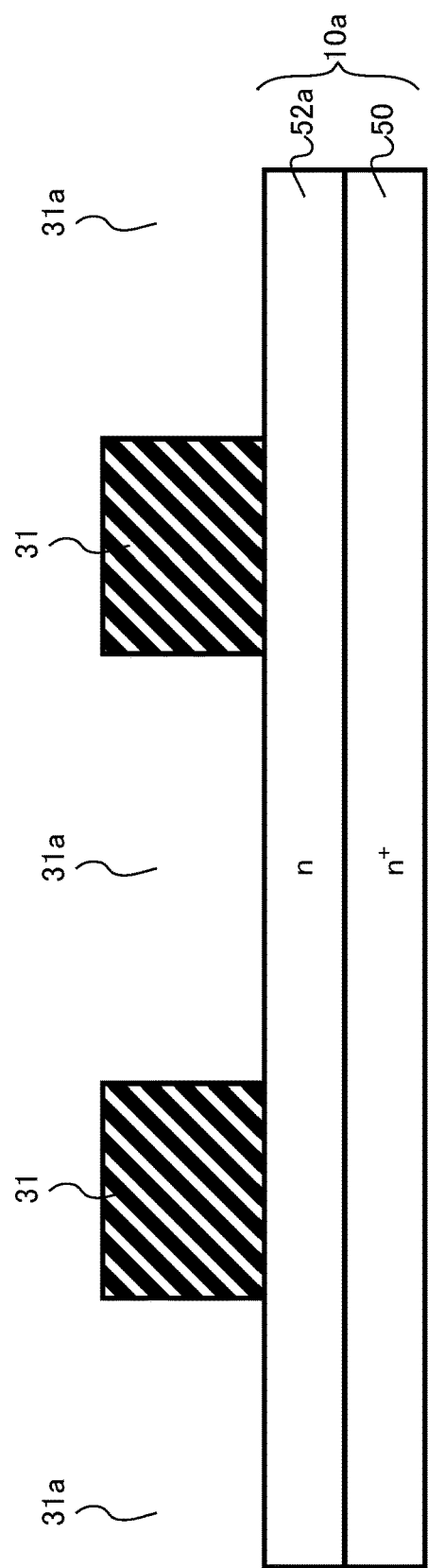
FIG. 42 is an explanatory diagram of the method for manufacturing a semiconductor device according to the fourth embodiment.

Next, the first mask material 31 having the first opening 31*a* is formed on the surface of the silicon carbide layer 10*a* (FIG. 42). The first mask material 31 is, for example, an insulator. The first mask material 31 is, for example, silicon oxide.

Figure 43:
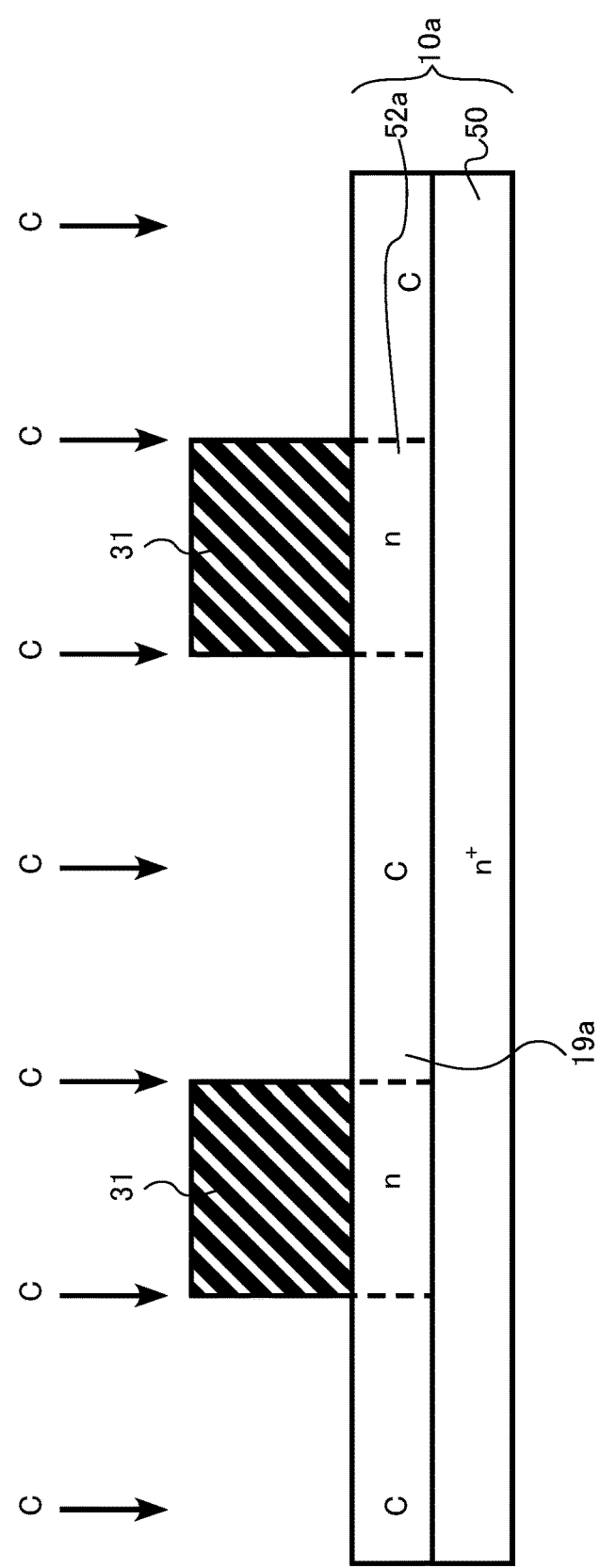
FIG. 43 is an explanatory diagram of the method for manufacturing a semiconductor device according to the fourth embodiment.

Next, the first ion implantation for implanting carbon (C) into the silicon carbide layer 10*a* is performed using the first mask material 31 as an ion implantation mask (FIG. 43). The first carbon region 19*a* is formed by the first ion implantation.

The first ion implantation is performed, for example, at a temperature of 1000° C. or more and 1300° C. or less. The first ion implantation is performed, for example, in a state where the temperature of the silicon carbide layer 10 is 1000° C. or more and 1300° C. or less.

Figure 44:
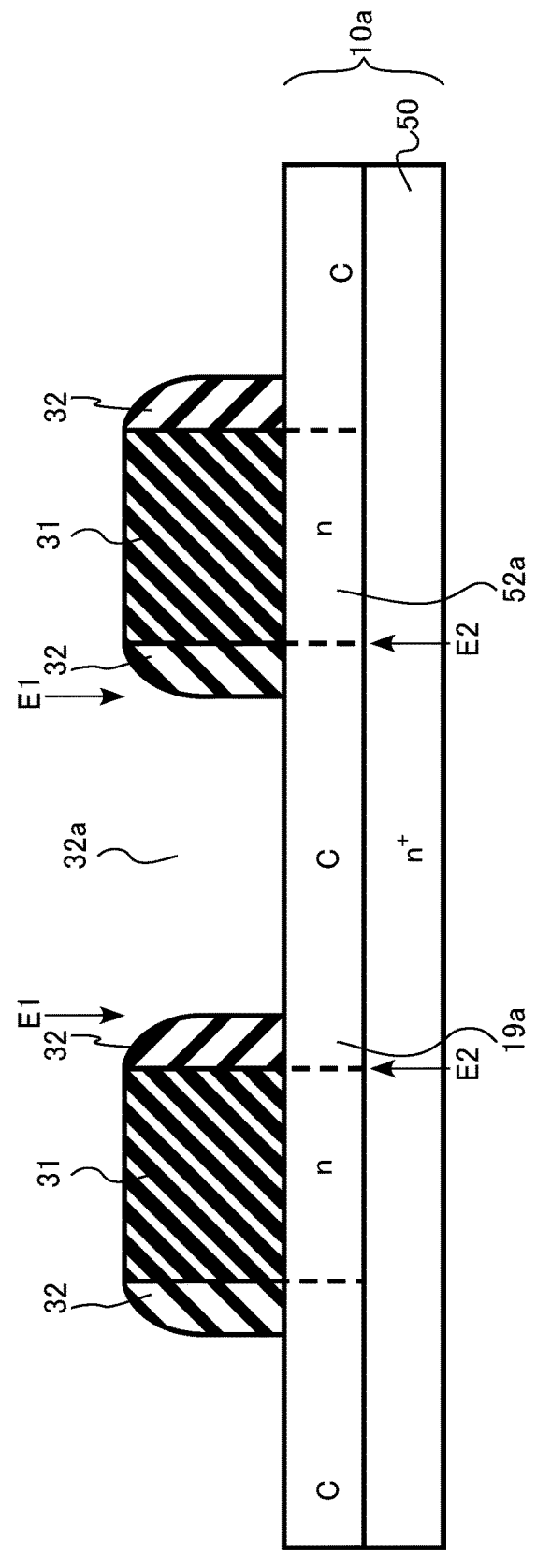
FIG. 44 is an explanatory diagram of the method for manufacturing a semiconductor device according to the fourth embodiment.

Next, a second mask material 32 having a second opening 32*a* is formed on the surface of the silicon carbide layer 10*a* (FIG. 44). The second mask material 32 is, for example, an insulator. The second mask material 32 is, for example, silicon oxide.

As illustrated in FIG. 44, the second mask material 32 is formed by forming a sidewall material on the sidewall of the first opening 31*a* of the first mask material 31. The sidewall material can be formed by, for example, deposition of an insulating film serving as a sidewall material and anisotropic etching. The sidewall material formed on the sidewall of the first opening 31*a* of the first mask material 31 is an example of the first sidewall material.

The sidewall material becomes the second mask material 32. The opening formed by the sidewall material is the second opening 32*a*. Both end portions (E1 in FIG. 44) of the second opening 32*a* in the first direction are disposed inside both end portions (E2 in FIG. 44) of the first carbon region 19*a* in the first direction.

Figure 45:
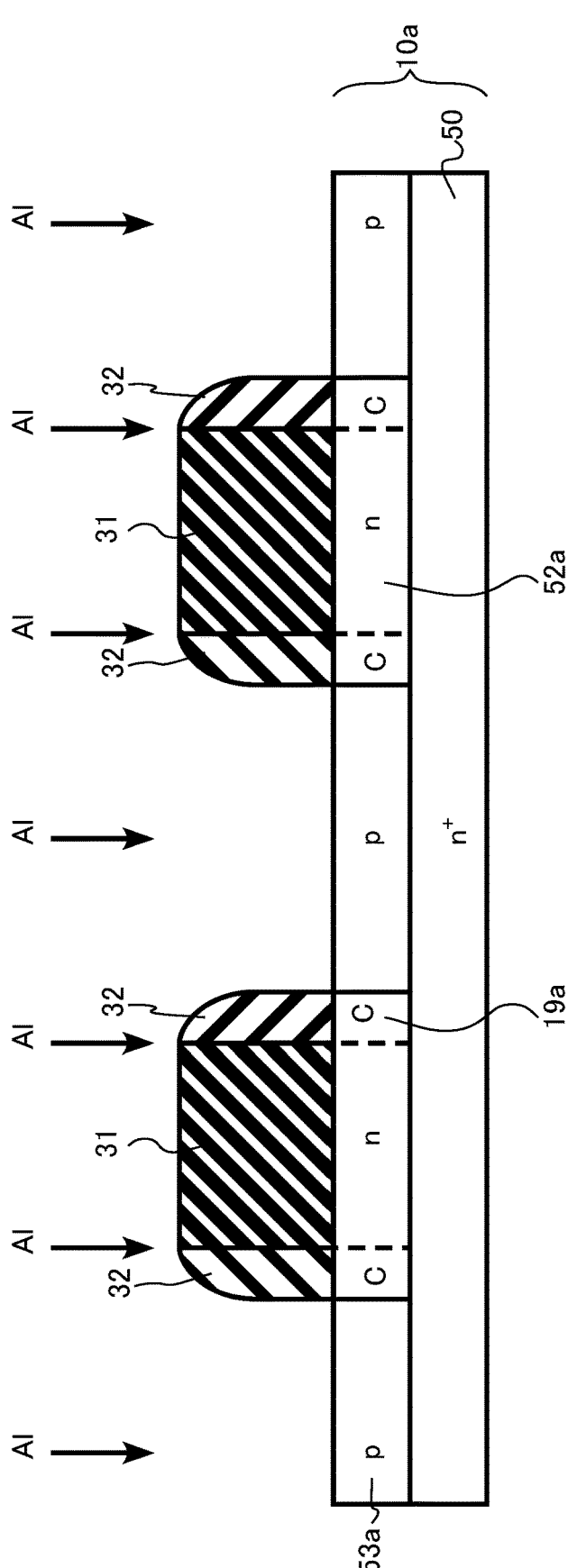
FIG. 45 is an explanatory diagram of the method for manufacturing a semiconductor device according to the fourth embodiment.

Next, the second ion implantation for implanting aluminum into the silicon carbide layer 10*a* is performed using the first mask material 31 and the second mask material 32 as ion implantation masks (FIG. 45). The first p-type region 53*a* is formed by the second ion implantation. Aluminum implanted by the second ion implantation is an example of the first impurity. The first p-type region 53*a* is an example of a first impurity region.

The second ion implantation is performed, for example, at a temperature of 1000° C. or more and 1300° C. or less. The second ion implantation is performed, for example, in a state where the temperature of the silicon carbide layer 10*a* is 1000° C. or higher and 1300° C. or lower.

Next, the first mask material 31 and the second mask material 32 are removed. The first mask material 31 and the second mask material 32 are removed by, for example, wet etching.

Figure 46:
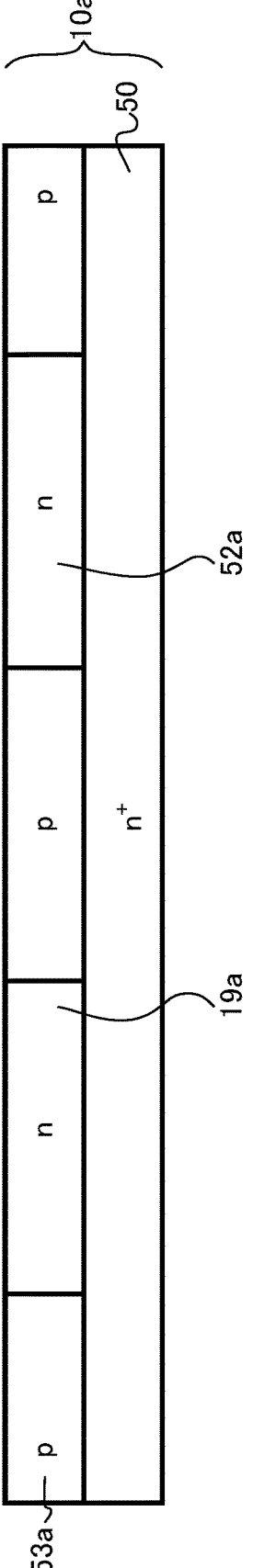
FIG. 46 is an explanatory diagram of the method for manufacturing a semiconductor device according to the fourth embodiment.

Next, heat treatment is performed (FIG. 46). The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

The heat treatment activates aluminum ion-implanted into the silicon carbide layer 10*a*. The heat treatment is activation annealing of aluminum. Further, interstitial carbon formed by carbon ion implantation into the silicon carbide layer 10*a* by the heat treatment fills the carbon vacancies in the silicon carbide layer 10*a*. In addition, defects formed in the silicon carbide layer 10*a* by ion implantation are repaired by the heat treatment. By forming the carbon layer on the silicon carbide layer 10*a* before the heat treatment, surface roughness of the silicon carbide layer 10*a* during the heat treatment can be suppressed. The carbon layer is removed by ashing after the heat treatment.

Figure 47:
FIG. 47 is an explanatory diagram of the method for manufacturing a semiconductor device according to the fourth embodiment.
Figure 47:
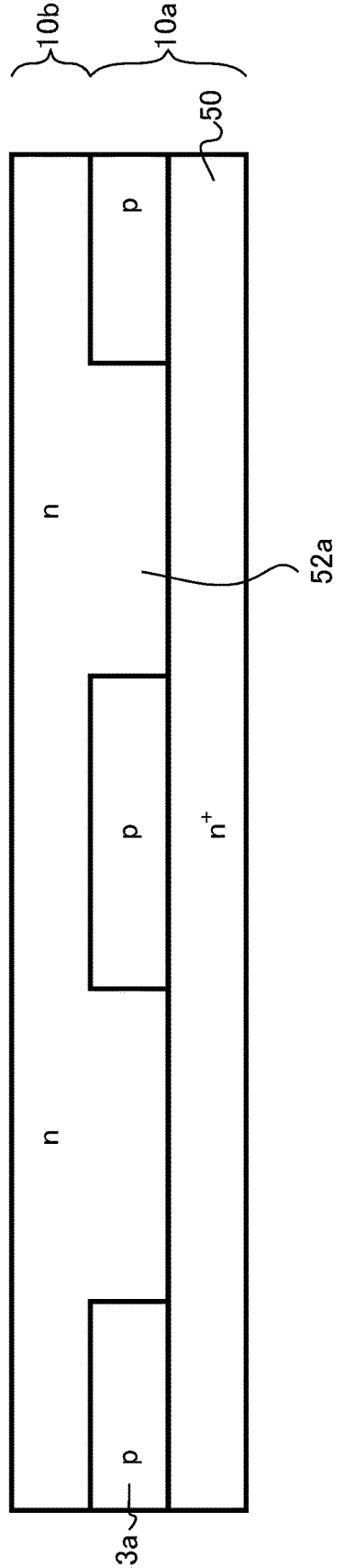

Next, an n-type first silicon carbide film 10*b* is formed on the silicon carbide layer 10*a* (FIG. 47). The first silicon carbide film 10*b* is formed by an epitaxial growth method.

Figure 48:
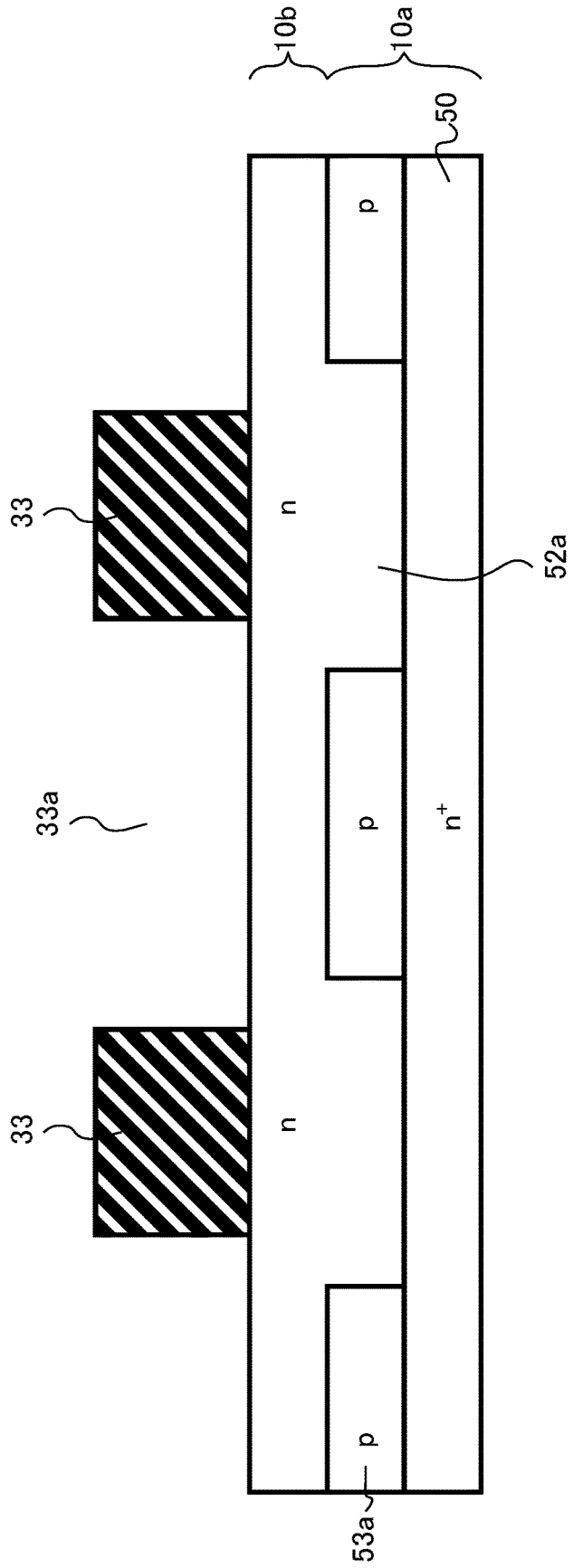
FIG. 48 is an explanatory diagram of the method for manufacturing a semiconductor device according to the fourth embodiment.

Next, a third mask material 33 having a third opening 33*a* is formed on the surface of the first silicon carbide film 10*b* (FIG. 48). The third mask material 33 is, for example, an insulator. The third mask material 33 is, for example, silicon oxide.

Figure 49:
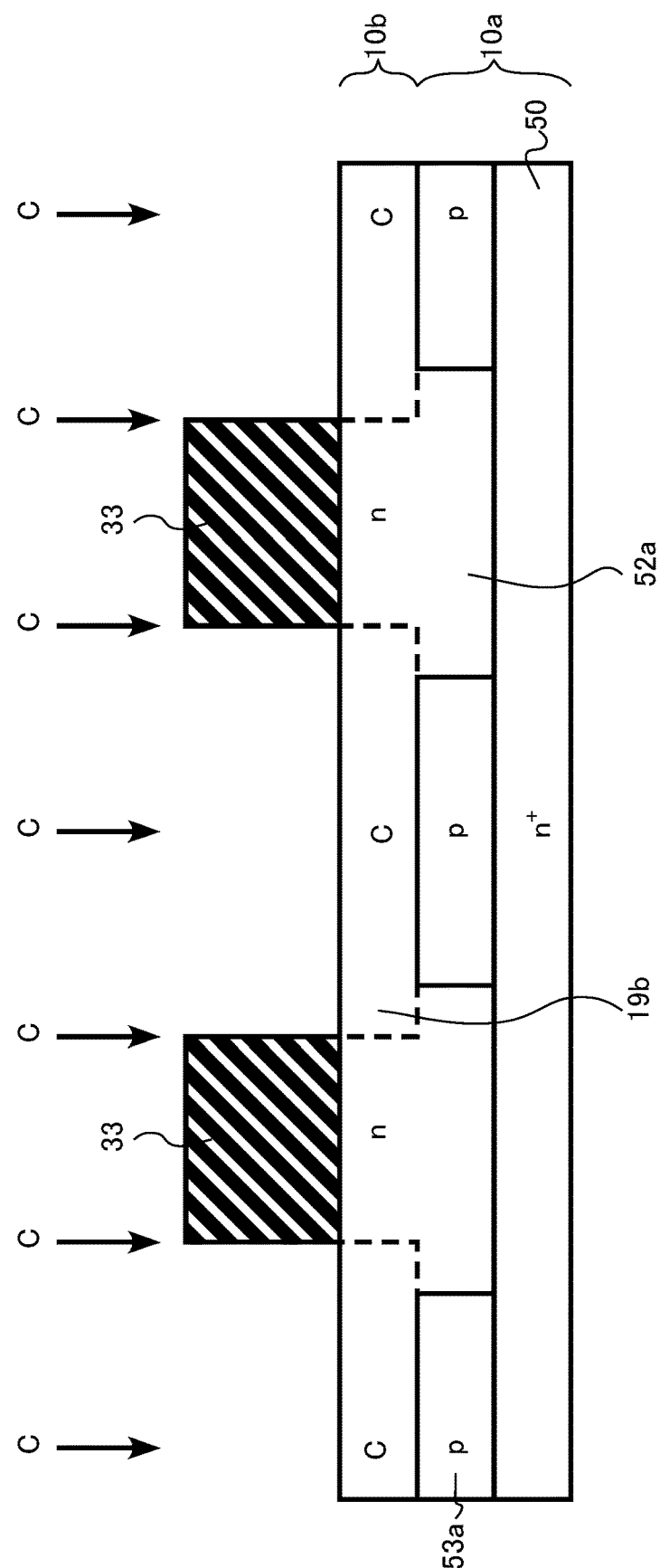
FIG. 49 is an explanatory diagram of the method for manufacturing a semiconductor device according to the fourth embodiment.

Next, the third ion implantation for implanting carbon (C) into the first silicon carbide film 10*b* is performed using the third mask material 33 as an ion implantation mask (FIG. 49). The second carbon region 19*b* is formed by the third ion implantation.

The third ion implantation is performed, for example, at a temperature of 1000° C. or more and 1300° C. or less. The third ion implantation is performed, for example, in a state where the temperature of the first silicon carbide film 10*b* is 1000° C. or more and 1300° C. or less.

Figure 50:
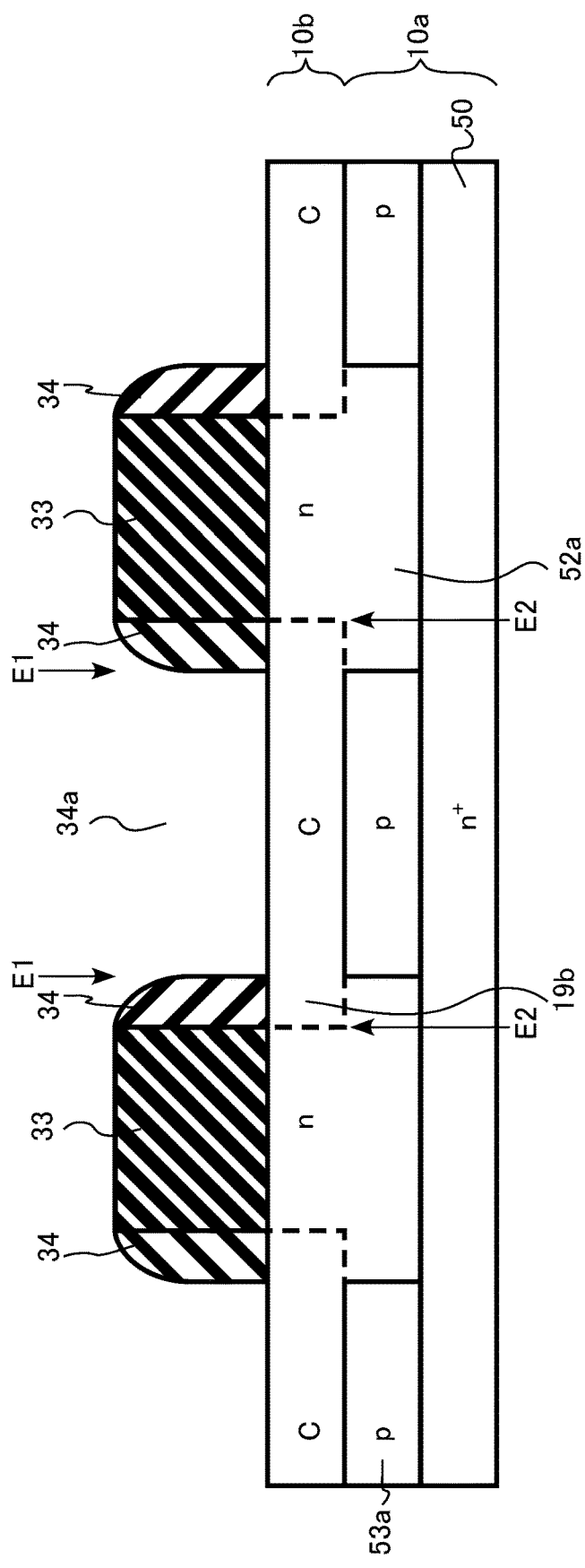
FIG. 50 is an explanatory diagram of the method for manufacturing a semiconductor device according to the fourth embodiment.

Next, a fourth mask material 34 having a fourth opening 34*a* is formed on the surface of the first silicon carbide film 10*b* (FIG. 50). The fourth mask material 34 is, for example, an insulator. The fourth mask material 34 is, for example, silicon oxide.

As illustrated in FIG. 50, the fourth mask material 34 is formed by forming a sidewall material on the sidewall of the third opening 33*a* of the third mask material 33. The sidewall material can be formed by, for example, deposition of an insulating film serving as a sidewall material and anisotropic etching. The sidewall material formed on the sidewall of the third opening 33*a* of the third mask material 33 is an example of the second sidewall material.

The sidewall material becomes the fourth mask material 34. The opening formed by the sidewall material is the fourth opening 34*a*. Both end portions (E1 in FIG. 50) of the fourth opening 34*a* in the first direction are disposed inside both end portions (E2 in FIG. 50) of the second carbon region 19*b* in the first direction.

Figure 51:
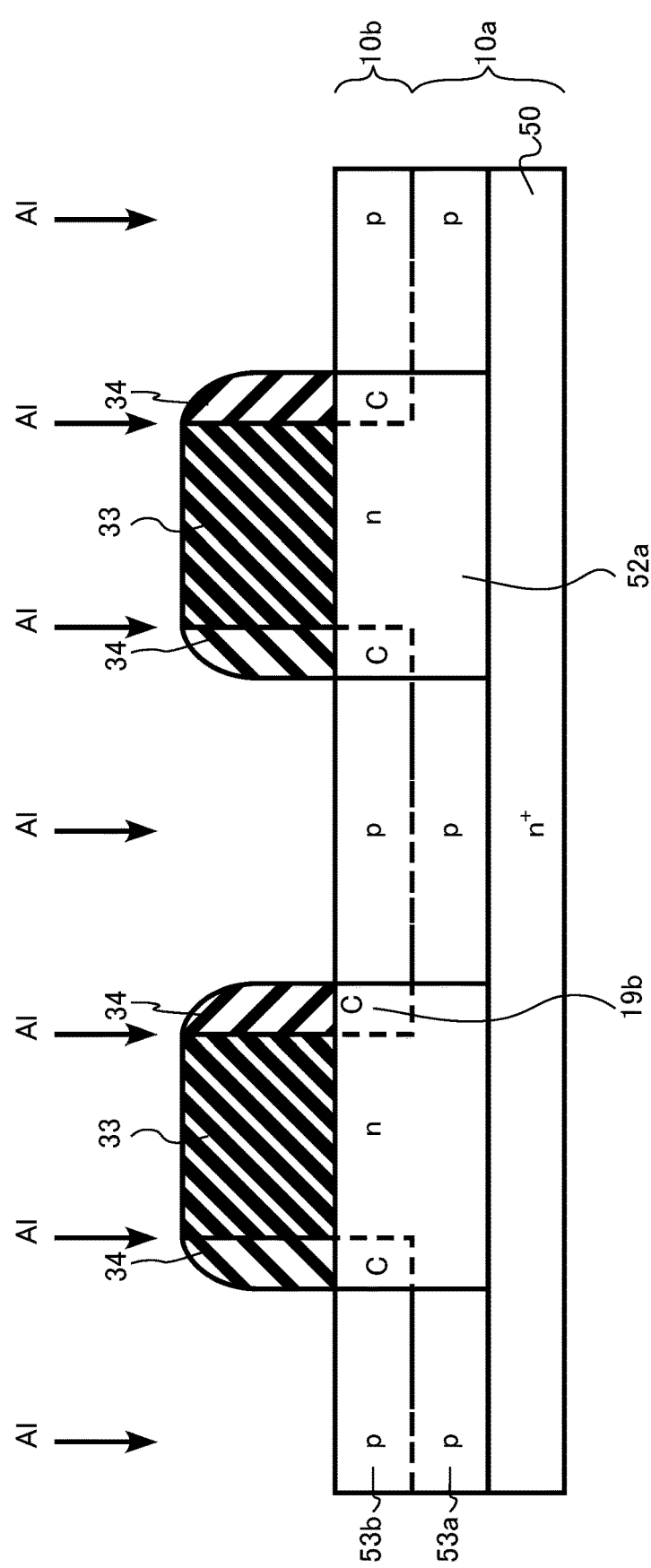
FIG. 51 is an explanatory diagram of the method for manufacturing a semiconductor device according to the fourth embodiment.

Next, the fourth ion implantation for implanting aluminum into the first silicon carbide film 10*b* is performed using the third mask material 33 and the fourth mask material 34 as ion implantation masks (FIG. 51). The second p-type region 53*b* is formed by the fourth ion implantation. The second p-type region 53*b* is in contact with the first p-type region 53*a*. Aluminum implanted by the fourth ion implantation is an example of the second impurity. The first impurity and the second impurity have the same conductivity type. The second p-type region 53*b* is an example of a second impurity region.

The fourth ion implantation is performed, for example, at a temperature of 1000° C. or more and 1300° C. or less. The fourth ion implantation is performed, for example, in a state where the temperature of the first silicon carbide film 10*b* is 1000° C. or more and 1300° C. or less.

Next, the third mask material 33 and the fourth mask material 34 are removed. The third mask material 33 and the fourth mask material 34 are removed by, for example, wet etching.

Figure 52:
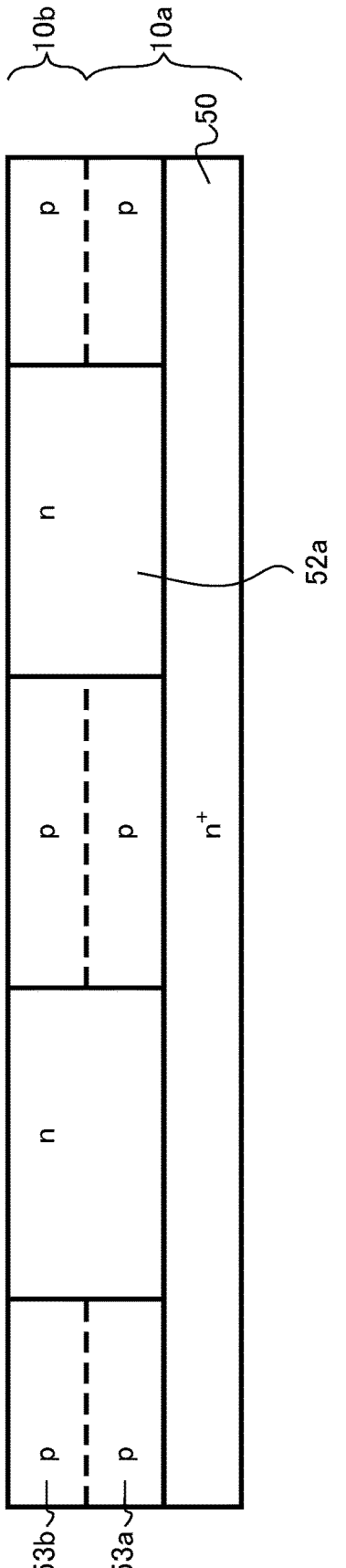
FIG. 52 is an explanatory diagram of the method for manufacturing a semiconductor device according to the fourth embodiment.

Next, heat treatment is performed (FIG. 52). The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

Aluminum ion-implanted into the first silicon carbide film 10$b$ is activated by the heat treatment. The heat treatment is activation annealing of aluminum. Further, interstitial carbon formed by carbon ion implantation into the first silicon carbide film 10$b$ by the heat treatment fills carbon vacancies in the first silicon carbide film 10$b$. In addition, defects formed in first silicon carbide film 10$b$ by ion implantation are repaired by the heat treatment. By forming a carbon layer on first silicon carbide film 10$b$ before the heat treatment, surface roughness of first silicon carbide film 10$b$ during the heat treatment can be suppressed. The carbon layer is removed by ashing after the heat treatment.

Figure 53:
FIG. 53 is an explanatory diagram of the method for manufacturing a semiconductor device according to the fourth embodiment.
Figure 53:
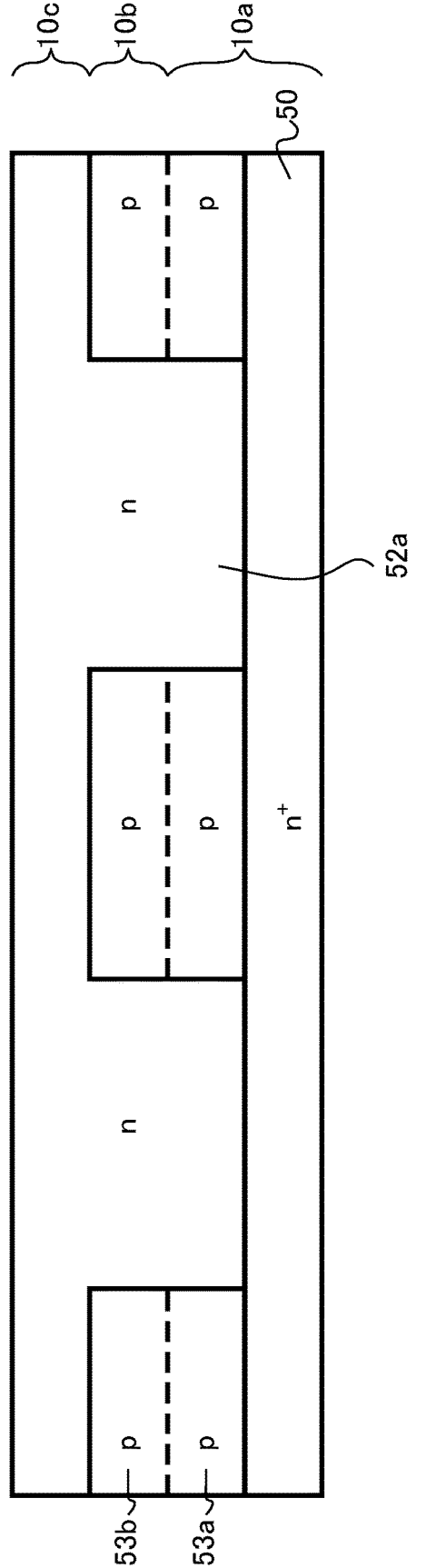

Next, an n-type second silicon carbide film 10$c$ is formed on the first silicon carbide film 10$b$ (FIG. 53). The second silicon carbide film 10$c$ is formed by an epitaxial growth method.

Figure 54:
FIG. 54 is an explanatory diagram of the method for manufacturing a semiconductor device according to the fourth embodiment.

Next, a fifth mask material 35 having a fifth opening 35$a$ is formed on the surface of the second silicon carbide film 10$c$ (FIG. 54). The fifth mask material 35 is, for example, an insulator. The fifth mask material 35 is, for example, silicon oxide.

Figure 55:
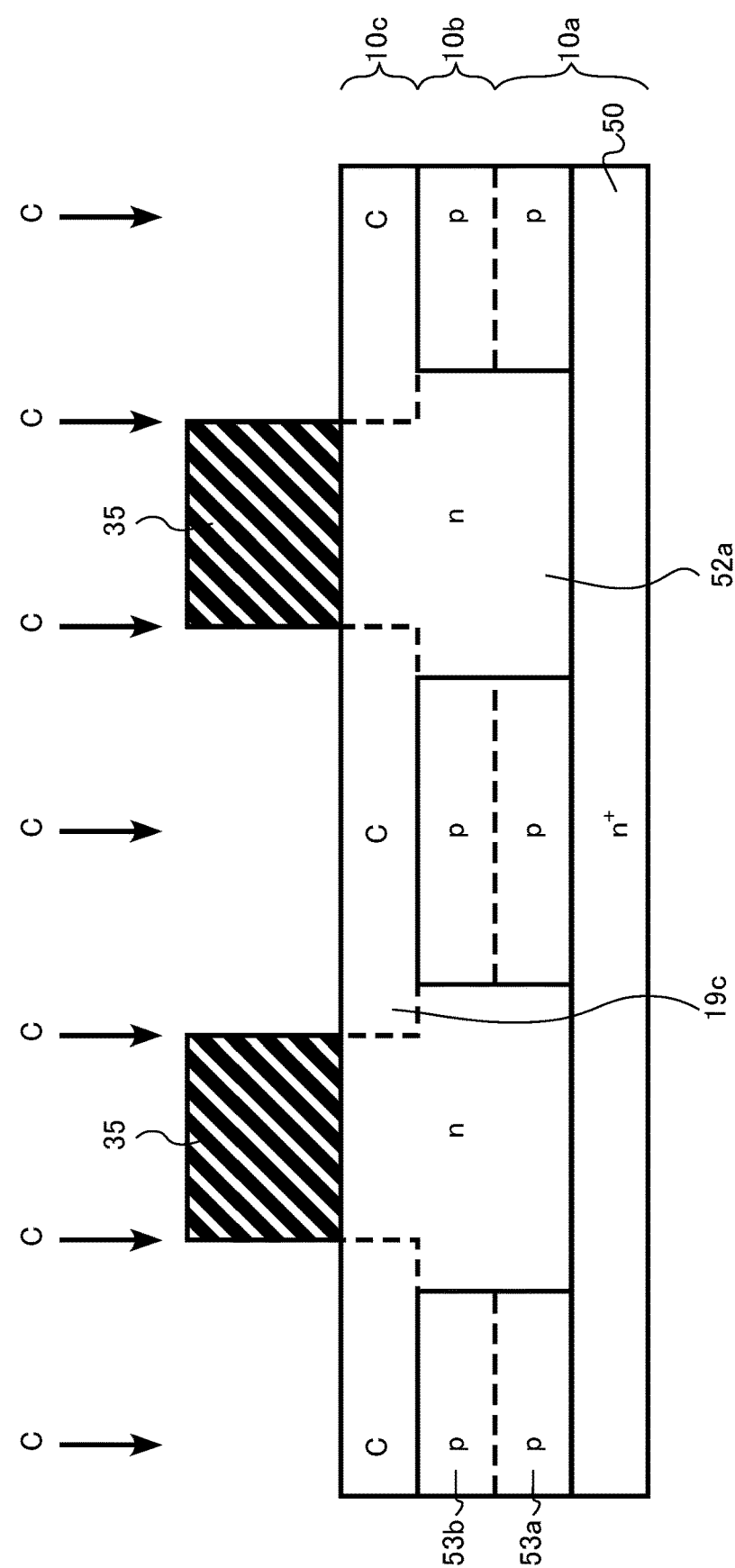
FIG. 55 is an explanatory diagram of the method for manufacturing a semiconductor device according to the fourth embodiment.

Next, the fifth ion implantation for implanting carbon (C) into the second silicon carbide film 10$c$ is performed using the fifth mask material 35 as an ion implantation mask (FIG. 55). The third carbon region 19 $c$ is formed by the fifth ion implantation.

The fifth ion implantation is performed, for example, at a temperature of 1000° C. or more and 1300° C. or less. The fifth ion implantation is performed, for example, in a state where the temperature of the second silicon carbide film 10$c$ is 1000° C. or more and 1300° C. or less.

Figure 56:
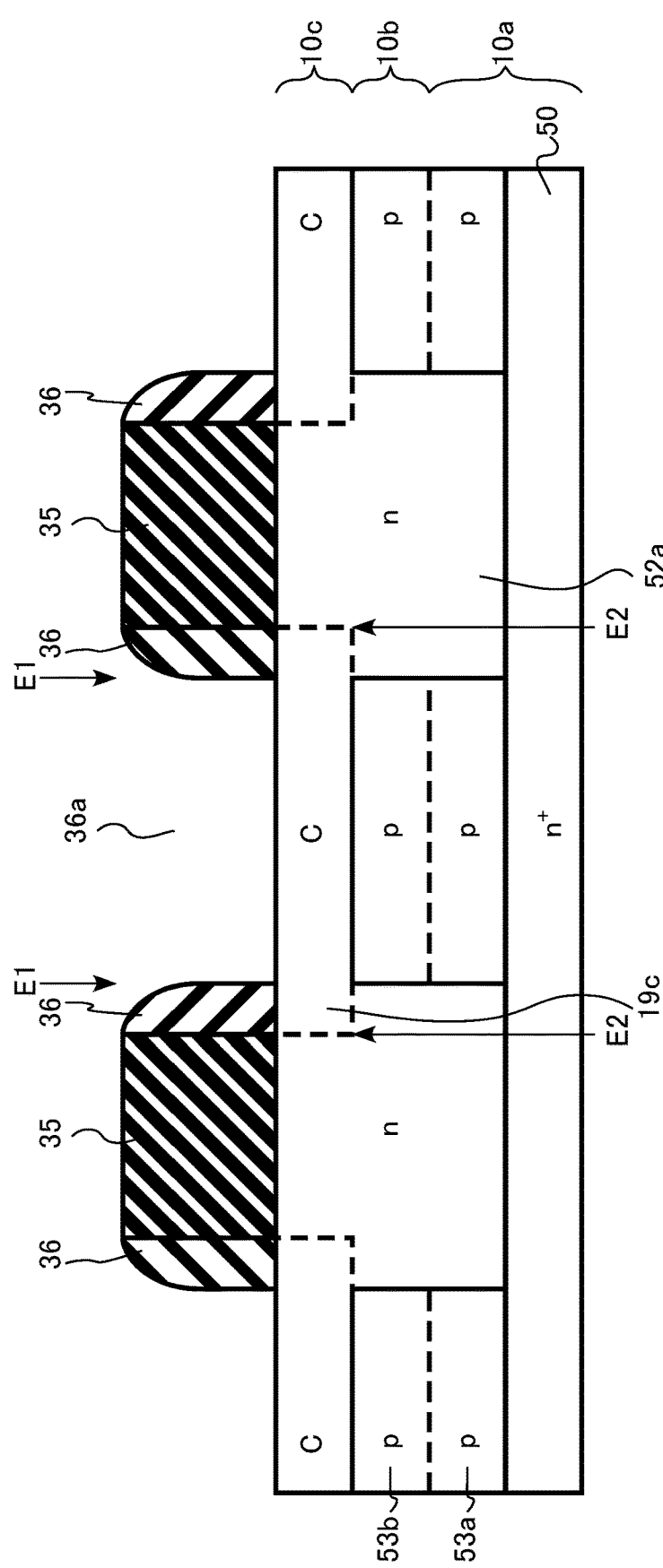
FIG. 56 is an explanatory diagram of the method for manufacturing a semiconductor device according to the fourth embodiment.

Next, a sixth mask material 36 having a sixth opening 36$a$ is formed on the surface of the second silicon carbide film 10$c$ (FIG. 56). The sixth mask material 36 is, for example, an insulator. The sixth mask material 36 is, for example, silicon oxide.

As illustrated in FIG. 56, the sixth mask material 36 is formed by forming a sidewall material on the sidewall of the fifth opening 35$a$ of the fifth mask material 35. The sidewall material can be formed by, for example, deposition of an insulating film serving as a sidewall material and anisotropic etching.

The sidewall material becomes the sixth mask material 36. The opening formed by the sidewall material is the sixth opening 36$a$. Both end portions (E1 in FIG. 56) of the sixth opening 36$a$ in the first direction are disposed inside both end portions (E2 in FIG. 56) of the third carbon region 19 $c$ in the first direction.

Figure 57:
FIG. 57 is an explanatory diagram of the method for manufacturing a semiconductor device according to the fourth embodiment.

Next, sixth ion implantation of implanting aluminum into the second silicon carbide film 10$c$ is performed using the fifth mask material 35 and the sixth mask material 36 as ion implantation masks (FIG. 57). The third p-type region 53$c$ is formed by the sixth ion implantation. The third p-type region 53$c$ is in contact with the second p-type region 53$b$.

The sixth ion implantation is performed, for example, at a temperature of 1000° C. or more and 1300° C. or less. The sixth ion implantation is performed, for example, in a state where the temperature of the second silicon carbide film 10$c$ is 1000° C. or more and 1300° C. or less.

Next, the fifth mask material 35 and the sixth mask material 36 are removed. The fifth mask material 35 and the sixth mask material 36 are removed by, for example, wet etching.

Figure 58:
FIG. 58 is an explanatory diagram of the method for manufacturing a semiconductor device according to the fourth embodiment.
Figure 58:
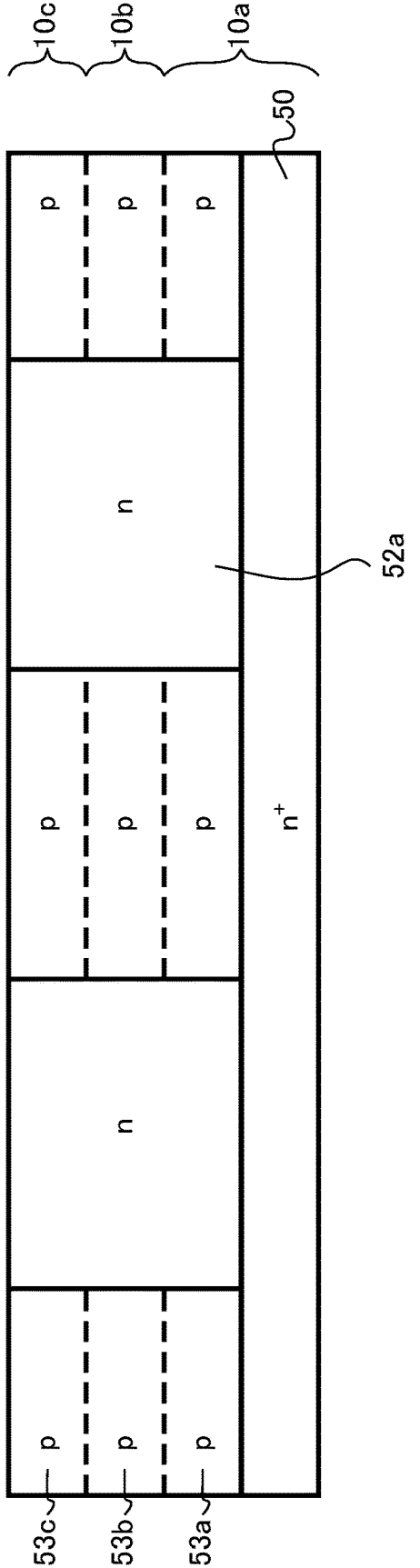

Next, heat treatment is performed (FIG. 58). The heat treatment is performed, for example, at 1600° C. or more and 2000° C. or less. The heat treatment is performed in a non-oxidizing atmosphere. The heat treatment is performed, for example, in an inert gas atmosphere. The heat treatment is performed, for example, in an argon gas atmosphere.

Aluminum ion-implanted into the second silicon carbide film 10$c$ is activated by the heat treatment. The heat treatment is activation annealing of aluminum. Further, interstitial carbon formed by carbon ion implantation into the second silicon carbide film 10$c$ by the heat treatment fills the carbon vacancies in the second silicon carbide film 10$c$. In addition, defects formed in second silicon carbide film 10$c$ by ion implantation are repaired by the heat treatment. By forming a carbon layer on second silicon carbide film 10$c$ before the heat treatment, surface roughness of second silicon carbide film 10$c$ during the heat treatment can be suppressed. The carbon layer is removed by ashing after the heat treatment.

Figure 59:
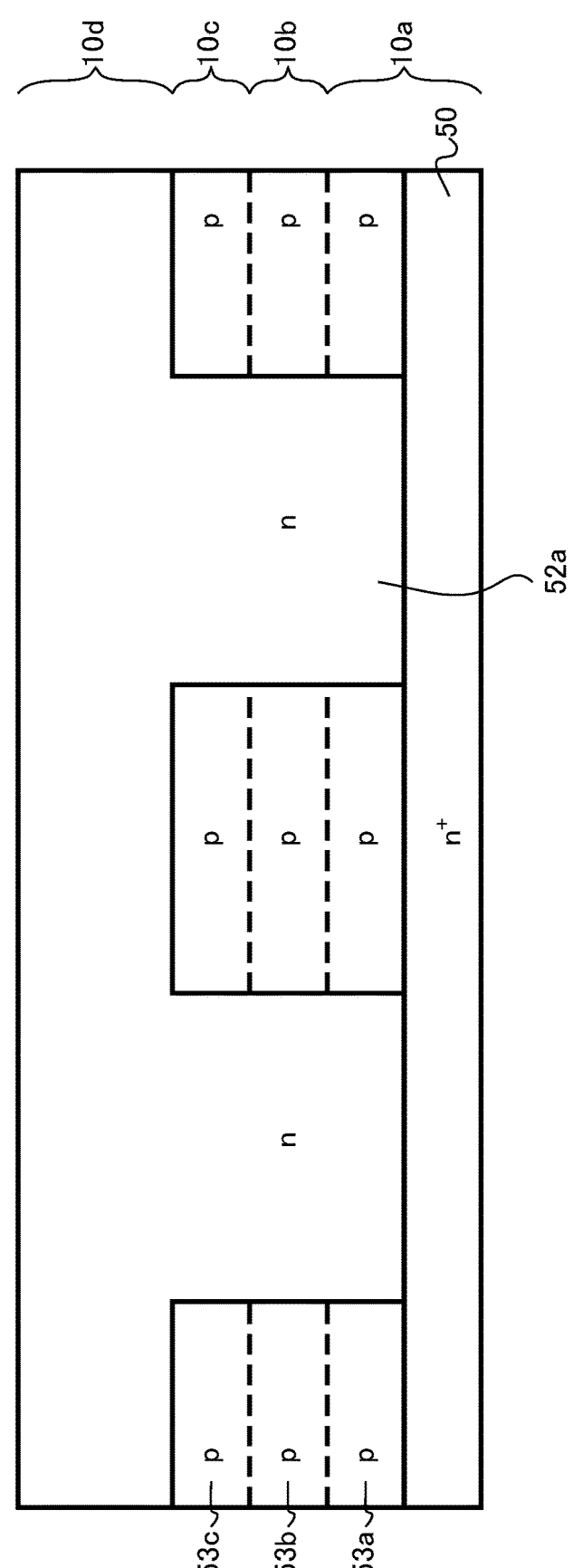
FIG. 59 is an explanatory diagram of the method for manufacturing a semiconductor device according to the fourth embodiment.
Figure 60:
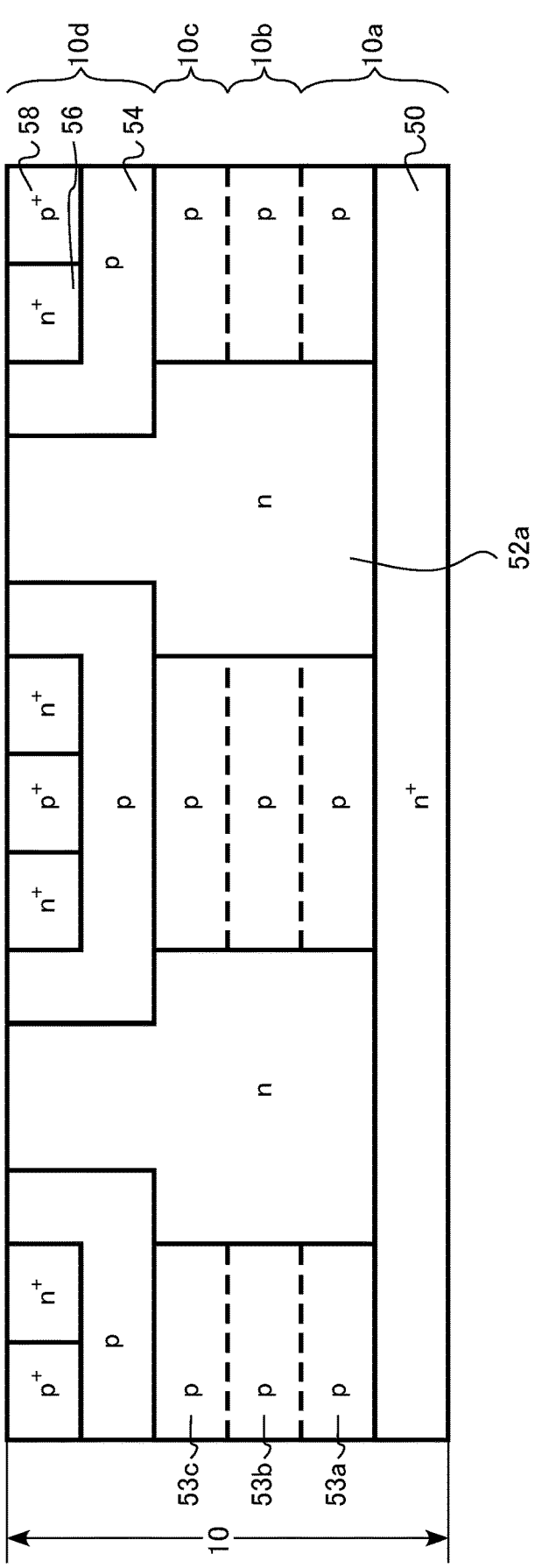
FIG. 60 is an explanatory diagram of the method for manufacturing a semiconductor device according to the fourth embodiment.

Next, an n-type third silicon carbide film 10$d$ is formed on the second silicon carbide film 10$c$ (FIG. 59). The third silicon carbide film 10$d$ is formed by an epitaxial growth method.

Next, for example, the p-type well region 54, the n$^+$-type source region 56, and the p$^+$-type well contact region 58 are formed in the third silicon carbide film 10$d$ using a manufacturing method similar to the manufacturing method of the second embodiment.

After that, the gate insulating layer 40, the gate electrode 42, the interlayer insulating film 44, and the source electrode 46 are formed on the surface of the silicon carbide layer 10 using a known process technique. In addition, the drain electrode 48 is formed on the back surface of the silicon carbide layer 10.

The MOSFET 400 illustrated in FIG. 40 is manufactured by the above manufacturing method.

In the method for manufacturing a semiconductor device according to the fourth embodiment, carbon (C) is introduced into a range wider than a range in which impurities are ion-implanted by ion implantation, similarly to the methods for manufacturing a semiconductor device according to the first to third embodiments. By the above method, the density of carbon vacancies in the silicon carbide layer is reduced, and diffusion of impurities ion-implanted into silicon carbide due to heat treatment can be suppressed.

For example, in the MOSFET 400, when the diffusion of the p-type impurity in the pillar region 53 in the lateral direction (first direction) increases, the width in the first direction of the drift region 52 between the pillar regions 53 adjacent to each other decreases. When the width of the drift region 52 in the first direction decreases, the on-resistance of the MOSFET 400 increases. Therefore, it is difficult to the scaling-down of the MOSFET 400.

According to the method for manufacturing a semiconductor device of the fourth embodiment, diffusion of p-type impurities in the pillar regions 53 in the lateral direction (first direction) is suppressed. Therefore, it is possible to suppress a decrease in the width of the drift region 52 of the MOSFET 400 in the first direction. Therefore, the scaling-down of the MOSFET 400 can be realized.

As described above, according to the method for manufacturing a semiconductor device of the fourth embodiment, diffusion of impurities due to heat treatment can be suppressed by ion implantation of carbon.

In the first to fourth embodiments, the n-type impurity is, for example, nitrogen or phosphorus. Arsenic (As) or antimony (Sb) can also be applied as the n-type impurity.

In the first to fourth embodiments, the p-type impurity is, for example, aluminum. Boron (B), gallium (Ga), and indium (In) can also be applied as the p-type impurity.

As described above, in the first to fourth embodiments, the case of 4H-SiC has been described as an example of the crystal structure of silicon carbide, but the present disclosure can also be applied to silicon carbide of other crystal structures such as 6H-SiC and 3C-SiC.

While certain embodiments have been described, these embodiments have been presented by way of example only, and are not intended to limit the scope of the inventions. Indeed, the method for manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   forming a first mask material having a first opening on a surface of a silicon carbide layer;
   performing first ion implantation of forming a first carbon region by implanting carbon (C) into the silicon carbide layer using the first mask material as a mask;
   forming a second mask material having a second opening on the surface of the silicon carbide layer, both end portions of the second opening disposed inside of both end portions of the first carbon region in a first direction parallel to the surface;
   performing second ion implantation of forming a first impurity region by implanting aluminum (Al) into the silicon carbide layer using the second mask material as a mask; and
   performing heat treatment at 1600° C. or higher,
   wherein a maximum concentration of the carbon implanted by the first ion implantation in the silicon carbide layer is higher than a maximum concentration of the aluminum (Al) implanted by the second ion implantation in the silicon carbide layer.

2. The method for manufacturing a semiconductor device according to claim 1, wherein a depth of the first carbon region is deeper than a depth of the first impurity region.

3. The method for manufacturing a semiconductor device according to claim 1, wherein the first ion implantation is performed at a temperature of 1000° C. or higher.

4. The method for manufacturing a semiconductor device according to claim 1, wherein the second ion implantation is performed at a temperature of 1000° C. or higher.

5. The method for manufacturing a semiconductor device according to claim 1, wherein a dose amount of the carbon implanted by the first ion implantation is 10 times or more a dose amount of the aluminum (Al) implanted by the second ion implantation.

6. The method for manufacturing a semiconductor device according to claim 1, wherein a concentration of a surface of the silicon carbide layer of the carbon implanted by the first ion implantation is $1 \times 10^{15}$ cm$^{-3}$ or more.

7. The method for manufacturing a semiconductor device according to claim 1, wherein a temperature of the heat treatment is 1850° C. or higher.

8. The method for manufacturing a semiconductor device according to claim 1, wherein the second mask material is formed by forming a first sidewall material on a sidewall of the first opening.

9. A method for manufacturing a semiconductor device, comprising:
   forming a first mask material having a first opening on a surface of a silicon carbide layer;
   performing first ion implantation of forming a first carbon region by implanting carbon (C) into the silicon carbide layer using the first mask material as a mask;
   forming a second mask material having a second opening on the surface of the silicon carbide layer, both end portions of the second opening disposed inside of both end portions of the first carbon region in a first direction parallel to the surface;
   performing second ion implantation of forming a first impurity region by implanting a first impurity into the silicon carbide layer using the second mask material as a mask;
   performing heat treatment at 1600° C. or higher; and
   performing third ion implantation of implanting carbon into the silicon carbide layer using the second mask material as a mask before the performing the second ion implantation.

10. A method for manufacturing a semiconductor device, comprising:
   forming a first mask material having a first opening on a surface of a silicon carbide layer;
   performing first ion implantation of forming a first carbon region by implanting carbon (C) into the silicon carbide layer using the first mask material as a mask;
   forming a second mask material having a second opening on the surface of the silicon carbide layer, both end portions of the second opening disposed inside of both end portions of the first carbon region in a first direction parallel to the surface;
   performing second ion implantation of forming a first impurity region by implanting a first impurity into the silicon carbide layer using the second mask material as a mask; and
   performing heat treatment at 1600° C. or higher,
   wherein the first impurity is nitrogen (N), or phosphorus (P), and
   a concentration of the carbon implanted by the first ion implantation is higher than a concentration of the first impurity implanted by the second ion implantation at any depth in the silicon carbide layer.

11. The method for manufacturing a semiconductor device according to claim 8, further comprising:
   forming a third mask material having a third opening by forming a second sidewall material on a sidewall of the second opening after the performing the second ion implantation, and
   forming a trench in the silicon carbide layer using the third mask material as a mask.

12. The method for manufacturing a semiconductor device according to claim 11, wherein the first impurity is nitrogen (N) or phosphorus (P).

13. The method for manufacturing a semiconductor device according to claim 8, further comprising:

removing the second mask material after the performing the second ion implantation;

forming a first silicon carbide film on the silicon carbide layer by an epitaxial growth method;

forming a third mask material having a third opening on the first silicon carbide film;

performing third ion implantation of forming a second carbon region by implanting carbon (C) into the first silicon carbide film using the third mask material as a mask;

forming a fourth mask material having a fourth opening by forming a second sidewall material on a sidewall of the third opening after the performing the third ion implantation;

performing fourth ion implantation of forming a second impurity region in contact with the first impurity region by implanting aluminum (Al) into the first silicon carbide film using the fourth mask material as a mask; and forming a second silicon carbide film on the silicon carbide layer using an epitaxial growth method.

\* \* \* \* \*